(12) United States Patent
Cho et al.

(10) Patent No.: US 7,301,170 B2
(45) Date of Patent: Nov. 27, 2007

(54) THIN FILM TRANSISTOR ARRAY PANEL AND METHOD FOR MANUFACTURING THE SAME

(75) Inventors: Beom-Seok Cho, Seoul (KR); Yang-Ho Bae, Suwon-si (KR); Je-Hun Lee, Seoul (KR); Chang-Oh Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 91 days.

(21) Appl. No.: 11/180,989

(22) Filed: Jul. 12, 2005

(65) Prior Publication Data

US 2006/0050192 A1    Mar. 9, 2006

(30) Foreign Application Priority Data

Sep. 8, 2004    (KR)    ............... 10-2004-0071612

(51) Int. Cl.
   *H01L 29/04*    (2006.01)
(52) U.S. Cl. .................. 257/59; 257/83; 257/257; 257/368
(58) Field of Classification Search .............. None
   See application file for complete search history.

(56) References Cited

U.S. PATENT DOCUMENTS

| | | |
|---|---|---|
| 5,543,946 A | 8/1996 | Enomoto et al. |
| 5,831,694 A | 11/1998 | Onisawa et al. |
| 7,105,896 B2 * | 9/2006 | Tanaka et al. ............ 257/347 |
| 7,176,489 B2 * | 2/2007 | Ahn et al. .................. 257/59 |

FOREIGN PATENT DOCUMENTS

| | | |
|---|---|---|
| JP | 9-026598 | 1/1997 |
| JP | 2002-190212 | 7/2002 |
| JP | 2004-140319 | 4/2003 |
| JP | 163901 | 6/2004 |
| KR | 10-1997-0002414 | 1/1997 |
| KR | 10-2001-0068334 | 7/2001 |
| KR | 10-0318369 | 12/2001 |
| KR | 10-2002-0039736 | 5/2002 |
| KR | 10-2004-0001689 | 6/2002 |
| KR | 10-2004-0040929 | 5/2004 |
| KR | 10-2004-0059088 | 7/2004 |

* cited by examiner

*Primary Examiner*—Wai-Sing Louie
(74) *Attorney, Agent, or Firm*—Don C. Lawrence; MacPherson Kwok Chen & Heid LLP

(57) ABSTRACT

The present invention provides a TFT array panel and a manufacturing method of the same, which has signal lines including a lower layer of an Al containing metal and an upper layer of a molybdenum alloy (Mo-alloy) comprising molybdenum (Mo) and at least one of niobium (Nb), vanadium (V), and titanium (Ti). Accordingly, undercut, overhang, and mouse bites which may arise in an etching process, are prevented, and TFT array panels that have signal lines having low resistivity and good contact characteristics are provided.

12 Claims, 59 Drawing Sheets

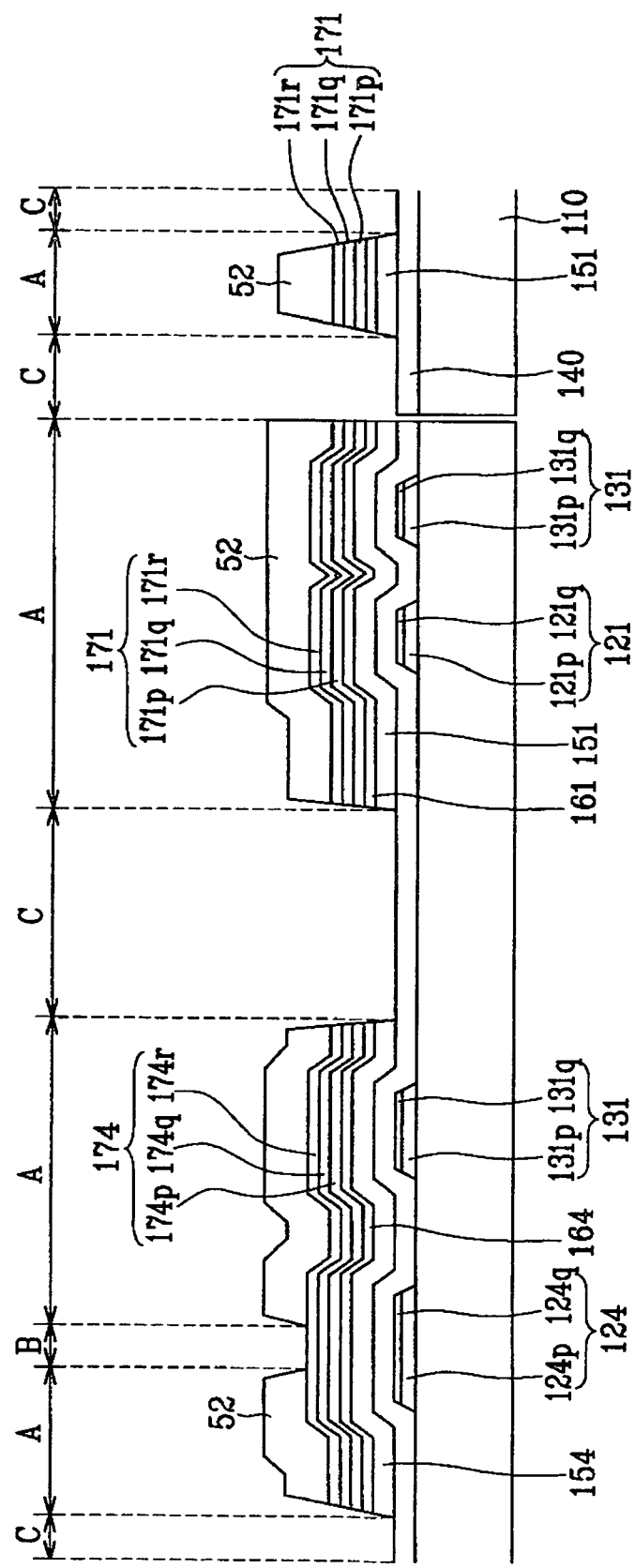

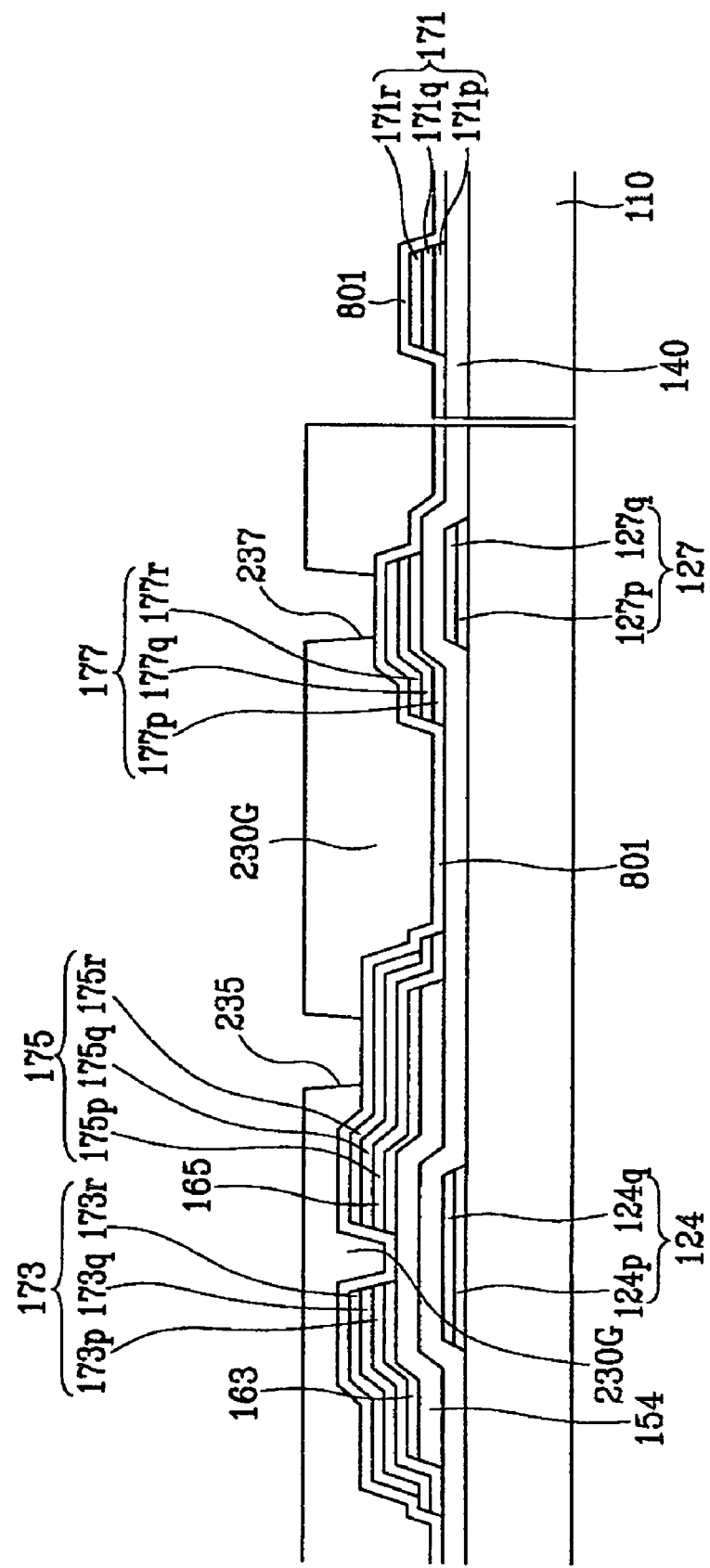

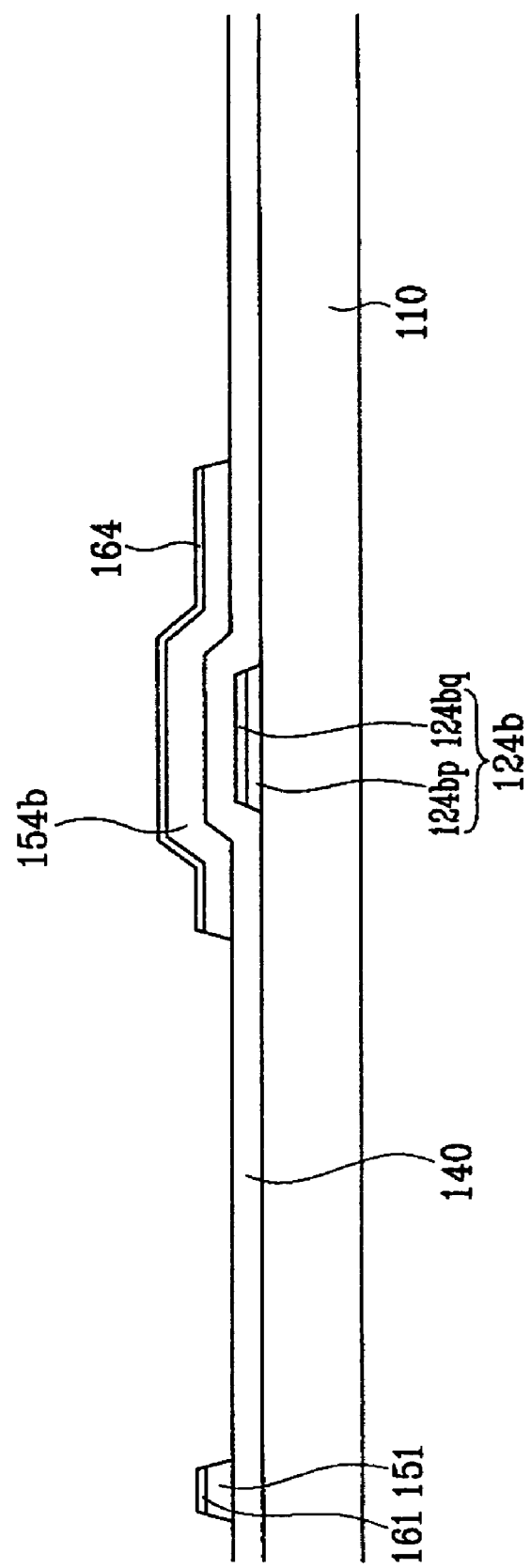

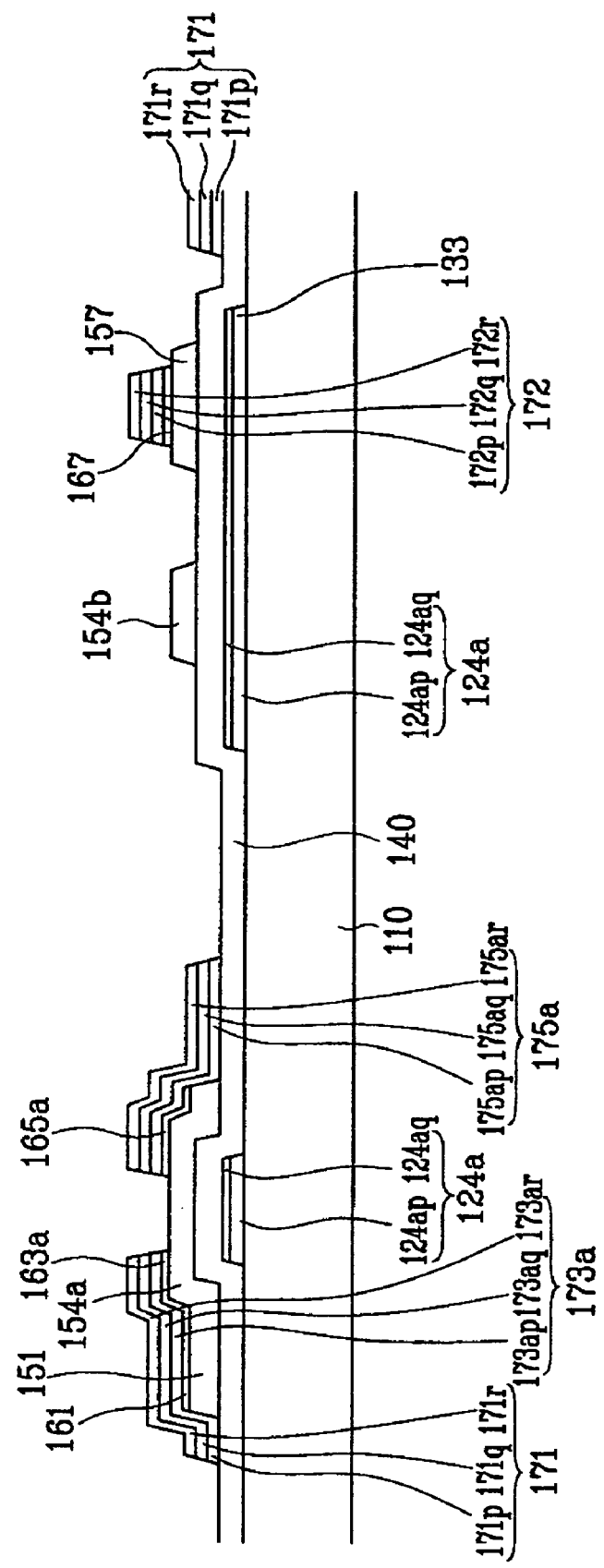

FIG.39

| Mo | MoNb | Al | AlNd |
|---|---|---|---|
| ~170 Å/s | ~44 Å/s | ~77 Å/s | ~60 Å/s |

(a)　　　　　　　　　　　　　(b)

(a)　　　　　　　　　　　　　(b)

US 7,301,170 B2

THIN FILM TRANSISTOR ARRAY PANEL AND METHOD FOR MANUFACTURING THE SAME

CROSS-REFERENCE TO RELATED APPLICATION

This application claims priority to a corresponding patent application 10-2004-0071612 filed in the Korean Intellectual Property Office, Republic of Korea, on Sep. 8, 2004, the entire content of which is hereby incorporated by reference.

BACKGROUND OF THE INVENTION (a) Field of the Invention

The present description relates to a thin film transistor (TFT) array panel for a liquid crystal display (LCD) or an organic light emitting display (OLED) and a manufacturing method for the same.

(b) Description of the Related Art

Liquid crystal displays (LCDs) are one of the most widely used flat panel displays. An LCD includes a liquid crystal (LC) layer interposed between two panels provided with field-generating electrodes. The LCD displays images by applying voltages to the field-generating electrodes to generate an electric field in the LC layer that determines orientations of LC molecules in the LC layer to adjust the polarization of incident light.

An LCD including two panels provided with field-generating electrodes respectively, wherein one panel has a plurality of pixel electrodes in a matrix and the other has a common electrode covering the entire surface of the panel, dominates the LCD market.

The LCD displays images by applying a different voltage to each pixel electrode. For this purpose, thin film transistors (TFTs), having three terminals to switch voltages applied to the pixel electrodes, are connected to the pixel electrodes, and gate lines to transmit signals for controlling the thin film transistors and data lines to transmit voltages applied to the pixel electrodes are formed on a thin film transistor array panel.

A TFT is a switching element for transmitting the image signals from the data wire to the pixel electrode in response to the scanning signals from the gate wire.

The TFT is applied to an active matrix organic light emitting display as a switching element for controlling respective light emitting elements.

Meanwhile, chromium (Cr) is conventionally the predominant material used for the gate line and the data line of a TFT array panel. However, Cr includes the drawbacks of high stress and resistivity.

Considering the trend of increasing LCD size, a material having low resistivity is urgently required since the lengths of the gate and data lines increase along with the LCD size. Accordingly, Cr is not appropriate for use in a large size LCD.

Aluminum (Al) is a well known material as a substitution for Cr due to its low resistivity. However, Al also has drawbacks including hillock growth that may be induced by high temperature, Al may be diffused into a semiconductor when Al contacts the semiconductor, and, since Al has poor contact characteristics with pixel electrode materials, such as indium tin oxide (ITO), a poor contact between a drain electrode of Al and a pixel electrode of ITO may occur.

SUMMARY OF THE INVENTION

It is an object of the present invention to solve the above-mentioned problems and to provide a thin film transistor array panel with signal lines having low resistivity and good contact characteristics without such problems.

To achieve the object, the present invention provides a thin film transistor array panel having gate lines and data lines formed of molybdenum alloy (Mo-alloy), which is composed of Mo and at least one of niobium (Nb), vanadium (V), and titanium (Ti), and has low resistivity and good chemical resistance.

BRIEF DESCRIPTION OF THE DRAWINGS

FIGS. 9A to 13B are sectional views of the TFT array panel shown in FIGS. 7 and 8 in intermediate steps of a manufacturing method according to an embodiment of the present invention;

FIGS. 15A to 16B are sectional views of the TFT array panel shown in FIGS. 14A and 14B in intermediate steps of a manufacturing method according to an embodiment of the present invention;

FIGS. 25A, 25B, and 25C are sectional views of the TFT array panel shown in FIG. 24 taken along the lines XXVa-XXVa', XXVb-XXVb', and XXVc-XXVc';

FIGS. 27A, 27B, 27C, and 27D are sectional views of the TFT array panel shown in FIG. 26 taken along the lines XXVIIa-XXVIIa', XXVIIb-XXVIIb', XXVIIc-XXVIIc', and XXVIId-XXVIId';

FIG. 39 is a table illustrating etching speed of Mo, Mo—Nb, Al, and Al—Nd;

BRIEF DESCRIPTIONS OF THE REFERENCE NUMERALS

Figure 1:
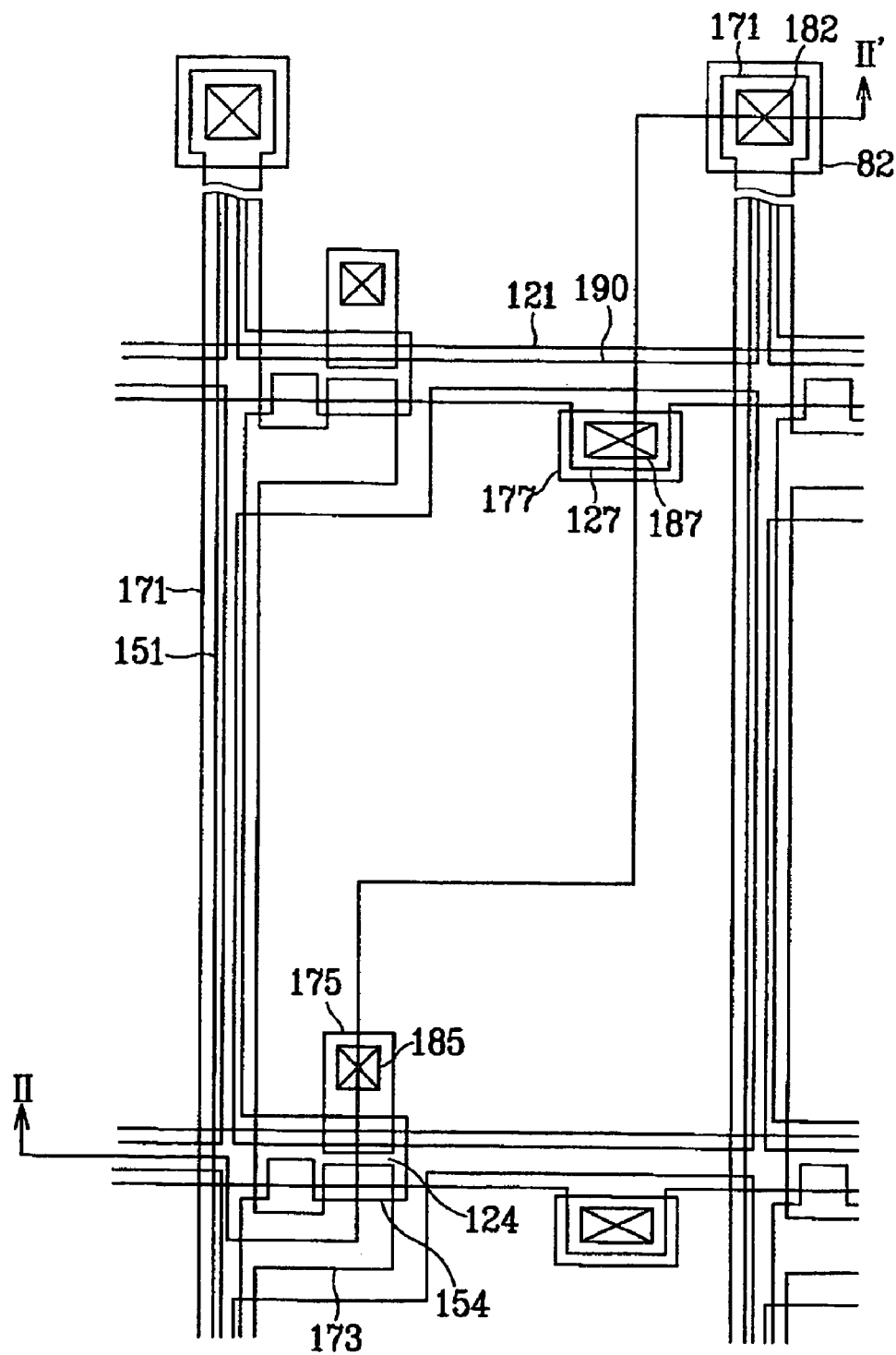
FIG. 1 is a layout view of a TFT array panel for an LCD according to an embodiment of the present invention.

| 110: | an insulating layer | 121: | a gate line |
| 124: | a gate electrode | 131: | a storage electrode line |
| 140: | a gate insulating layer | 150: | an intrinsic amorphous silicon layer |
| 160: | an extrinsic amorphous silicon layer | 171: | a data line |
| 173: | a source electrode | 175: | a drain electrode |
| 177: | a storage conductor | 180: | a passivation layer |
| 182, 185, 187, 189: | contact holes | | |
| 901: | a pixel electrode | 906, 908: | contact assistants |

DETAILED DESCRIPTION OF THE PREFERRED EMBODIMENTS

Preferred embodiments of the present invention will now be described more fully hereinafter with reference to the accompanying drawings, in which preferred embodiments of the invention are shown. The present invention may, however, be practiced in different forms and should not be construed as being limited to the embodiments set forth herein. Rather, these embodiments are provided so that this disclosure will be thorough and complete, and will fully convey the scope of the invention to those skilled in the art.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

Now, TFT array panels and manufacturing methods thereof according to embodiments of this invention will be described in detail with reference to the accompanying drawings so that a person of ordinary skill in the relevant art may easily carry them out.

Embodiment 1

At first, a TFT array panel for an LCD according to a first embodiment of the present invention will be described in detail with reference to FIGS. 1 and 2.

Figure 2:
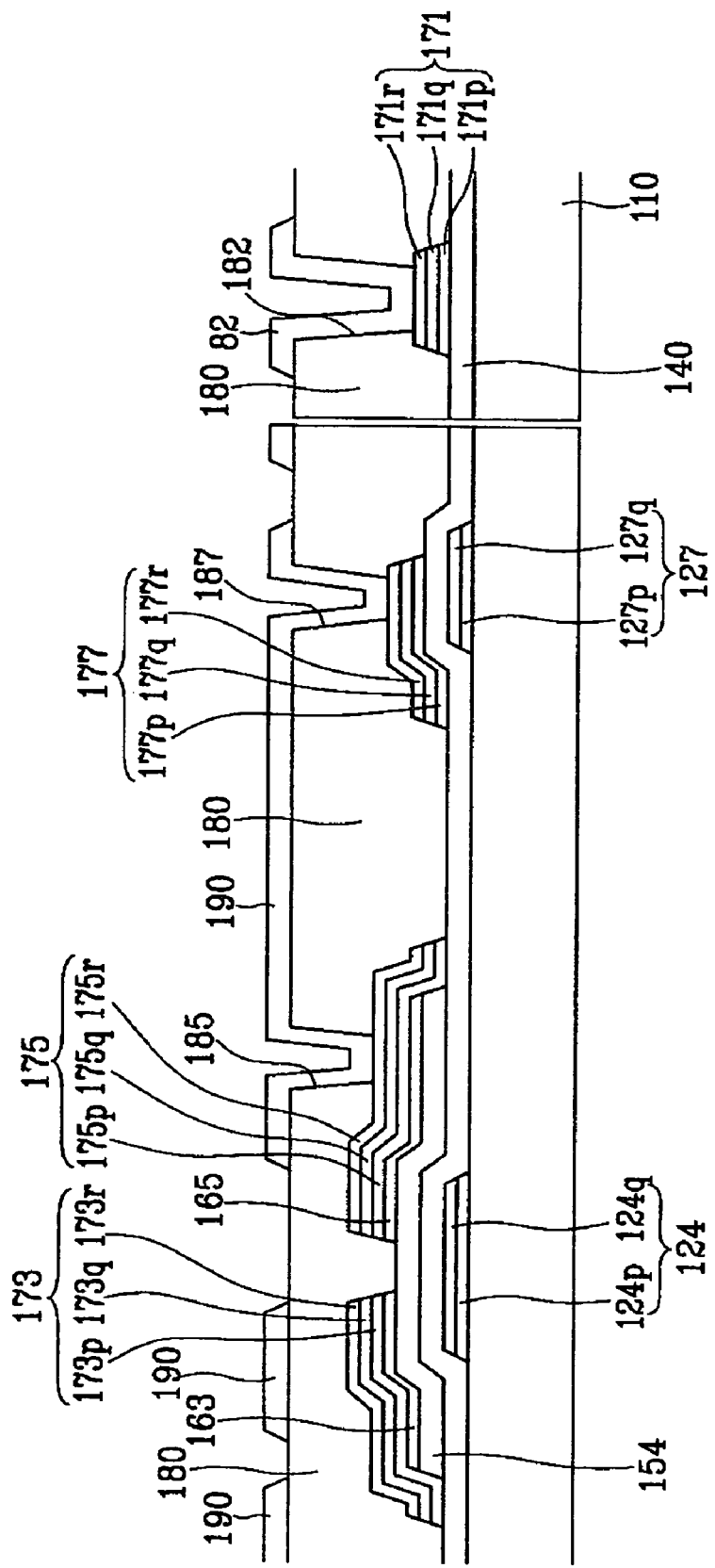
FIG. 2 is a sectional view of the TFT array panel shown in FIG. 1 taken along the line II-II.

FIG. 1 is a layout view of a TFT array panel for an LCD according to an embodiment of the present invention and FIG. 2 is a sectional view of the TFT array panel shown in FIG. 1 taken along the line II-II.

A plurality of gate lines 121 for transmitting gate signals are formed on an insulating substrate 110. The gate lines 121 are mainly formed in the horizontal direction and partial portions thereof become a plurality of gate electrodes 124. Also, different partial portions thereof that extend in a lower direction become a plurality of expansions 127.

The gate line 121 has lower layers 124p and 127p and upper layers 124q and 127q. The lower layers 124p and 127p are made of Al or an aluminum alloy such as aluminum-neodymium (Al—Nd). The upper layers 124q and 127q are made of a molybdenum alloy (Mo-alloy), which is composed of molybdenum (Mo) and at least one of niobium (Nb), vanadium (V), and titanium (Ti).

The upper layers 124q and 127q of Mo-alloy are formed on the lower layers 124p and 127p of Al or Al-alloy to prevent hillock growth that may arise in the lower layers 124p and 127p during a high temperature process. The upper layers 124q and 127q of Mo-alloy may include 0.1 to 10 at % (atomic percentage) of the additives Nb, V, and Ti. It is more preferable that the upper layers 124q and 127q include 3 to 8 at % of the additives. When the content of the additives is increased, adhesiveness to other layers and the chemical resistance of the upper layers 124q and 127q are improved, but resistivity of the upper layers 124q and 127q increases. Accordingly, the content of the additives has a preferable range.

Figure 38:
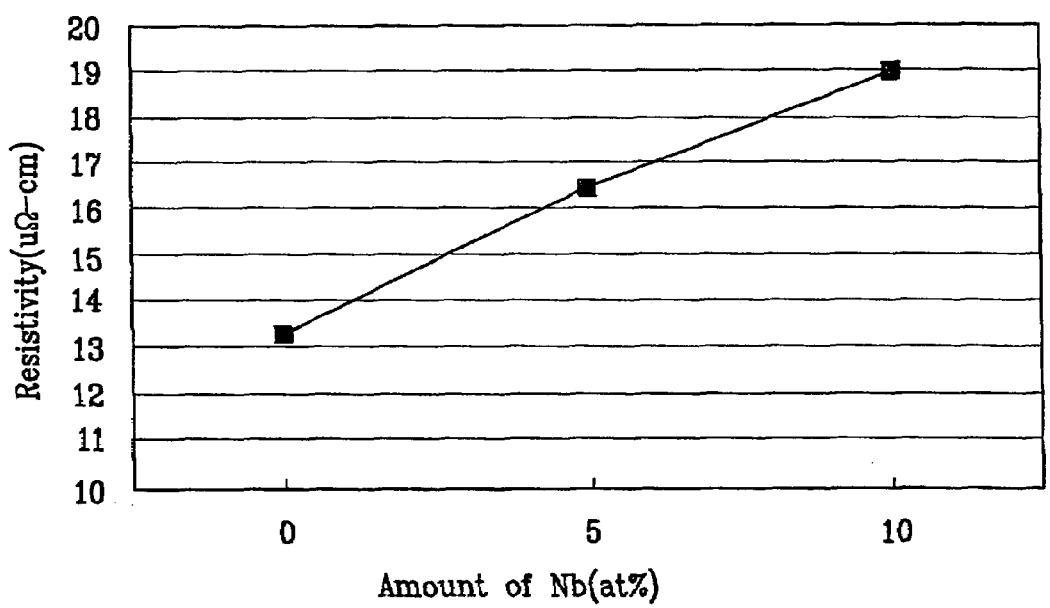
FIG. 38 is a graph illustrating variation of resistivity according to the included amount of Nb.

FIG. 38 is a graph illustrating the variation of resistivity according to the included amount of Nb. According to FIG. 38, the resistivity of the Mo-alloy slowly increases along with an increase of the amount of Nb. Accordingly, when the resistivity, adhesiveness, and chemical resistance are considered, the preferable content range of the additives is determined as the above-described range.

A Mo-alloy, containing a predetermined amount of Nb, V, or Ti that makes an isomorphous solid solution with Mo, has better chemical resistance (slow etch speed) and less difference of chemical resistance with the lower layer of Al or Al-alloy than Mo itself. As the difference of chemical resistance between the upper layers 124q and 127q and the lower layers 124p and 124p is reduced, undercut, overhang, and mouse bites, which may arise in an etching process, are prevented.

Figure 39:
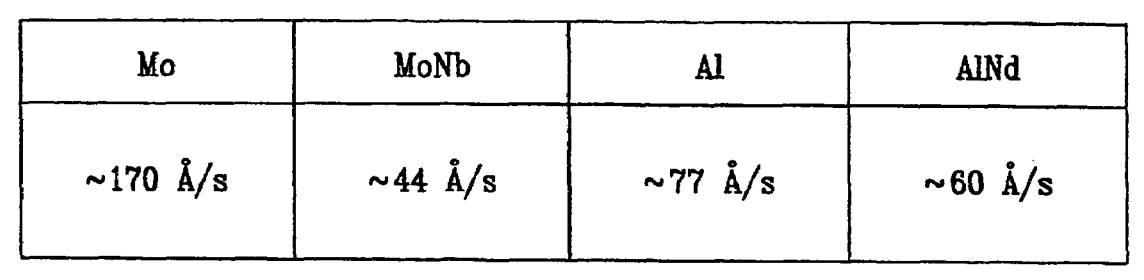

FIG. 39 is a table illustrating etch speed of Mo, Mo—Nb, Al, and Al—Nd by a same etchant. According to FIG. 39, in a same etch condition, a pure Mo layer is etched by about 170 Å/s and a Mo—Nb layer is etched by about 44 Å/s. In other words the etch speed of the Mo—Nb layer is about ¼ of that of the Mo layer.

As a result, the difference of etch speed between the Mo—Nb layer and an Al—Nd layer or Al layer, which are respectively etched by about 77 Å/s and 60 Å/s, is much less than that between the Mo layer and the Al—Nd layer or Al layer. Accordingly, problems such as undercut, overhang, and mouse bite, which arise due to the difference of etching speed, are prominently reduced.

Figure 40:
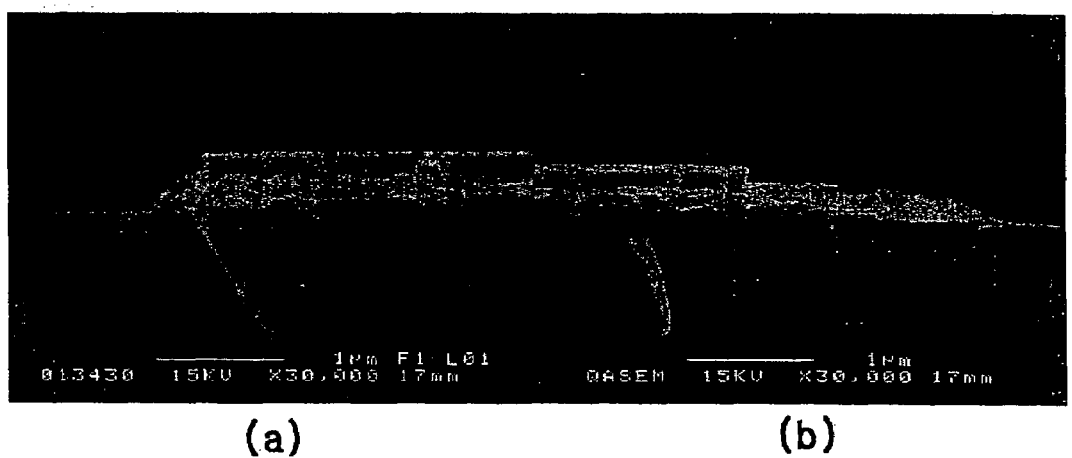
FIGS. 40(a) and 40(b) are scanning electron microscope (SEM) pictures showing etched profiles of thin films of Mo/Al/Mo.
Figure 41:
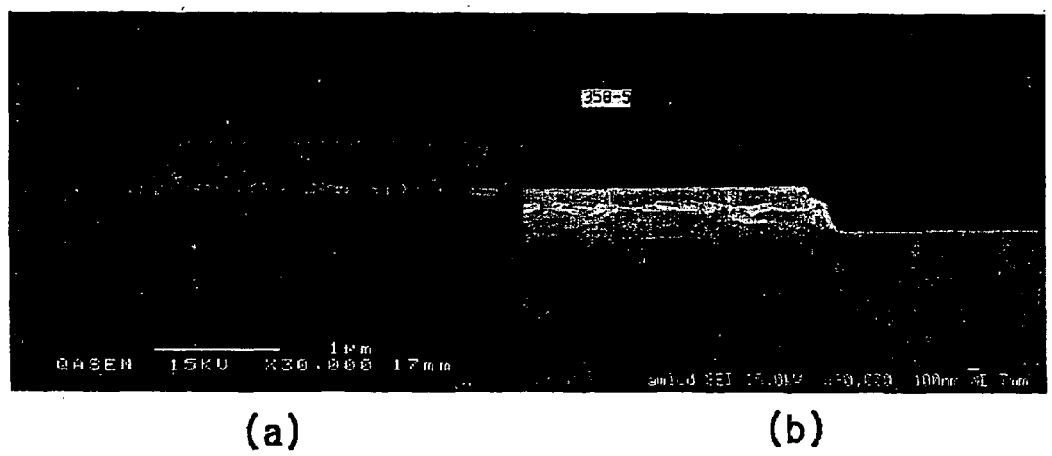
FIGS. 41(a) and 41(b) are pictures showing etched profiles of thin films of Mo—Nb/Al/Mo.

These results can be verified by FIGS. 40 and 41.

FIGS. 40(a) and 40(b) are scanning electron microscope (SEM) pictures showing etched profiles of thin films of Mo/Al/Mo. FIG. 40(a) is a SEM picture showing an etched profile of Mo/Al/Mo films etched by a common etchant containing 67% of phosphoric acid, 6% of nitric acid, 10% of acetic acid, and 17% of deionized water. FIG. 40(b) is a SEM picture showing an etched profile of Mo/Al/Mo films etched by a common etchant containing 67% of phosphoric acid, 13% of nitric acid, 15% of acetic acid, and 5% of deionized water.

FIGS. 41(a) and 41(b) are pictures showing etched profiles of thin films of Mo—Nb/Al/Mo. FIG. 41(a) is a SEM picture showing an etched profile of Mo—Nb/Al/Mo films etched by a common etchant containing 67% of phosphoric acid, 13% of nitric acid, 15% of acetic acid, and 5% of deionized water. FIG. 41(b) is a SEM picture showing an etched profile of Mo—Nb/Al/Mo films etched by a common etchant containing 67% of phosphoric acid, 6% of nitric acid, 10% of acetic acid, and 17% of deionized water.

When FIGS. 40(a) and 40(b) are compared to FIGS. 41(a) and 41(b), undercut, which is shown in FIGS. 40(a) and 40(b), is not shown in FIGS. 41(a) and 41(b). This result is caused by the decreased etch speed difference between the Mo—Nb layer and the Al—Nd layer, compared to that of the Mo layer and the Al—Nd layer.

Returning again to FIG. 1 and FIG. 2, the lateral sides of the upper layers 124q and 127q and lower layers 124p and 127q are inclined relative to a surface of the substrate 110, and the inclination angle thereof ranges from about 30-80 degrees.

A gate insulating layer 140 preferably made of silicon nitride (SiNx) is formed on the gate lines 121.

A plurality of semiconductor stripes 151 (or strips), preferably made of hydrogenated amorphous silicon (abbreviated to "a-Si"), are formed on the gate insulating layer 140. Each semiconductor stripe 151 extends substantially in the longitudinal direction and is curved periodically. Each semiconductor stripe 151 has a plurality of projections 154 branching out toward the gate electrodes 124. The width of each semiconductor stripe 151 becomes large near the gate lines 121 such that the semiconductor stripe 151 covers large areas of the gate lines 121.

A plurality of ohmic contact stripes 161 and islands 165, preferably made of silicide or n+ hydrogenated a-Si heavily doped with n type impurity, are formed on the semiconductor stripes 151. Each ohmic contact stripe 161 has a plurality of projections 163, and the projections 163 and the ohmic contact islands 165 are located in pairs on the projections 154 of the semiconductor stripes 151.

The edge surfaces of the semiconductor stripes 151 and the ohmic contacts 161 and 165 are tapered, and the inclination angles of the edge surfaces of the semiconductor stripes 151 and the ohmic contacts 161 and 165 are preferably in a range from about 30-80 degrees.

A plurality of data lines 171, a plurality of drain electrodes 175, and a plurality of storage capacitor conductors 177 are formed on the ohmic contacts 161 and 165 and the gate insulating layer 140.

The data lines 171, for transmitting data voltages, extend in a substantially longitudinal direction and intersect the gate lines 121 to define pixel areas arranged in a matrix. A plurality of branches of each data line 171, projecting toward the drain electrodes 175, form a plurality of source electrodes 173. Each pair of the source electrodes 173 and the drain electrodes 175 are separated from each other at the gate electrodes 124, and oppose each other.

The data line 171, the drain electrode 175, and the storage capacitor conductor 177 have first layers 171p, 175p, and 177p, second layers 171q, 175q, and 177q, and third layers 171r, 175r, and 177r. The first layers 171p, 175p, and 177p and the third layers 171r, 175r, and 177r are respectively disposed at lower and upper sides of the second layers 171q, 175q, and 177q. The first layers 171p, 175p, and 177p and the third layers 171r, 175r, and 177r are made of a molybdenum alloy (Mo-alloy), which is composed of molybdenum (Mo) and at least one of niobium (Nb), vanadium (V), and titanium (Ti). Here, the first layers 171p, 175p, and 177p and the third layers 171r, 175r, and 177r of Mo-alloy may include 0.1 to 10 at % of the additives Nb, V, and Ti. It is more preferable that the first layers 171p, 175p, and 177p and the third layers 171r, 175r, and 177r include 3 to 8 at % of the additives. When the content of the additives is increased, adhesiveness to other layers and the chemical resistance of the first layers 171p, 175p, and 177p and the third layers 171r, 175r, and 177r are improved but resistivity of the first layers 171p, 175p, and 177p and the third layers 171r, 175r, and 177r increases. Accordingly, the content of the additives has the above-described preferable range.

A Mo-alloy, containing a predetermined amount of Nb, V, or Ti which make an isomorphous solid solution with Mo, has better chemical resistance (slow etch speed) and less difference of chemical resistance with the lower layer of Al or Al-alloy than Mo itself. As the difference of chemical resistance between the first and the third layers 171p, 175p, and 177p and 171r, 175r, and 177r and the second layers 171q, 175q, and 177q is reduced, undercut, overhang, and mouse bite, which may arise in an etching process, are prevented.

FIG. 39 is a table illustrating etch speed of Mo, Mo—Nb, Al, and Al—Nd by a same etchant. According to FIG. 39, in a same etch condition, a pure Mo layer is etched by about 170 Å/s and a Mo—Nb layer is etched by about 44 Å/s. In other words the etch speed of the Mo—Nb layer is about ¼ of that of the Mo layer.

As a result, the difference of etch speed between the Mo—Nb layer and an Al—Nd layer or an Al layer, which are respectively etched by about 77 Å/s and 60 Å/s, is much less than that between the Mo layer and the Al—Nd layer or an Al layer. Accordingly, problems such as undercut, overhang, and mouse bite, which arise due to the difference of etch speed, are prominently reduced.

These results can be verified by FIGS. 40 and 41.

FIGS. 40(a) and 40(b) are SEM pictures showing etched profiles of thin films of Mo/Al/Mo. FIG. 40(a) is a SEM picture showing an etched profile of Mo/Al/Mo films etched by a common etchant containing 67% of phosphoric of acetic acid, and 5% of deionized water.

FIGS. 41(a) and 41(b) are pictures showing etched profiles of thin films of Mo—Nb/Al/Mo. FIG. 41(a) is a SEM picture showing an etched profile of Mo—Nb/Al/Mo films etched by a common etchant containing 67% of phosphoric acid, 13% of nitric acid, 15% of acetic acid, and 5% of deionized water. FIG. 41(b) is a SEM picture showing an etched profile of Mo—Nb/Al/Mo films etched by a common etchant containing 67% of phosphoric acid, 6% of nitric acid, 10% of acetic acid, and 17% of deionized water.

When FIGS. 40(a) and 40(b) are compared to FIGS. 41(a) and 41(b), undercut, which is shown in FIGS. 40(a) and 40(b), is not shown in FIGS. 41(a) and 41(b). This result is caused by the decreased etch speed difference between the Mo—Nb layer and the Al—Nd layer, compared to that of the Mo layer and the Al—Nd layer.

Since the Al or Al-alloy layer, having low resistivity, is disposed between the two Mo-alloy layers, the data line 171 has a low resistivity and the Al or Al-alloy layer is prevented from contacting with the semiconductor and pixel electrodes that may cause poor contact. Accordingly, degradation of TFTs caused by poor contacts is efficiently prevented. A gate electrode 124, a source electrode 173, and a drain electrode 175, along with a projection 154 of a semiconductor stripe 151, forms a TFT cell having a channel formed in the projection 154 disposed between the source electrode 173 and the drain electrode 175. The storage capacitor conductor 177 is overlapped with the expansion 127 of the gate line 121.

The data lines 171, the drain electrodes 175, and the storage capacitor conductor 177 have tapered edge surfaces, and the inclination angles of the edge surfaces are in a range from about 30-80 degrees.

The ohmic contacts 161 and 165 are only interposed between the semiconductor stripe 151 and the data line 171 and between the drain electrode 175 and the projection 154 of the semiconductor stripe 151 in order to reduce contact resistance therebetween. The semiconductor stripe 151 is partially exposed at the place between the source electrode 173 and the drain electrode 175 and at the other places not covered with the data line 171 and the drain electrode 175. Most of the semiconductor stripe 151 is narrower than the data line 171, but the width of the semiconductor stripe 151 broadens near a place where the semiconductor stripe 151 and the gate line 121 meet each other in order to prevent disconnection of the data line 171, as mentioned in the above.

On the data line 171, the drain electrode 175, the storage capacitor conductor 177, and the exposed region of the semiconductor stripe 151, a passivation layer 180 is provided, which is made of an organic material having substantial planarization properties and photosensibility or an insulating material with a low dielectric constant such as a-Si:C:O, a Si:O:F, etc. This passivation layer 180 is formed by a plasma enhanced chemical vapor deposition (PECVD) process. To prevent the organic material of the passivation layer 180 from making contact with the semiconductor strips 151 exposed between the data line 171 and the drain electrode 175, the passivation layer 180 can be structured in such a way that an insulating layer made of SiNx or SiO$_2$ is additionally formed under the organic material layer.

In the passivation layer 180, a plurality of contact holes 185, 187, and 182 are formed to expose the drain electrode 175, the storage capacitor conductor 177, and an end portion of the data line 171, respectively.

A plurality of pixel electrodes 190 and a plurality of contact assistants (or guides) 82, which are made of indium zinc oxide (IZO) or indium tin oxide (ITO), are formed on the passivation layer 180.

Since the pixel electrode 190 is physically and electrically connected with the drain electrode 175 and the storage capacitor conductor 177 through the contact holes 185 and 187, respectively, the pixel electrode 190 receives the data voltage from the drain electrodes 175 and transmits it to the storage capacitor conductor 177.

The pixel electrode 190 to which the data voltage is applied, generates an electric field with a common electrode (not shown) of the opposite panel (not shown) to which a common voltage is applied, so that the liquid crystal molecules in the liquid crystal layer are rearranged.

Also, as mentioned in the above, the pixel electrode 190 and the common electrode form a capacitor to store and preserve the received voltage after the TFT is turned off. This capacitor will be referred to as a "liquid crystal capacitor." To enhance the voltage storage ability, another capacitor is provided, which is connected with the liquid crystal capacitor in parallel and will be referred to as a "storage capacitor." The storage capacitor is formed at an overlapping portion of the pixel electrode 190 and the adjacent gate line 121, which will be referred to as a "previous gate line." The expansion 127 of the gate line 121 is provided to ensure the largest possible overlap dimension and thus to increase storage capacity of the storage capacitor. The storage capacitor conductor 177 is connected to the pixel electrode 190 and is overlapped with the expansion 127, and is provided at the bottom of the passivation layer 180 so that the pixel electrode 190 is close to the previous gate line 121.

The pixel electrode 190 is overlapped with the adjacent gate line 121 and the adjacent data line 171 to enhance the aperture ratio, but it is not required.

The contact assistant 82 supplements adhesion between the end portion of the data line 171 and the exterior devices, such as the driving integrated circuit, and protects them. Applying the contact assistant 82 is optional since it is not an essential element.

A method of manufacturing a TFT array panel will be now described in detail with reference to FIGS. 3A to 6B as well as FIGS. 1 and 2.

Figure 3A:
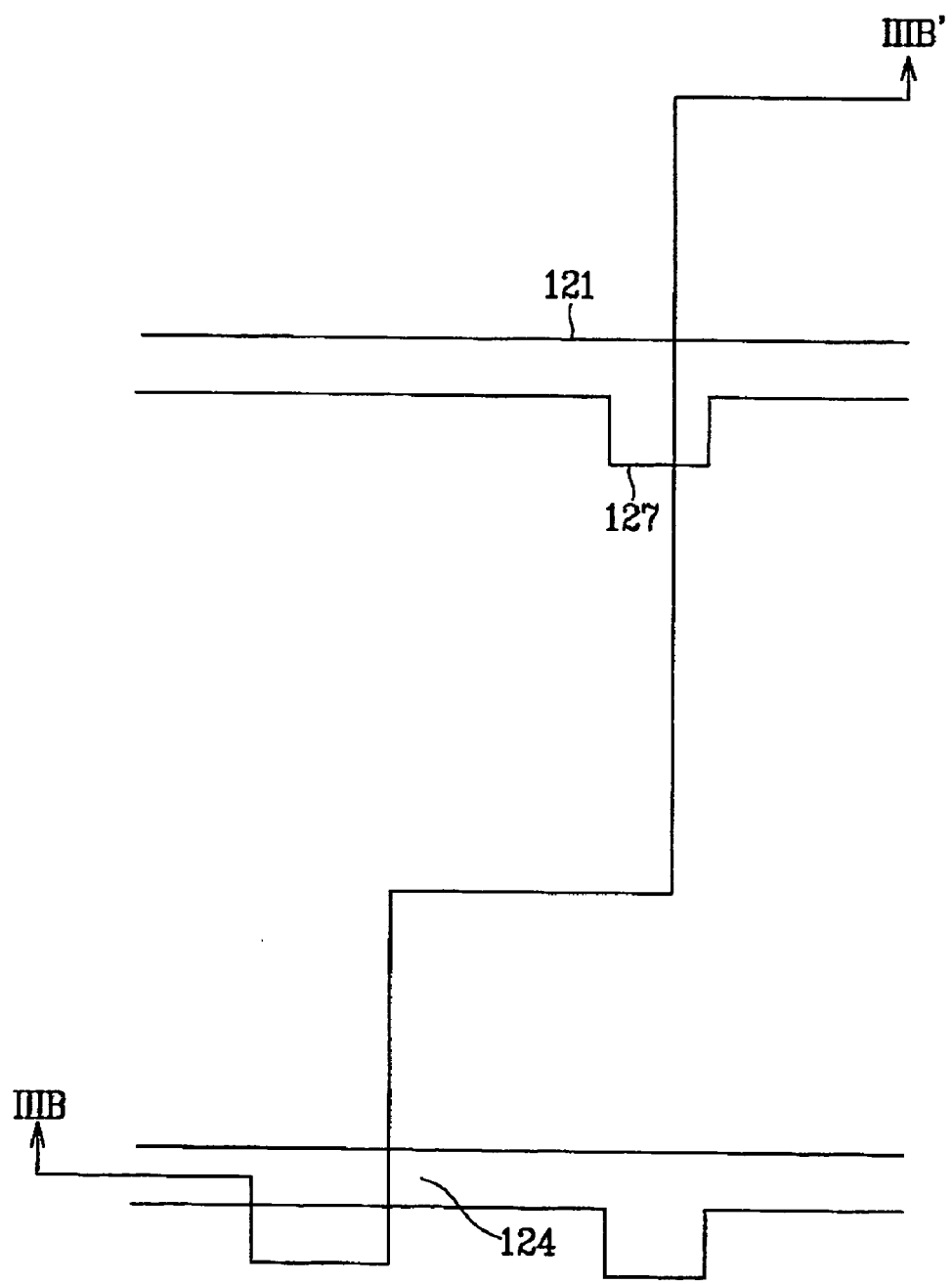
FIGS. 3A, 4A, 5A, and 6A are layout views sequentially illustrating the intermediate steps of a method of manufacturing a TFT array panel for an LCD according to the embodiment of FIGS. 1 and 2.
Figure 3B:
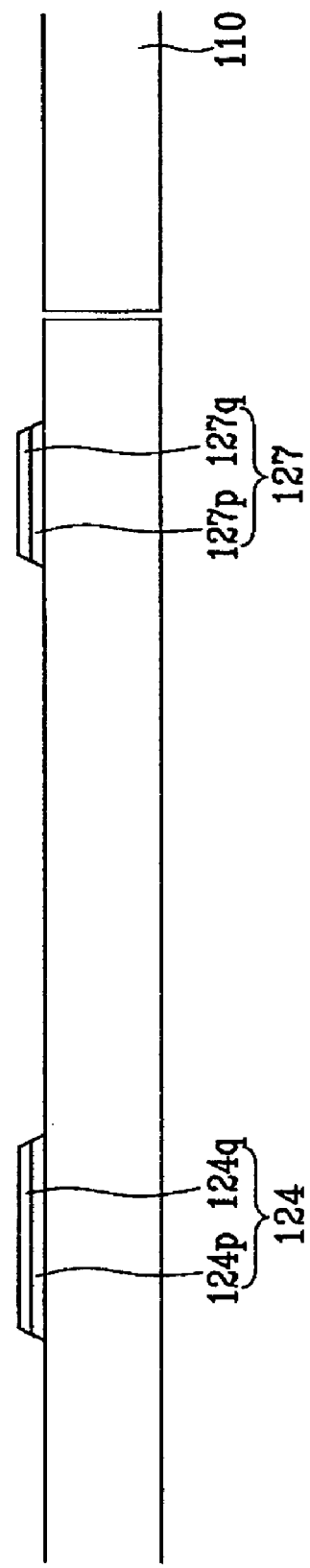
FIG. 3B is a sectional view of the TFT array panel shown in FIG. 3A taken along the line IIIb-IIIb'.

FIGS. 3A, 4A, 5A, and 6A are layout views sequentially illustrating the intermediate steps of a method of manufacturing a TFT array panel for an LCD according to the embodiment of FIGS. 1 and 2; FIG. 3B is a sectional view of the TFT array panel shown in FIG. 3A taken along the line IIIb-IIIb'. FIG. 4B is a sectional view of the TFT array panel shown in FIG. 4A taken along the line IVb-IVb' in the step following the step shown in FIG. 3B. FIG. 5B is a sectional view of the TFT array panel shown in FIG. 5A taken along the line Vb-Vb' in the step following the step shown in FIG. 4B. FIG. 6B is a sectional view of the TFT array panel shown in FIG. 6A taken along the line VIb-VIb' in the step following the step shown in FIG. 5B.

At first, as shown in FIG. 3B, a metal layer is formed on an insulating substrate 110.

The metal layer is deposited by a Co-sputtering. Two targets are installed in a same sputtering chamber for the Co-sputtering. One target is made of Al or Al—Nd. The other target is made of a molybdenum alloy (Mo-alloy), which is composed of molybdenum (Mo) and at least one of niobium (Nb), vanadium (V), and titanium (Ti). Here, the Al—Nd target preferably contains 2 at % of Nd. The Mo-alloy target may include 0.1 to 10 at % of the additives Nb, V, and Ti, and more preferably includes 3 to 8 at % of the additives. When the content of the additives is increased, adhesiveness to other layers and chemical resistance is improved but resistivity increases. Accordingly, the content of the additives has the above preferable range.

The Co-sputtering process is performed as follows.

At first, power is applied to the Al (or Al—Nd) target while no power is applied to the Mo-alloy target to deposit a lower layer of Al (or Al—Nd). The thickness of the lower layer is preferably 2,500 Å.

Next, power is switched to be applied to the Mo-alloy target and not to be applied to the Al (or Al—Nd) target to deposit an upper layer.

The upper and lower layers are simultaneously etched to form a plurality of gate lines 121 having a plurality of gate electrodes 124 and expansions 127. Here, the upper and lower layers are preferably etched by an etchant containing phosphoric acid, nitric acid, acetic acid, and deionized water. More precisely, the etchant may include 63% to 70% of phosphoric acid, 4% to 8% of nitric acid, 8% to 11% of acetic acid, and deionized water for the residual quantity. The etchant may include more acetic acid by about 4% to 8%.

Figure 4A:
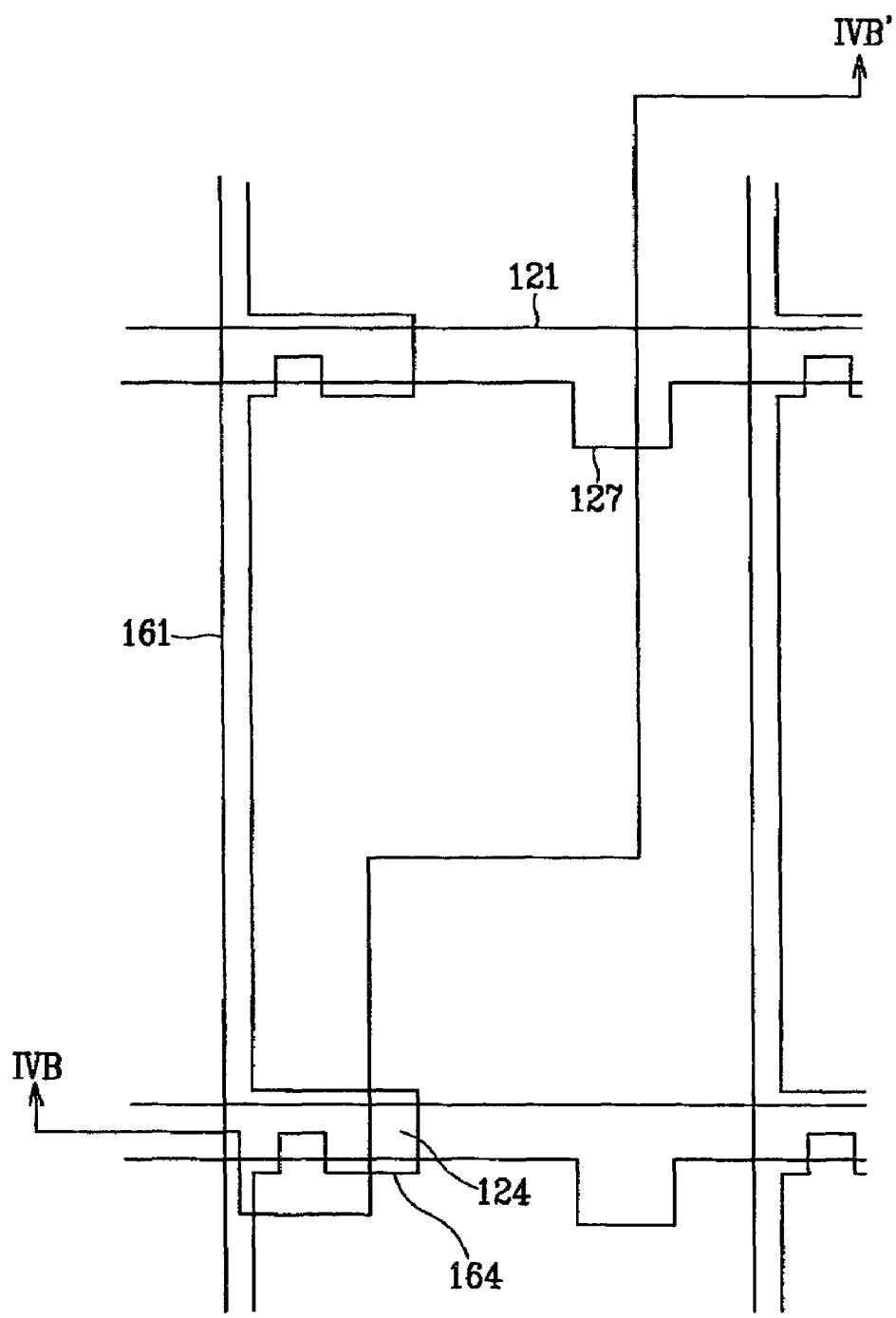
Figure 4B:
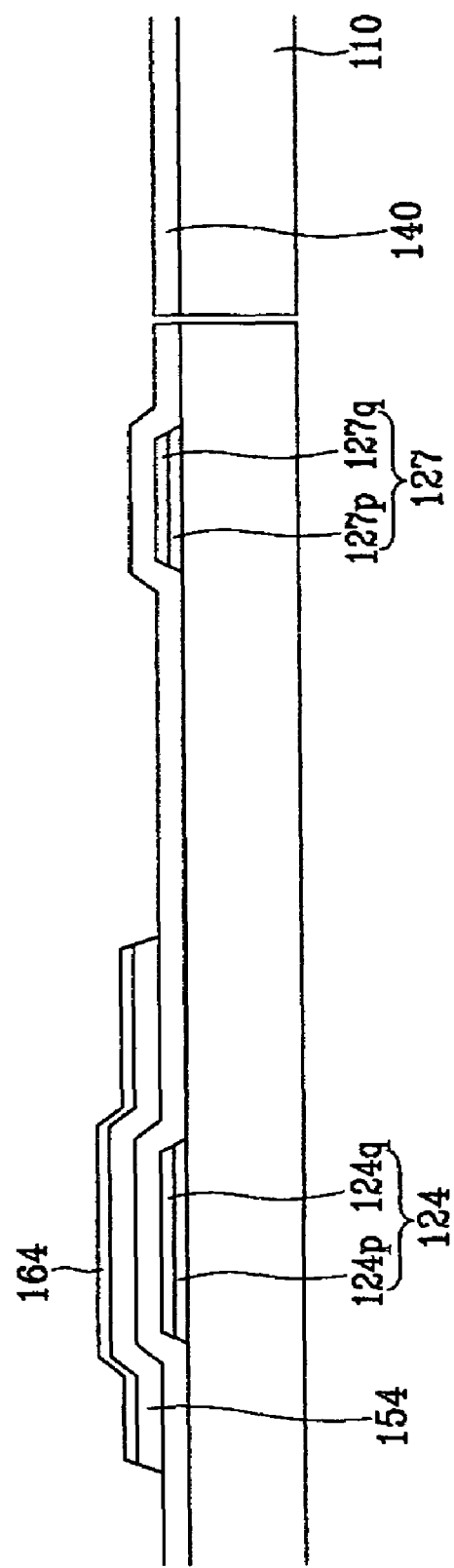
FIG. 4B is a sectional view of the TFT array panel shown in FIG. 4A taken along the line IVb-IVb' in the step following the step shown in FIG. 3B.

Referring to FIGS. 4A and 4B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 161 and a plurality of intrinsic semiconductor stripes 151 respectively having projections 164 and 154. The gate insulating layer 140 is preferably made of silicon nitride with a thickness of about 2,000 Å to about 5,000 Å, and the deposition temperature is preferably in a range between about 250° C. and about 500° C.

Next, a first layer of Mo-alloy, a second layer of Al (or Al-alloy), and a third layer of Mo-alloy are sequentially deposited on the extrinsic semiconductor stripes 161 by a Co-sputtering. The first and third layers are made of a molybdenum alloy (Mo-alloy), which is composed of molybdenum (Mo) and at least one of niobium (Nb), vanadium (V), and titanium (Ti). Here, one of the first layer and third layer may be formed with another material. The thickness of the three layers is preferably about 3,000 Å. The sputtering temperature is preferably about 150° C.

Figure 5A:
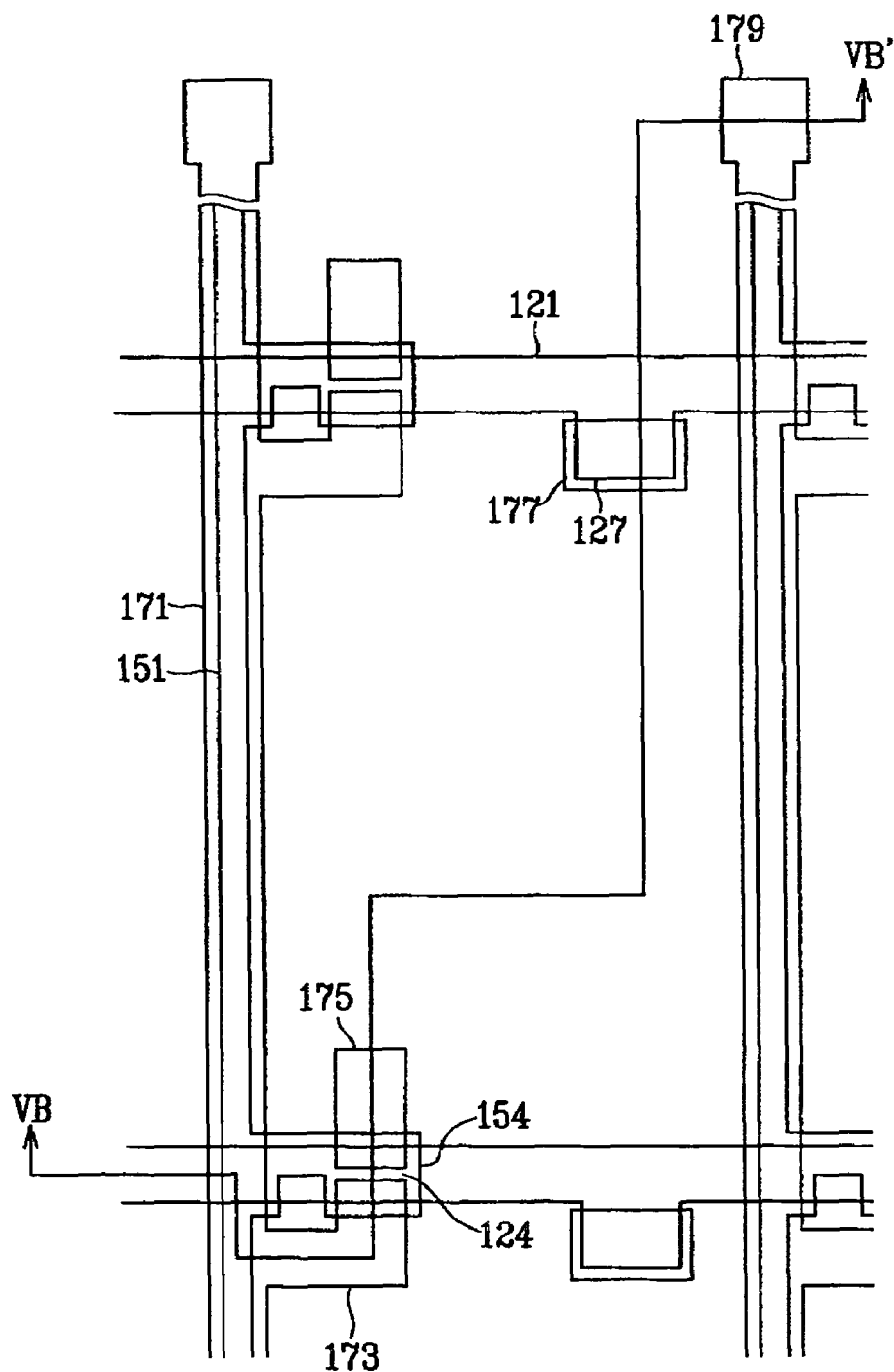
Figure 5B:
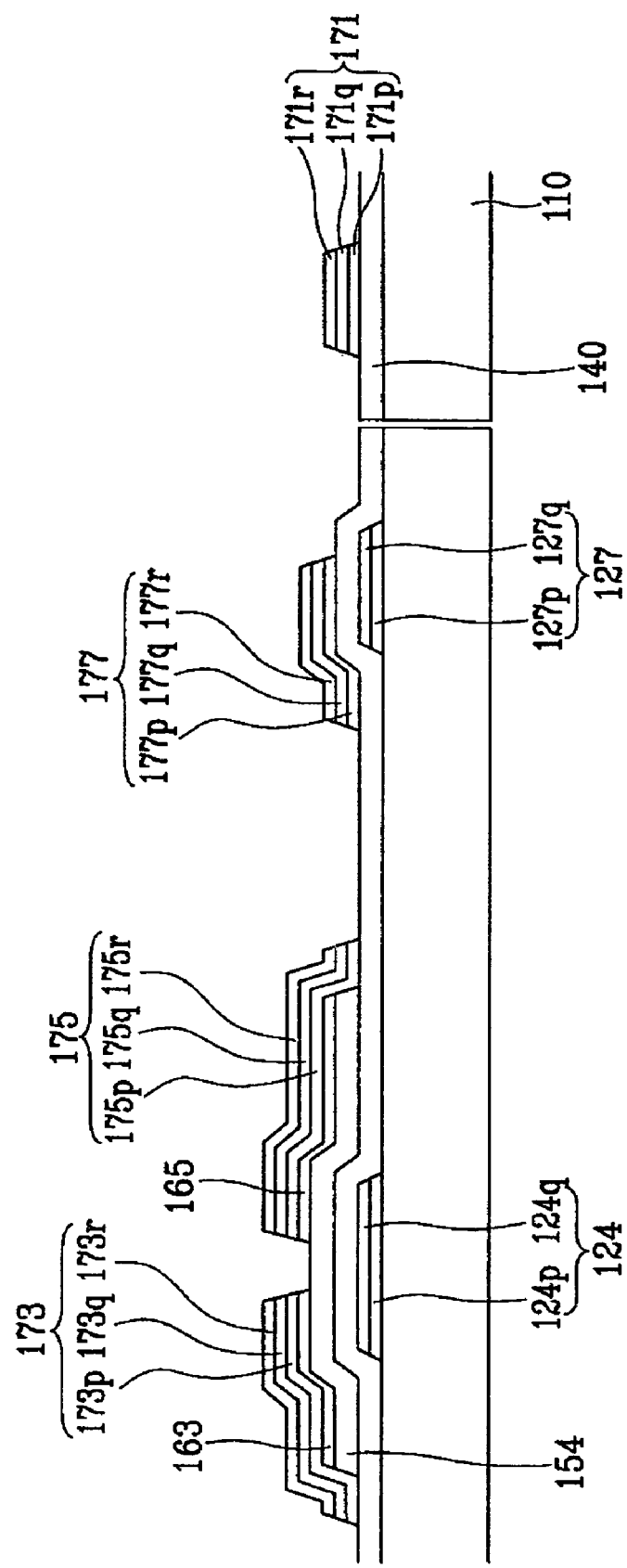
FIG. 5B is a sectional view of the TFT array panel shown in FIG. 5A taken along the line Vb-Vb' in the step following the step shown in FIG. 4B.

Next, as shown in FIGS. 5A and 5B, the three layers are simultaneously etched to form data lines 171, drain electrodes 175, and storage conductors 177 by an etchant. Here, the three layers are preferably etched by an etchant containing phosphoric acid, nitric acid, acetic acid, and deionized water. Precisely, the etchant may include 63% to 70% of phosphoric acid, 4% to 8% of nitric acid, 8% to 11% of acetic acid, and deionized water for the residual quantity. The etchant may include more acetic acid by about 4% to 8%.

Next, portions of the extrinsic semiconductor stripes 161, which are not covered with the data lines 171 and the drain electrodes 175, are removed by etching to complete a plurality of ohmic contacts 163 and 165 and to expose portions of the intrinsic semiconductor stripes 151. Oxygen plasma treatment may follow thereafter in order to stabilize the exposed surfaces of the semiconductor stripes 151.

Figure 6A:
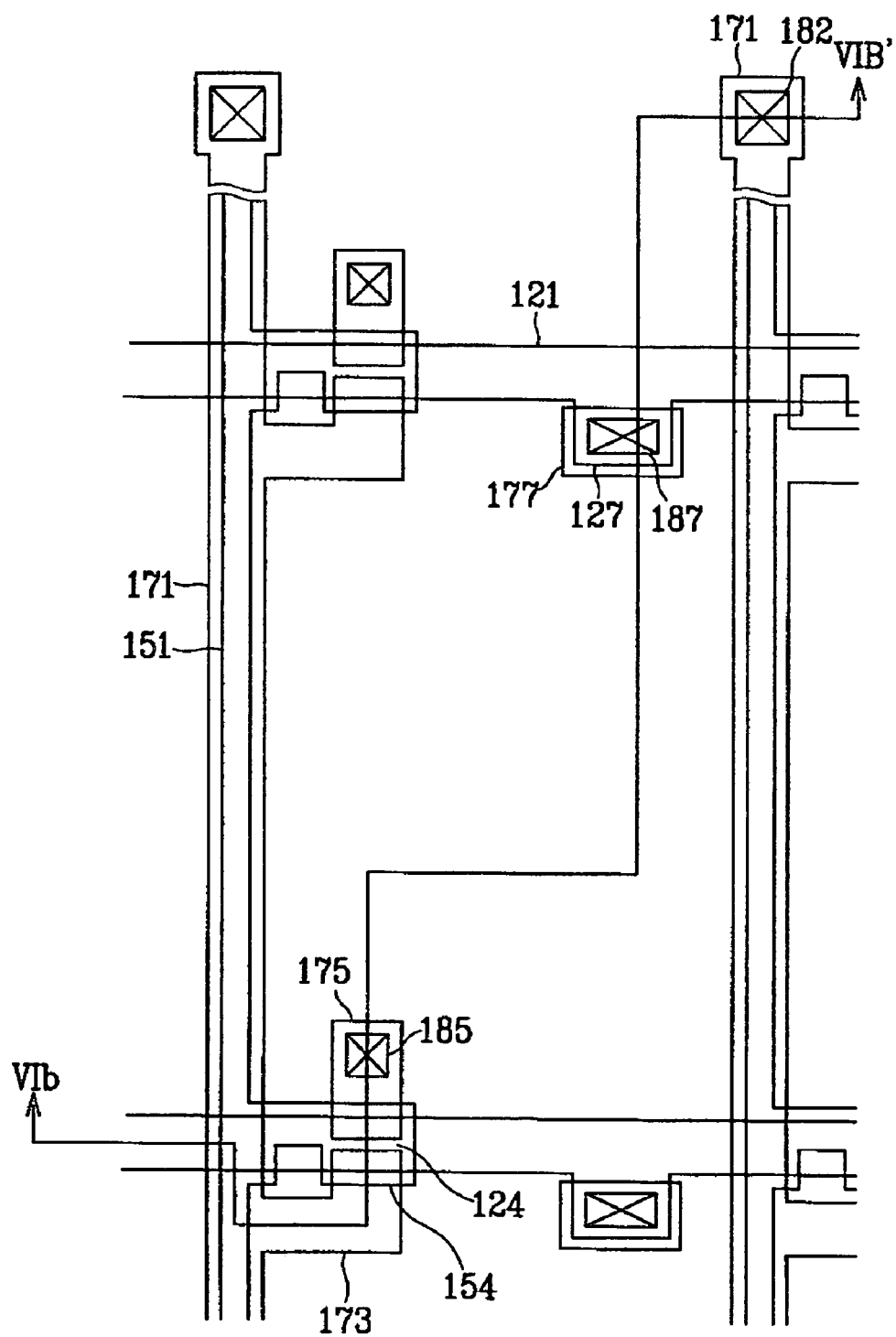
Figure 6B:
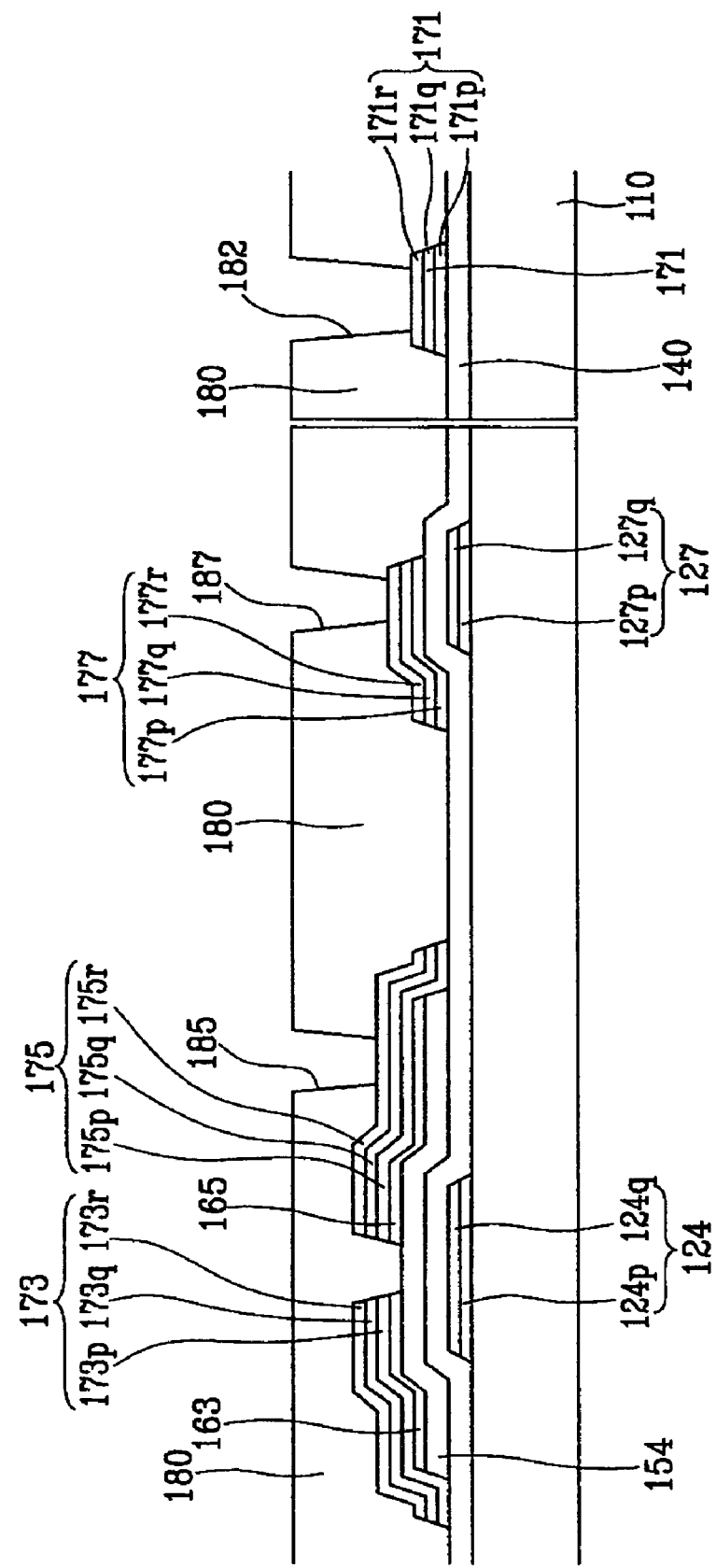
FIG. 6B is a sectional view of the TFT array panel shown in FIG. 6A taken along the line VIb-VIb' in the step following the step shown in FIG. 5B.

Referring to FIGS. 6A and 6B, a passivation layer 180 is deposited and dry etched along with the gate insulating layer 140 to form a plurality of contact holes 185, 187, and 182. The gate insulating layer 140 and the passivation layer 180 are preferably etched under an etch condition having substantially the same etch ratio for both the gate insulating layer 140 and the passivation layer 180.

Finally, as shown in FIGS. 1 and 2, a plurality of pixel electrodes 190 and a plurality of contact assistants 82 are formed by sputtering and photo-etching an IZO layer or an ITO layer.

The present embodiment discloses gate lines 121 and data lines 171 both having a Mo containing layer and an Al containing layer. However, it is possible that only one of the gate lines 121 and data lines 171 have multi-layers.

Embodiment 2

The data lines and the semiconductors are formed by different photo etching processes using different photo masks than in the first embodiment. However, the data lines and the semiconductors may be simultaneously formed by a photo etching process using a same photo mask to reduce production costs. Such an embodiment will be described in detail with reference to the drawings.

Figure 7:
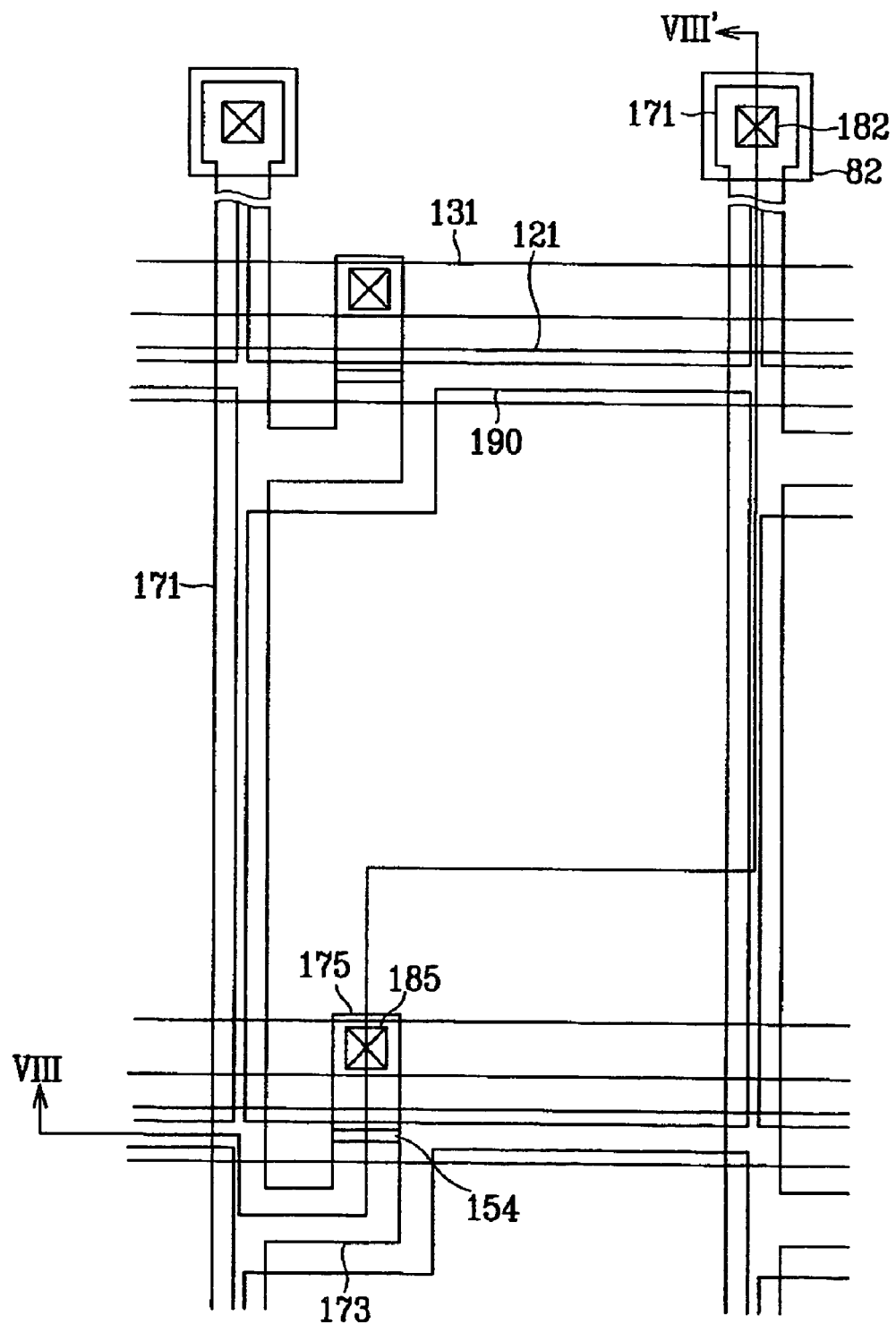
FIG. 7 is a layout view of a TFT array panel for an LCD according to another embodiment of the present invention.
Figure 8:
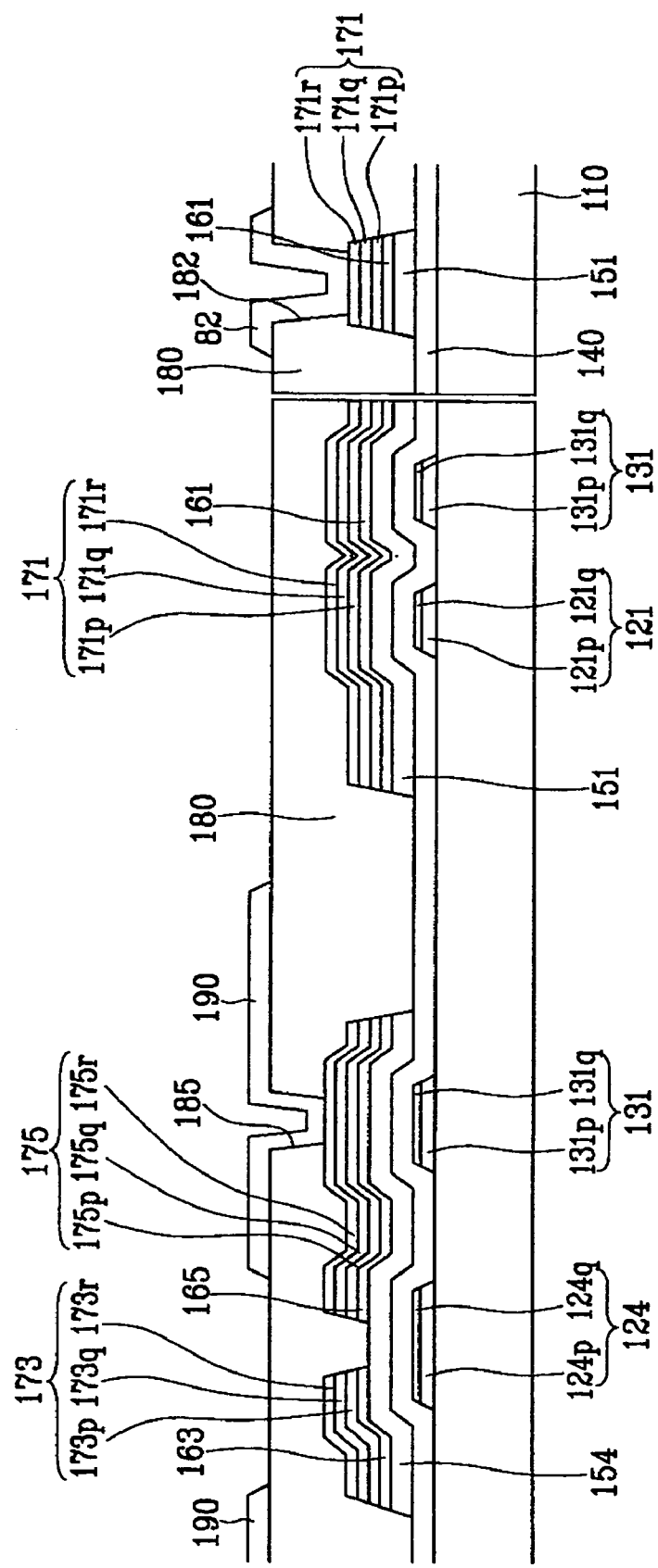
FIG. 8 is a sectional view of the TFT array panel shown in FIG. 7 taken along the line VIII-VIII'.

FIG. 7 is a layout view of a TFT array panel for an LCD according to another embodiment of the present invention. FIG. 8 is a sectional view of the TFT array panel shown in FIG. 7 taken along the line VIII-VIII'.

Referring to FIGS. 7 and 8, a plurality of gate lines 121, including a plurality of gate electrodes 124 and a plurality of storage electrode lines 131 which are electrically separated from the gate lines 121, are formed on a substrate 110.

The gate lines 121 and the storage electrode lines 131 have lower layers 121p and 131p and upper layers 121q and 131q. The lower layers 121p and 131p are made of Al or an aluminum alloy such as aluminum-neodymium (Al—Nd). The upper layers 121q and 131q are made of a molybdenum alloy (Mo-alloy), which is composed of molybdenum (Mo) and at least one of niobium (Nb), vanadium (V), and titanium (Ti). The upper layer 124q of the Mo-alloy may include 0.1 to 10 at % of the additives Nb, V, and Ti. It is more preferable that the upper layer 124q includes 3 to 8 at % of the additives.

In addition, the lateral sides of the lower films 121p and 131p and the upper films 121q and 131q are inclined relative to a surface of the substrate 110, and the inclination angle thereof ranges from about 30-80 degrees.

A gate insulating layer 140 preferably made of silicon nitride (SiNx) is formed on the gate lines 121 and the storage electrode lines 131.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branching out toward the gate electrodes 124. The projections 154 have portions overlapping the storage electrode line 131.

A plurality of ohmic contact stripes 161 and islands 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductors 151 and the ohmic contacts 161 and 165 are inclined relative to a surface of the substrate 110, and the inclination angles thereof preferably range between about 30-80 degrees.

A plurality of data lines 171 and a plurality of drain electrodes 175 are formed on the ohmic contacts 161 and 165 and the gate insulating layer 140.

The data lines 171 for transmitting data voltages extend substantially in the longitudinal direction and intersect the gate lines 121 to define pixel areas arranged in a matrix. A plurality of branches of each data line 171 that project toward the drain electrodes 175 form a plurality of source electrodes 173. Each pair of the source electrodes 173 and the drain electrodes 175 are separated from each other by a gate electrode 124 and oppose each other.

The data line 171 and the drain electrode 175 have first layers 171p and 175p, second layers 171q and 175q, and third layers 171r and 175r. The first layers 171p and 175p and third layers 171r and 175r are respectively disposed at lower and upper sides of the second layers 171q and 175q. The first layers 171p and 175p and the third layers 171r and 175r are made of a molybdenum alloy (Mo-alloy), which is composed of molybdenum (Mo) and at least one of niobium (Nb), vanadium (V), and titanium (Ti). Here, the first layers 171p and 175p and the third layers 171r and 175r of Mo-alloy may include 0.1 to 10 at % of the additives Nb, V, and Ti. It is more preferable that the first layers 171p and 175p and the third layers 171r and 175r include 3 to 8 at % of the additives.

The ohmic contacts 161 and 165 are interposed only between the underlying semiconductors 151 and the overlying data lines 171 and drain electrodes 175, and reduce the contact resistance therebetween. The semiconductor stripes 151 include a plurality of exposed portions, which are not covered with the data lines 171 and the drain electrodes 175, such as portions located between the source electrodes 173 and the drain electrodes 175.

A passivation layer 180 is formed on the data lines 171, the drain electrodes 175, and exposed portions of the semiconductor stripes 151, which are not covered with the data lines 171 and the drain electrodes 175. The passivation layer 180 is preferably made of a photosensitive organic material having good planarity, a dielectric insulating material having a low dielectric constant under 4.0, such as a-Si:C:O and a-Si:O:F formed by plasma enhanced chemical vapor deposition (PECVD), or an inorganic material such as silicon nitride and silicon oxide.

The passivation layer 180 has a plurality of contact holes 182 and 185.

A plurality of pixel electrodes 190 and a plurality of contact assistants 82 are formed on the passivation layer 180.

The pixel electrodes 190 are physically and electrically connected to the drain electrodes 175 through the contact holes 185 such that the pixel electrodes 190 receive the data voltages from the drain electrodes 175. The pixel electrodes 190, supplied with the data voltages, generate electric fields in cooperation with a common electrode (not shown) on another panel (not shown), which reorient liquid crystal molecules in a liquid crystal layer (not shown) disposed therebetween.

A pixel electrode 190 and a common electrode form a liquid crystal capacitor, which stores applied voltages after turning-off the TFT. An additional capacitor called a "storage capacitor" is connected in parallel to the liquid crystal capacitor. The storage capacitors are implemented by overlapping the pixel electrodes 190 with the storage lines 131. The storage electrode lines 131 are supplied with a predetermined voltage such as the common voltage. The storage electrode lines 131 may be omitted if the storage capacitance generated by the overlapping of the gate lines 121 and the pixel electrodes 190 is sufficient. The storage electrode lines 131 may be formed along a boundary of the pixels to enhance an aperture ratio.

A method of manufacturing the TFT array panel illustrated in FIGS. 7 and 8 will be now described in detail with reference to FIGS. 9A to 13C as well as FIGS. 7 and 8.

Two layers, a lower layer and an upper layer, are sputtered in sequence onto an insulating substrate 110 such as transparent glass. The lower layer is preferably made of an aluminum alloy such as Al—Nd. The upper layer is preferably made of a molybdenum alloy (Mo-alloy), which is composed of molybdenum (Mo) and at least one of niobium (Nb), vanadium (V), and titanium (Ti).

Figure 9A:
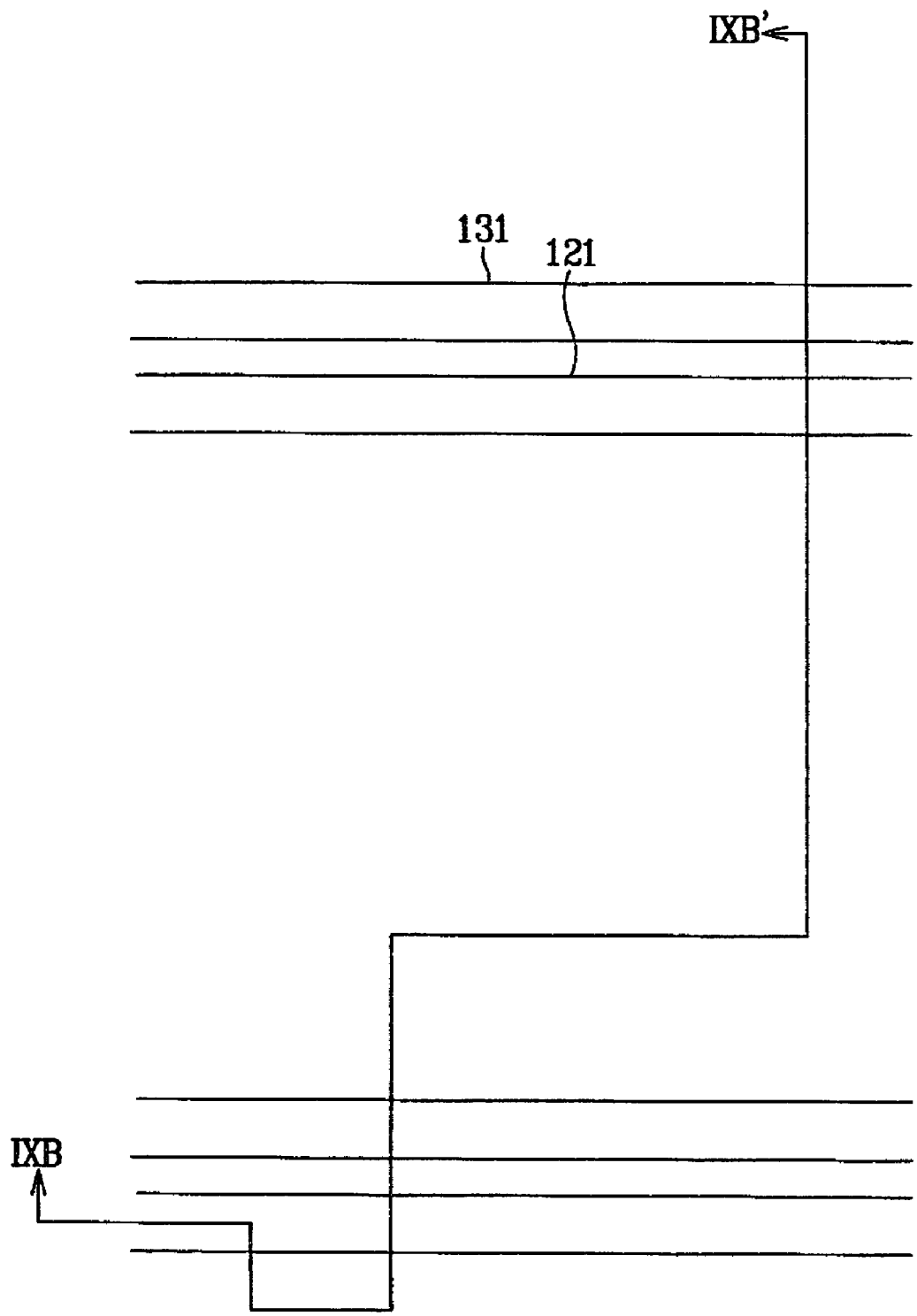
Figure 9B:
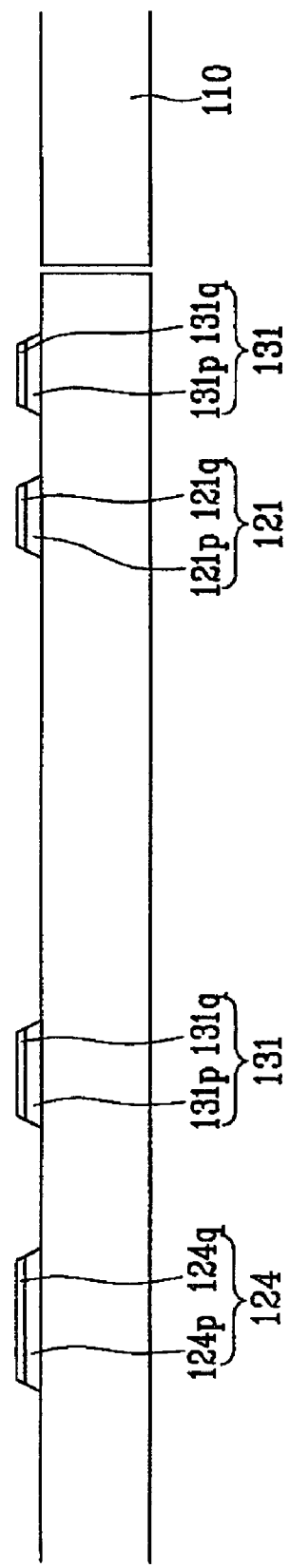

Referring to FIGS. 9A and 9B, the upper layer and the lower layer are patterned in sequence by photo-etching with a photoresist pattern to form a plurality of gate lines 121, including a plurality of gate electrodes 124, and a plurality of storage electrode lines 131.

Figure 10:
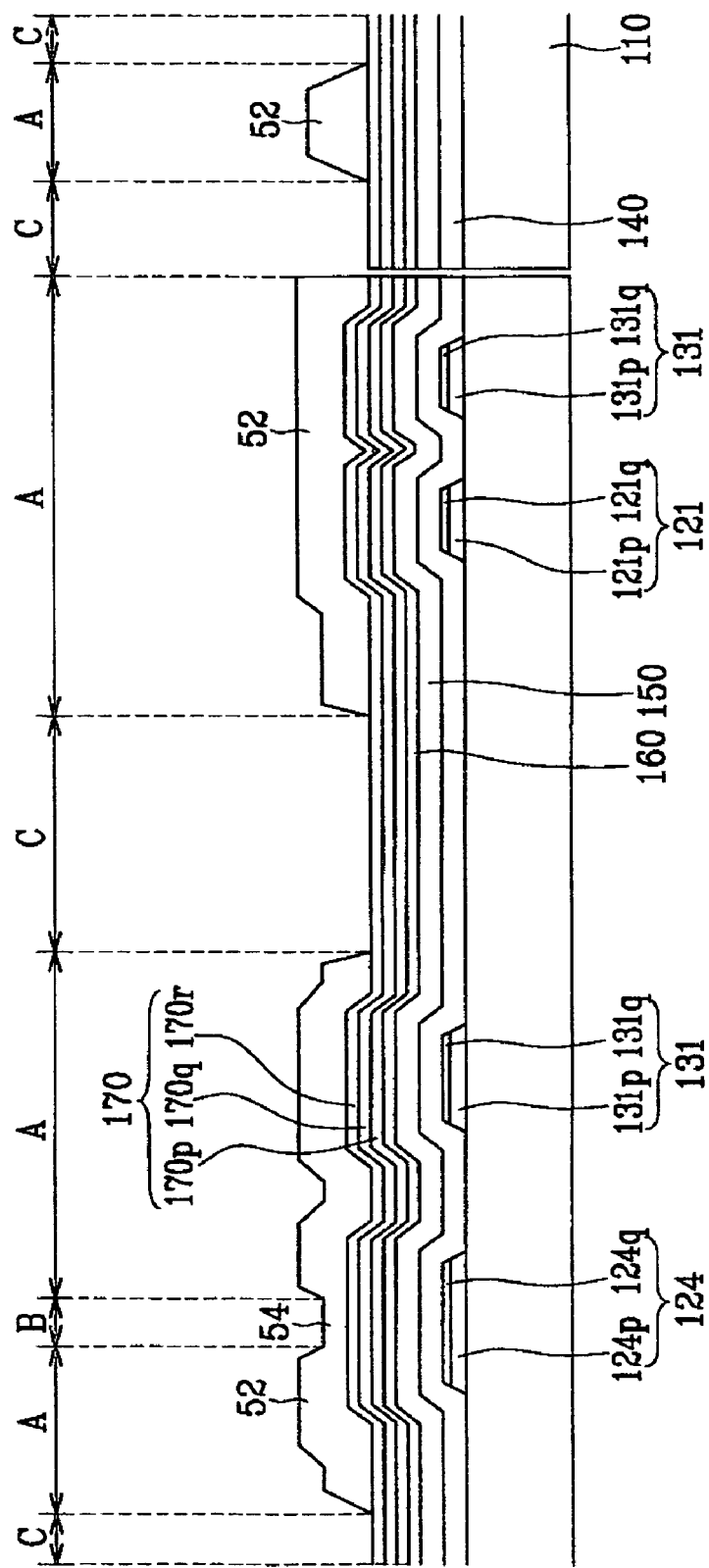

Referring to FIG. 10, a gate insulating layer 140 made of SiNx, an intrinsic semiconductor layer 150, and an extrinsic semiconductor layer 160 are sequentially deposited. The intrinsic semiconductor layer 150 is preferably made of hydrogenated amorphous silicon (abbreviated to "a-Si") and the extrinsic semiconductor layer 160 is preferably made of silicide or n+ hydrogenated a-Si heavily doped with n type impurity.

Next, a first layer 170p of Mo-alloy, a second layer 170q of Al (or an Al-alloy), and a third layer 170r of Mo-alloy are sequentially deposited on the extrinsic semiconductor layer 160. The first and third layers 170p and 170r are made of a molybdenum alloy (Mo-alloy), which is composed of molybdenum (Mo) and at least one of niobium (Nb), vanadium (V), and titanium (Ti). Here, one of the first layer 170p and third layer 170q may be formed of pure Mo or another material.

A photoresist film is coated on the third layer 170r. The photoresist film is exposed to light through an exposure mask (not shown), and developed such that the developed photoresist has a position dependent thickness as shown in FIG. 10. The developed photoresist includes a plurality of first to third portions 54 and 52. The first portions 54 are located on channel areas B and the second portions 52 are located on the data line areas A. No reference numeral is assigned to the third portions located on the remaining areas C since they have essentially zero thickness. Here, the thickness ratio of the first portions 54 to the second portions 52 is adjusted depending upon the process conditions in the subsequent process steps. It is preferable that the thickness of the first portions 54 is equal to or less than half of the thickness of the second portions 52.

The position-dependent thickness of the photoresist is obtained by several techniques, for example, by providing translucent areas on the exposure mask as well as transparent areas and light blocking opaque areas. The translucent areas may have a slit pattern, a lattice pattern, and thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to a reflow process to flow onto areas without the photoresist, thereby forming thin portions.

Next, the photoresist film 52 and 54 and the underlying layers are etched such that the data lines 171, drain electrodes 175, and the underlying layers are left on the data areas A, only the intrinsic semiconductor layer is left on the channel areas B, and the gate insulating layer 140 is exposed on the remaining areas C.

A method to form such a structure will be now described.

Referring to FIG. 11, the exposed portions of the first to third layers 170p, 170q, and 170r on the other areas C are removed to expose the underlying portions of the extrinsic semiconductor layer 160.

Next, referring to FIG. 11, the exposed portions of the extrinsic semiconductor layer 160 and the underlying portions of the intrinsic semiconductor layer 150 on the areas C as well as the photoresist pattern 54 and 52 are removed by dry etching to expose S(source)/D(drain) metals 174 of the areas B.

The photoresist pattern 54 of the channel areas B may be simultaneously removed by an etching for removing the extrinsic semiconductor 160 and the intrinsic semiconductor 150 or by a separate etching. Residual photoresist of the photoresist pattern 54 in the channel area B is removed by ashing. In this step, the semiconductor strips 151 are completely formed.

Figure 12A:
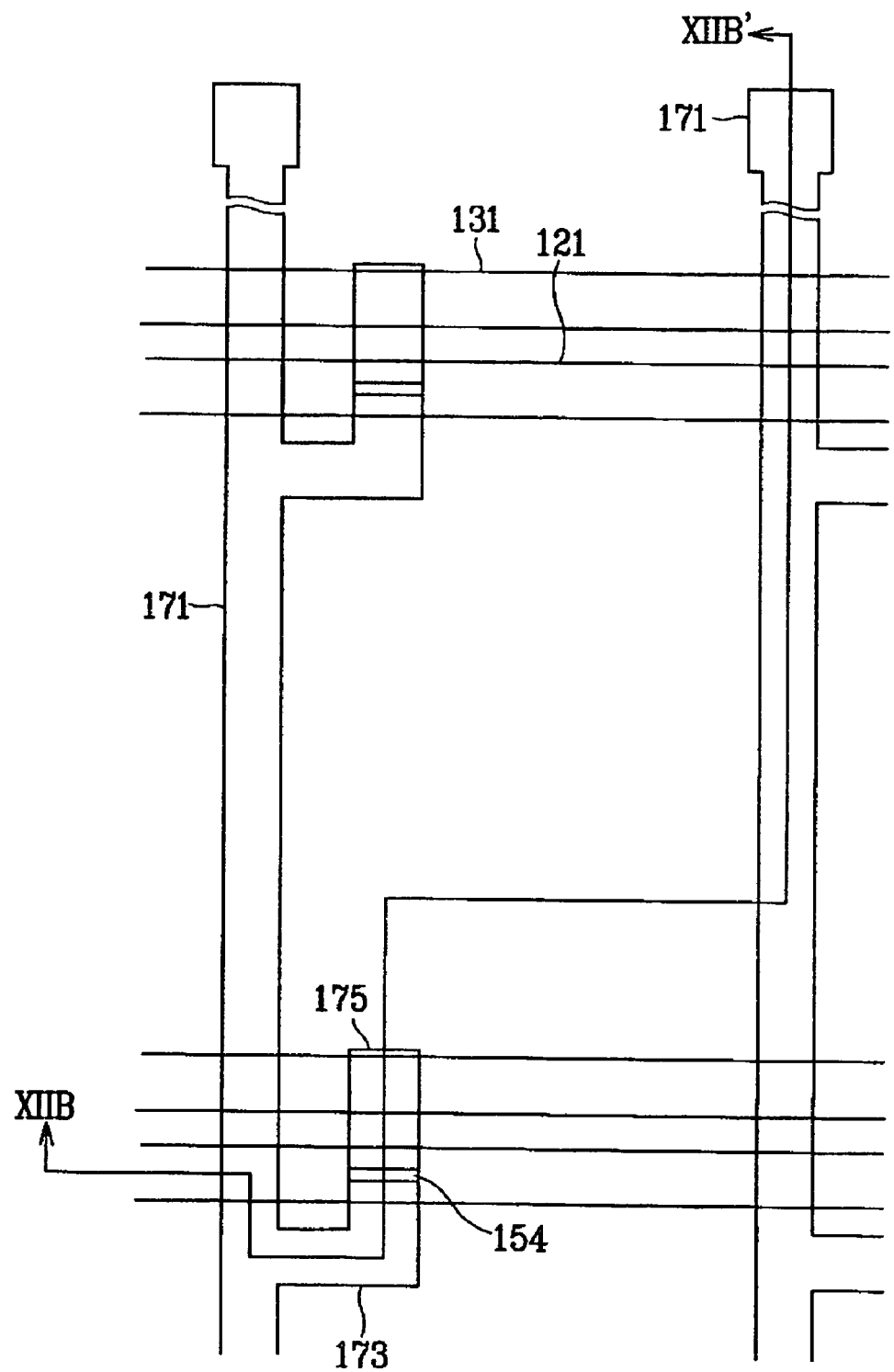
Figure 12B:
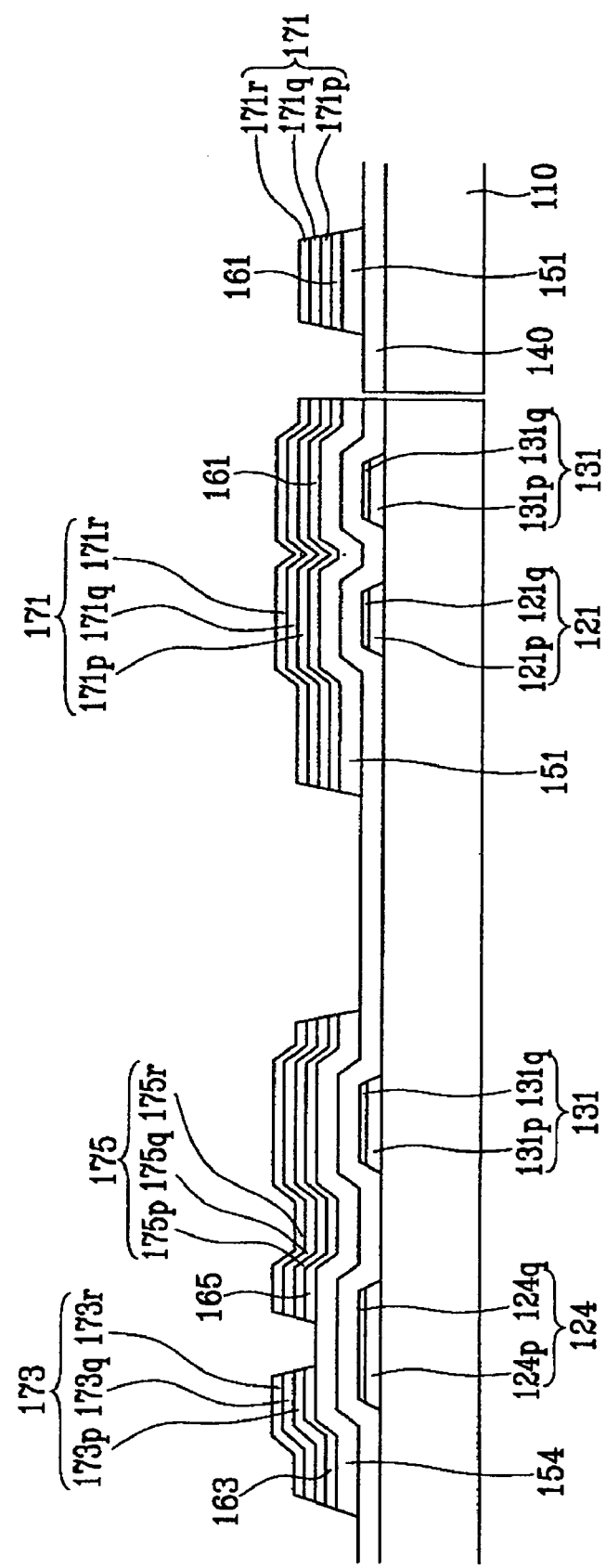

Next, as shown in FIGS. 12A and 12B, portions of the S/D metals 174 and the underlying portions of the extrinsic semiconductor layer 164 on the channel areas B are etched to be removed. At this time, the exposed portions of the semiconductor 154 may be etched to have a reduced thickness and the second portion 52 of the photoresist pattern may also be partially removed.

Accordingly, the source electrodes 173 and the drain electrodes 175 are separated from each other, and, simultaneously, the data lines and the ohmic contacts 163 and 165 thereunder are completed.

Finally, the residual second portions 52 of the photoresist pattern left on the data areas A are removed.

In the above description, the first to third layers 170$p$, 170$q$, and 170$r$ are preferably etched by an etchant containing phosphoric acid, nitric acid, acetic acid, and deionized water. Precisely, the etchant may include 63% to 70% of phosphoric acid, 4% to 8% of nitric acid, 8% to 11% of acetic acid, and deionized water for the residual quantity. The etchant may include more acetic acid by about 4% to 8%.

Figure 13A:
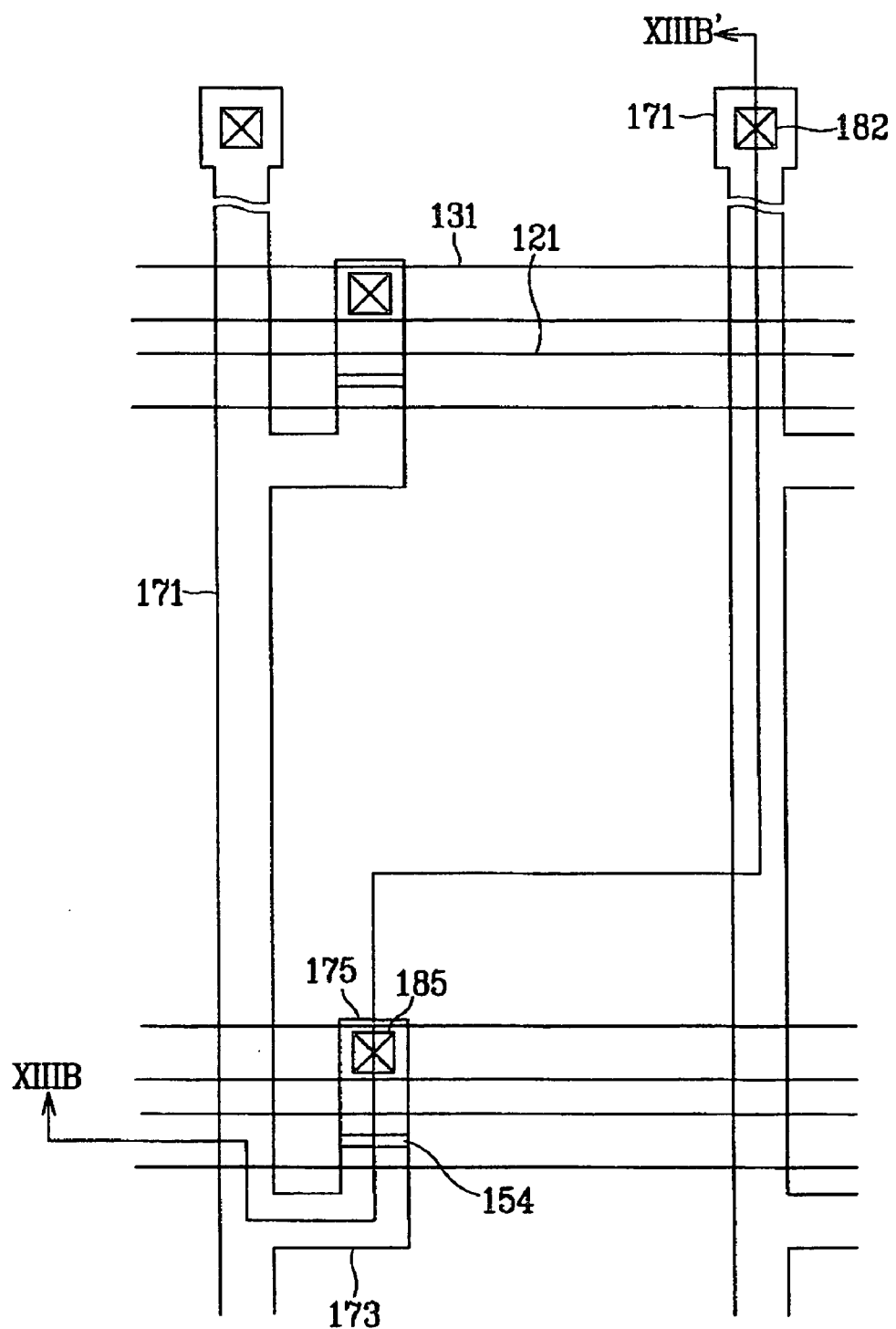
Figure 13B:
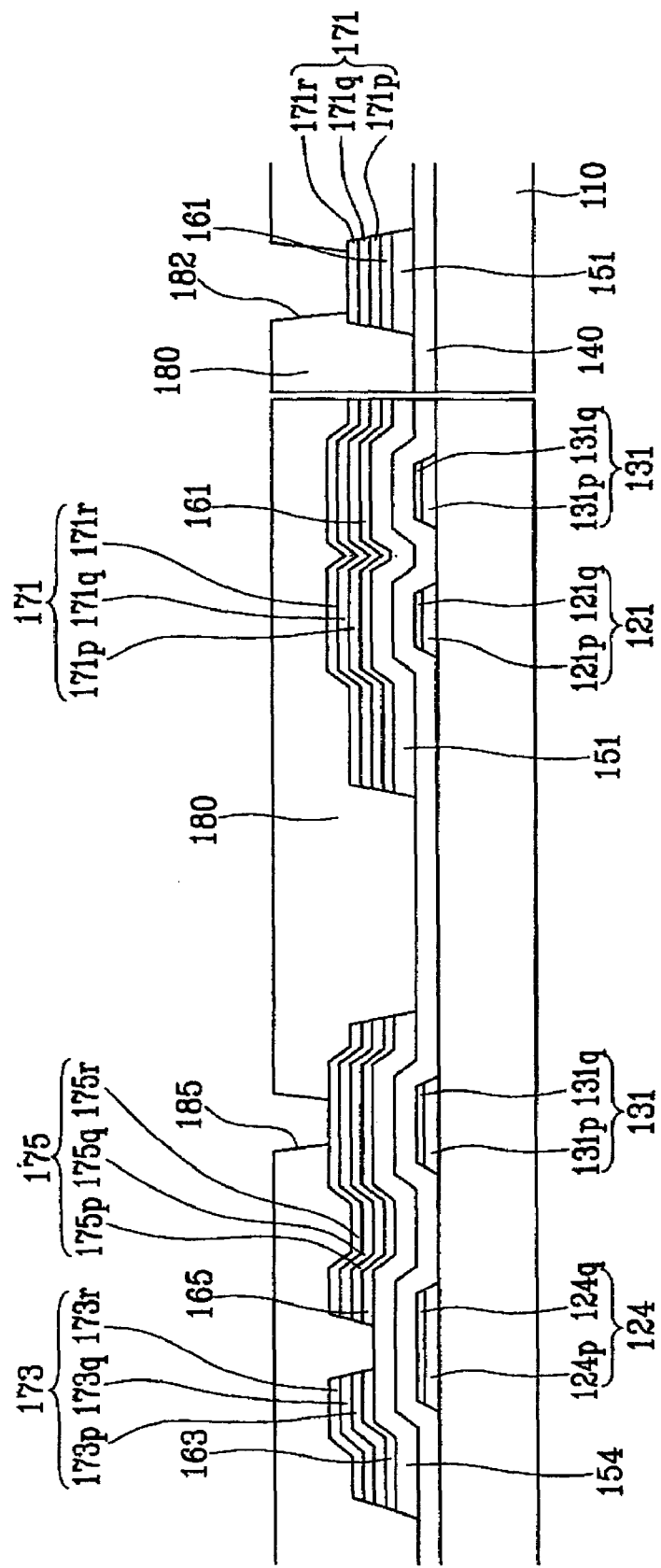

Thereafter, as shown in FIGS. 13A and 13B, a passivation layer 180 is formed to cover the data lines 171, the drain electrodes 175, and the exposed portions of the semiconductor stripes 151, which are not covered with the data lines 171 and the drain electrodes 175. The passivation layer 180 is preferably made of a photosensitive organic material having good planarity, a dielectric insulating material having a low dielectric constant under 4.0, such as a-Si:C:O and a-Si:O:F, formed by plasma enhanced chemical vapor deposition (PECVD), or an inorganic material, such as silicon nitride and silicon oxide.

Next, the passivation layer 180 is photo-etched to form a plurality of contact holes 185 and 182. When the passivation layer 180 is made of a photosensitive material, the contact holes 185 and 182 may be formed only by photolithography.

Finally, as shown in FIGS. 7 and 8, a plurality of pixel electrodes 190 and a plurality of contact assistants 82 are formed by sputtering and photo-etching an IZO layer or an ITO layer. The pixel electrodes 190 and the contact assistants 82 are respectively connected to the drain electrodes 175 and an end of the data lines 171 through the contact holes 185 and 182.

The present embodiment illustrates gate lines 121 and data lines 171 both having a Mo containing layer and an Al containing layer. However, it is possible that only one of the gate lines 121 and data lines 171 have multi-layers.

Embodiment 3

The present embodiment illustrates a thin film transistor (TFT) array panel having color filters.

Figure 14A:
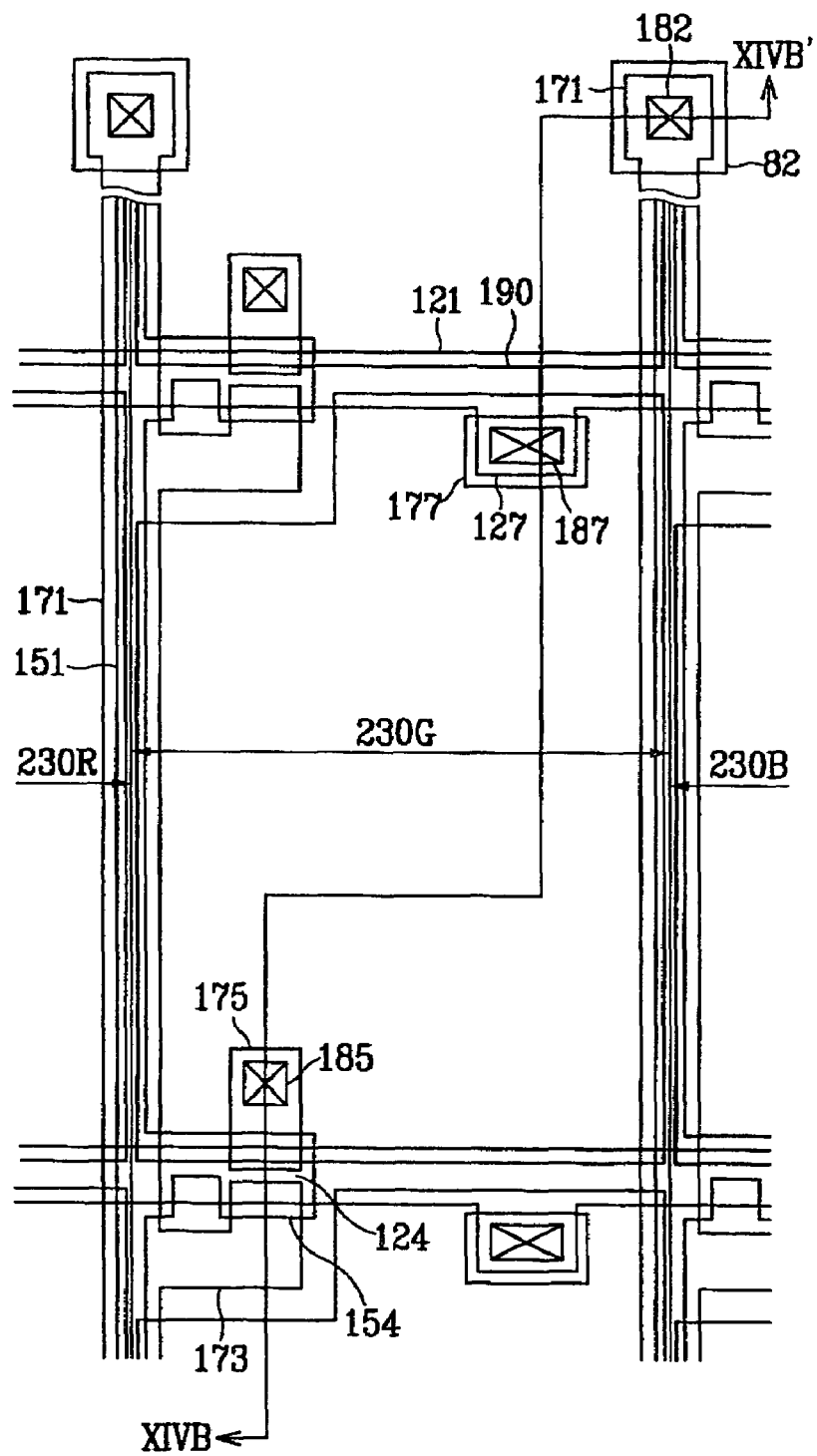
FIG. 14A is a layout view of a TFT array panel for an LCD according to another embodiment-of the present invention.
Figure 14B:
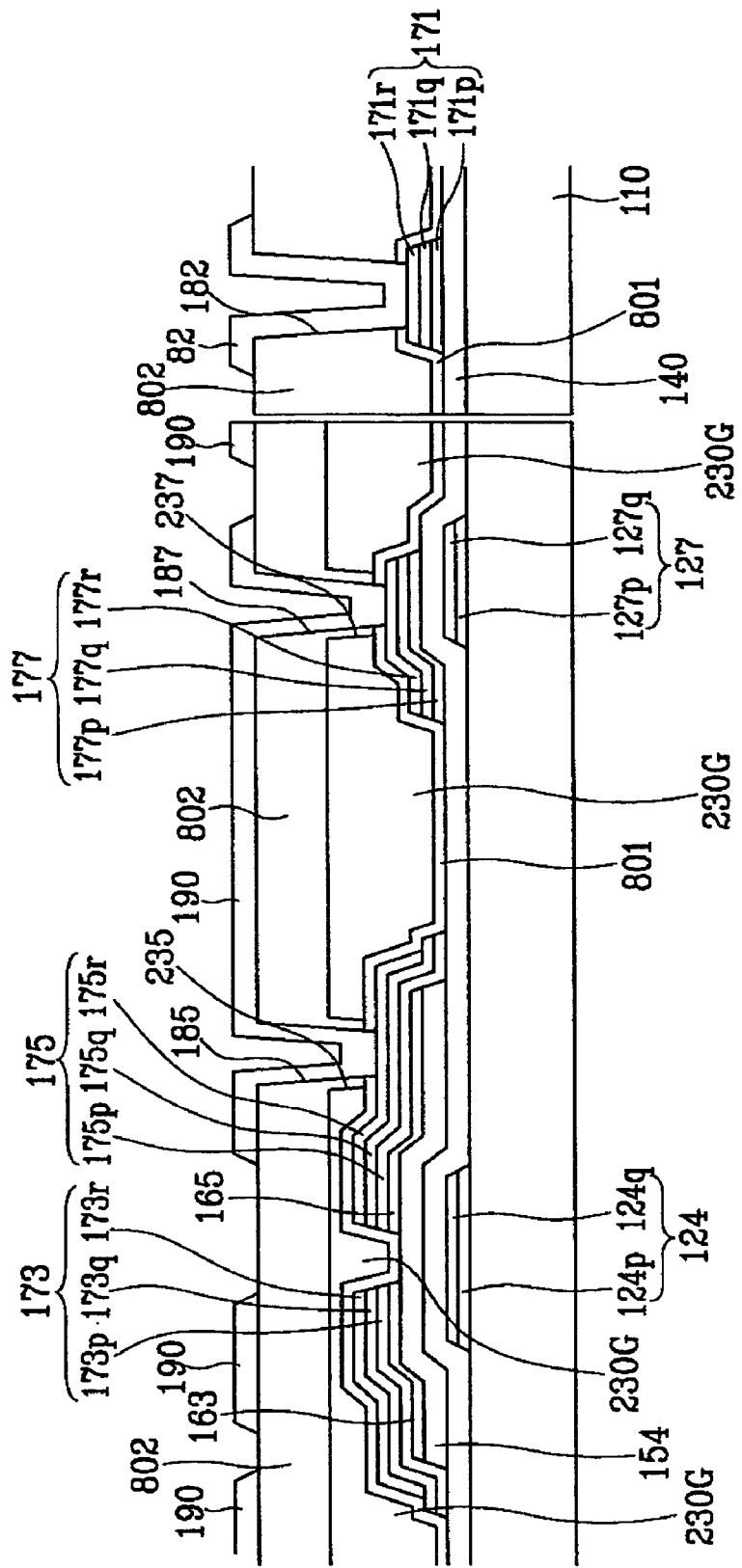
FIG. 14B is a sectional view of the TFT array panel shown in FIG. 14A taken along the line XIVB-XIVB'.

FIG. 14A is a layout view of a TFT array panel for an LCD according to another embodiment of the present invention. FIG. 14B is a sectional view of the TFT array panel shown in FIG. 14A taken along the line XIVB-XIVB'.

A plurality of gate lines 121 for transmitting gate signals are formed on an insulating substrate 110. The gate lines 121 are mainly formed in the horizontal direction and the partial portions thereof become a plurality of gate electrodes 124. Also, different partial portions thereof, which extend in a lower direction, become a plurality of expansions 127.

The gate line 121 has lower layers 124$p$ and 127$p$ and upper layers 124$q$ and 127$q$. The lower layers 124$p$ and 127$p$ are made of aluminum (Al) or an aluminum alloy such as aluminum-neodymium (Al—Nd). The upper layers 124$q$ and 127$q$ are made of a molybdenum alloy (Mo-alloy: Mo—Nb, Mo—V, Mo—Ti), which is composed of molybdenum (Mo) and at least one of niobium (Nb), vanadium (V), and titanium (Ti).

The upper layers 124$q$ and 127$q$ of Mo-alloy are formed on the lower layers 124$p$ and 127$p$ of Al or Al-alloy to prevent hillock growth, undercut, overhang, and mouse bites, which may arise in the etching process.

The upper layers 124$q$ and 127$q$ of Mo-alloy may include 0.1 to 10 at % of the additives Nb, V, and Ti. It is more preferable that the upper layers 124$q$ and 127$q$ include 3 to 8 at % of the additives. When the content of the additives is increased, adhesiveness to other layers and chemical resistance of the upper layers 124$q$ and 127$q$ are improved, but resistivity of the upper layer 124$q$ and 127$q$ increases. Accordingly, the content of the additives has the above-described preferable range.

FIG. 38 is a graph illustrating variation of resistivity according to the included amount of Nb. According to FIG. 38, the resistivity of the Mo-alloy is almost linearly proportioned to the amount of Nb. Accordingly, when the resistivity, adhesiveness, and chemical resistance are considered, the preferable content range of the additives is determined as the above-described range.

The lateral sides of the upper layers 124$q$ and 127$q$ and lower layers 124$p$ and 127$q$ are inclined relative to a surface of the substrate 110, and the inclination angle thereof ranges from about 30-80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") is formed on the gate insulating layer 140. Each semiconductor stripe 151 extends substantially in the longitudinal direction and is curved periodically. Each semiconductor stripe 151 has a plurality of projections 154 branched out toward the gate electrodes 124. The width of each semiconductor stripe 151 becomes large near the gate lines 121 such that the semiconductor stripe 151 covers large areas of the gate lines 121.

A plurality of ohmic contact stripes 161 and islands 165, preferably made of silicide or n+ hydrogenated a-Si heavily doped with n type impurity, are formed on the semiconductor stripes 151. Each ohmic contact stripe 161 has a plurality of projections 163, and the projections 163 and the ohmic contact islands 165 are located in pairs on the projections 154 of the semiconductor stripes 151.

The edge surfaces of the semiconductor stripes 151 and the ohmic contacts 161 and 165 are tapered, and the inclination angles of the edge surfaces of the semiconductor stripes 151 and the ohmic contacts 161 and 165 are preferably in a range from about 30-80 degrees.

A plurality of data lines 171, a plurality of drain electrodes 175, and a plurality of storage capacitor conductors 177 are formed on the ohmic contacts 161 and 165 and the gate insulating layer 140.

The data lines 171 for transmitting data voltages extend substantially in the longitudinal direction and intersect the gate lines 121 to define pixel areas arranged in a matrix. A plurality of branches of each data line 171 that project toward the drain electrodes 175 form a plurality of source electrodes 173. Each pair of the source electrodes 173 and the drain electrodes 175 are separated from each other at on a gate electrode 124 and are opposite to each other.

A gate electrode 124, a source electrode 173, and a drain electrode 175, along with a projection 154 of a semiconductor stripe 151, form a TFT having a channel formed in the projection 154 disposed between the source electrode 173 and the drain electrode 175. The storage capacitor conductor 177 is overlapped with the expansion 127 of the gate line 121.

The data lines 171, the drain electrode 175, and the storage capacitor conductor 177 may be made of a metal such as Cr, Ti, Ag, Mo, Ta, or an Al containing metal (Al, or Al-alloy). When the data lines 171, the drain electrode 175, and the storage capacitor conductor 177 include an Al containing metal layer, the data lines 171, the drain electrode 175, and the storage capacitor conductor 177 further include another layer made of Cr, Ti, Ta, Mo, or their alloys which have good physical, chemical, and electrical contact characteristics with other materials such as indium tin oxide (ITO) and indium zinc oxide (IZO). However, the data lines 171, the drain electrode 175, and the storage capacitor conductor 177 preferably have first layers 171p, 175p, and 177p, second layers 171q, 175q, and 177q, and third layers 171r, 175r, and 177r. The first layers 171p, 175p, and 177p and third layers 171r, 175r, and 177r are respectively disposed at lower and upper sides of the second layers 171q, 175q, and 177q. The first layers 171p, 175p, and 177p and the third layers 171r, 175r, and 177r are made of a molybdenum alloy (Mo-alloy), which is composed of molybdenum (Mo) and at least one of niobium (Nb), vanadium (V), and titanium (Ti). Here, the first layers 171p, 175p, and 177p and the third layers 171r, 175r, and 177r of Mo-alloy may include 0.1 to 10 at % of the additives Nb, V, and Ti. It is more preferable that the first layers 171p, 175p, and 177p and the third layers 171r, 175r, and 177r include 3 to 8 at % of the additives. When the content of the additives is increased, adhesiveness to other layers and chemical resistance of the first layers 171p, 175p, and 177p and the third layers 171r, 175r, and 177r are improved but resistivity of the first layers 171p, 175p, and 177p and the third layers 171r, 175r, and 177r increases. Accordingly, the content of the additives has the above preferable range.

A Mo-alloy, containing a predetermined amount of Nb, V, or Ti which make an isomorphous solid solution with Mo, has better chemical resistance (slow etch speed) and less difference of chemical resistance with the lower layer of Al or Al alloy than Mo itself. As the difference of chemical resistance between the first and the third layers 171p, 175p, and 177p and 171r, 175r, and 177r and the second layers 171q, 175q, and 177q is reduced, undercut, overhang, and mouse bites, which may arise in an etching process, are prevented.

The data lines 171, the drain electrodes 175, and the storage capacitor conductor 177 have tapered edge surfaces, and the inclination angles of the edge surfaces are in a range from about 30-80 degrees.

The ohmic contacts 161 and 165 are only interposed between the semiconductor stripe 151 and the data line 171 and between the drain electrode 175 and the projection 154 of the semiconductor stripe 151 in order to reduce contact resistance therebetween. The semiconductor stripe 151 is partially exposed at a place between the source electrode 173 and the drain electrode 175 and at other places not covered with the data line 171 and the drain electrode 175. Most of the semiconductor stripe 151 is narrower than the data line 171 but the width of the semiconductor stripe 151 broadens near a place where the semiconductor stripe 151 and the gate line 121 meet each other in order to prevent disconnection of the data line 171, as mentioned in the above.

It is a distinguishing feature of the present embodiment that color filters 230R, 230G, and 230B are formed on the data line 171, the drain electrode 175, and the storage capacitor conductor 177. The color filters 230R, 230G, and 230B are formed along pixel columns that are partitioned by data lines 171. The red, green, and blue color filters 230R, 230G, and 230B are illuminated or energized in turn.

The color filters 230R, 230G, and 230B are not formed on the end portions of the gate lines 121 and the data lines 171, which are connected to external circuits. Two adjacent color filters 230R, 230G, and 230B overlap each other on the data lines 171. Accordingly, light leakage that may arise around a pixel area is prevented by the overlapped color filters 230R, 230G, and 230B. All of the red, green, and blue color filters 230R, 230G, and 230B may be disposed on the data line 171 so as to overlap each other.

A first interlayer insulating layer 801 is formed under the color filters 230R, 230G, and 230B to prevent pigments of the color filters 230R, 230G, and 230B from penetrating into the semiconductor protrusion 154. A second interlayer insulating layer 802 is formed on the color filters 230R, 230G, and 230B to prevent pigments of the color filters 230R, 230G, and 230B from penetrating into a liquid crystal layer (not illustrated).

The interlayer insulating layers 801 and 802 may be made of an insulating material with a low dielectric constant such as a-Si:C:O and a-Si:O:F, or SiNx.

As described above, when the color filters 230R, 230G, and 230B are formed on the thin film transistor array panel and overlap each other on the data line 171, the opposite panel may have only a common electrode. Accordingly, assembling of the TFT panel and opposite panel is easy and the aperture ratio increases.

In the second interlayer insulating layer 802, a plurality of contact holes 185, 187, and 182 are formed to expose the drain electrode 175, the storage capacitor conductor 177, and an end portion of the data line 171 respectively.

A plurality of pixel electrodes 190 and a plurality of contact assistants 82, which are made of IZO or ITO, are formed on the passivation layer 180.

Since the pixel electrode 190 is physically and electrically connected with the drain electrode 175 and the storage capacitor conductor 177 through the contact holes 185 and 187, respectively, the pixel electrode 190 receives the data voltage from the drain electrodes 175 and transmits it to the storage capacitor conductor 177.

The pixel electrode 190, to which the data voltage is applied, generates an electric field with a common electrode (not shown) of the opposite panel (not shown) to which common voltage is applied, so that the liquid crystal molecules in the liquid crystal layer are rearranged.

The contact assistant 82 supplements adhesion between the end portion of the data line 171 and the exterior devices such as the driving integrated circuit and protects them. Applying the contact assistant 82 is optional since it is not an essential element.

A method of manufacturing a TFT array panel will now be described in detail with reference to FIGS. 15A to 16B as well as FIGS. 14A and 14B.

Figure 15A:
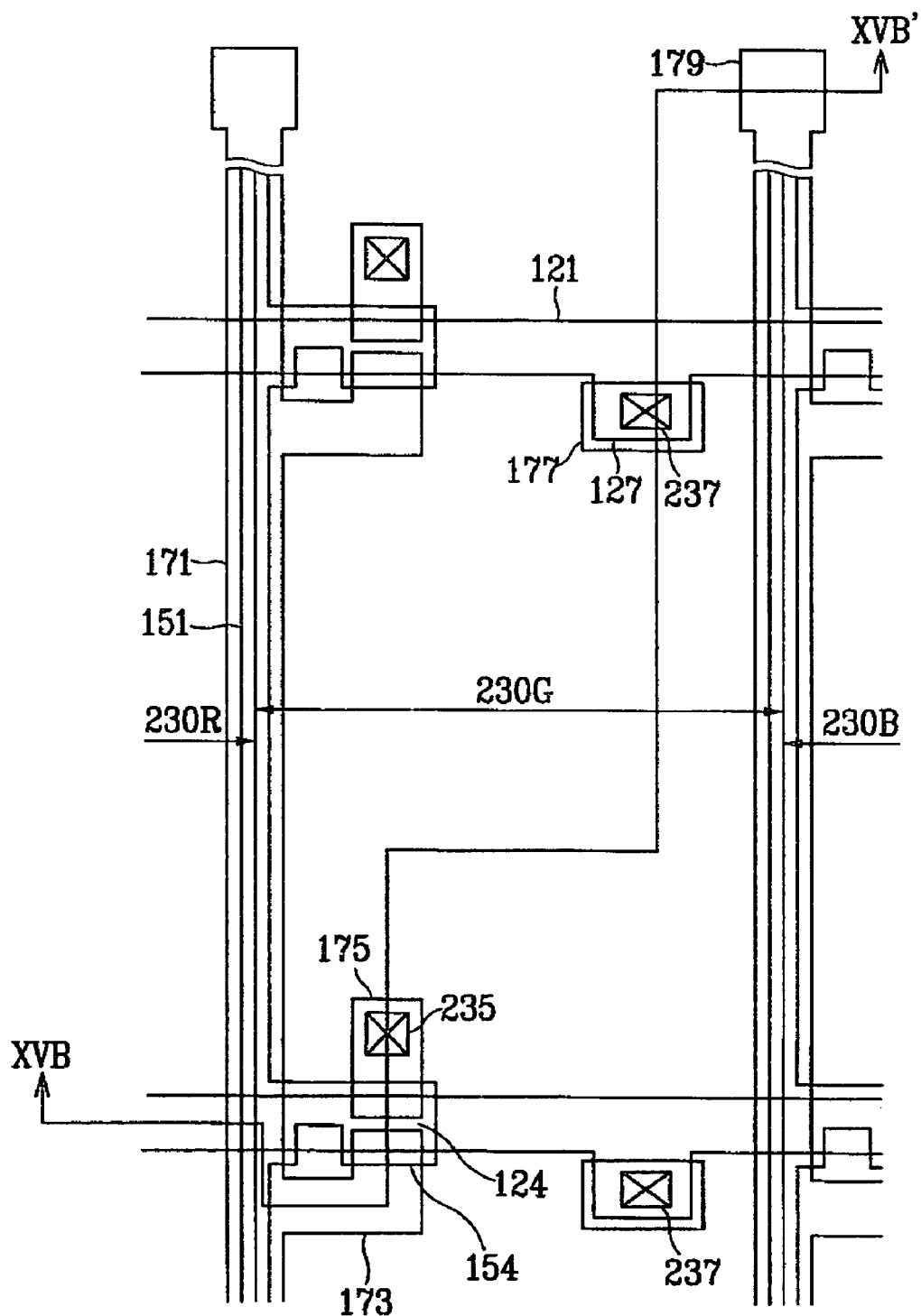

Referring to FIGS. 15A and 15B, a plurality of gate lines 121 having lower layers 124p and 127p of Al or Al-alloy and upper layers 124q and 127q of a molybdenum alloy (Mo-alloy), which is composed of molybdenum (Mo) and at least one of niobium (Nb), vanadium (V), and titanium (Ti), are formed on an insulating substrate 110 of glass.

A gate insulating layer 140, a plurality of semiconductor stripes 151, a plurality of ohmic contact assistants 161 and 165, and a plurality of data lines 171 and drain electrodes 175 are sequentially formed on the gate lines 121.

Next, organic photo-resist materials respectively containing pigments of red, green, and blue are coated and are patterned by a photo process to form a plurality of color filters 230R, 230G, and 230B in sequence. Here, a first interlayer insulating layer 801 made of an inorganic insulating material such as SiNx or SiO$_2$ is formed on the data lines 171 and drain electrodes 175 before forming the color filters 230R, 230G, and 230B. The first interlayer insulating layer 801 prevents pigments of the color filters 230R, 230G, and 230B from penetrating into the semiconductor protrusion 154. At this time, openings 235 and 237 exposing the drain electrode 175 and the storage capacitor conductor 177 are simultaneously formed.

Figure 16A:
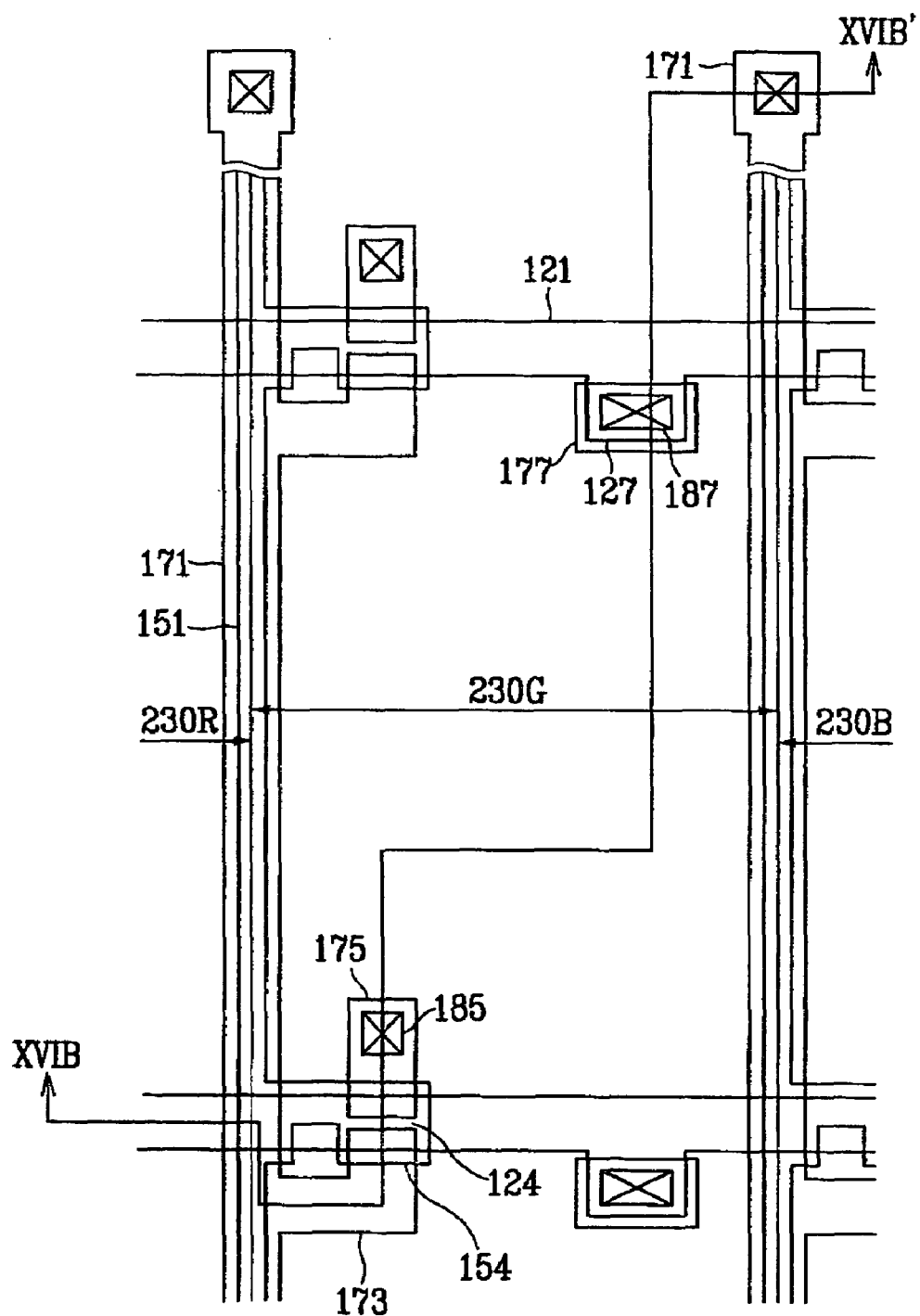
Figure 16B:
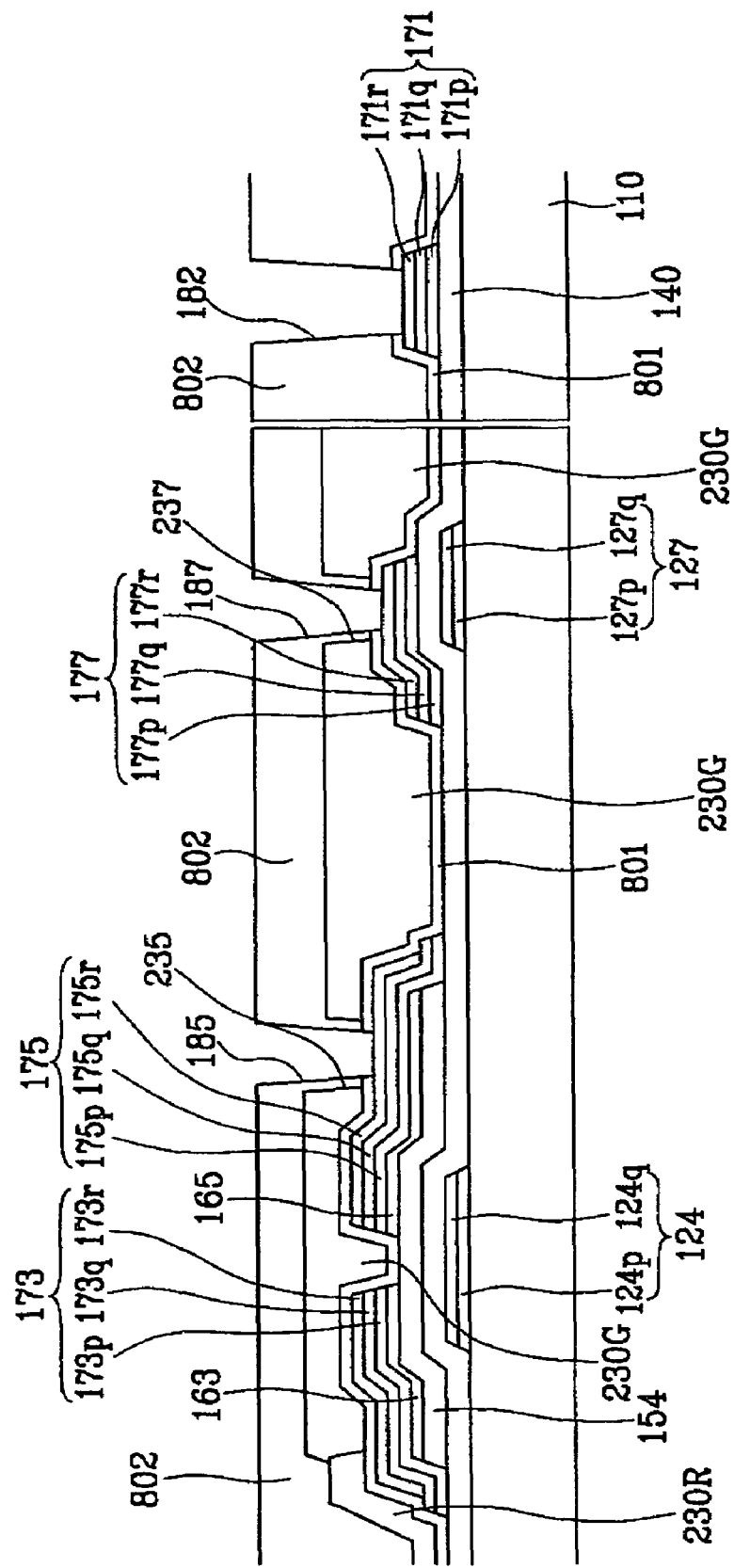

Referring to FIGS. 16A and 16B, a second interlayer insulating layer 802 is formed by the coating of an organic insulating film having a low dielectric constant and good planarity, or by the PECVD of a low dielectric insulating material such as a-Si:C:O and a-Si:O:F having a dielectric constant lower than about 4.0.

Thereafter, the first and second interlayer insulating layers 801 and 802 are photo-etched to form a plurality of contact holes 182, 185, and 187. Here, the contact holes 185 and 187 exposing the drain electrodes 175 and the storage capacitor conductor 177 are formed in the openings 235 and 237 of the color filters 230R, 230G, and 230B.

Finally, as shown in FIG. 14B, a plurality of pixel electrodes 190 and a plurality of contact assistants 82 are formed by sputtering and photo-etching an IZO layer or an ITO layer. The pixel electrodes 190 are connected to the drain electrodes 175 and the storage capacitor conductor 177 through the contact holes 185 and 187.

The present embodiment illustrates gate lines 121 and data lines 171 both having a Mo containing layer and an Al containing layer. However, it is possible that only one of the gate lines 121 and data lines 171 has multi-layers.

Embodiment 4

Now, a TFT panel for an active matrix organic light emitting display (AM-OLED) according to another embodiment of the present invention will be described.

Figure 17:
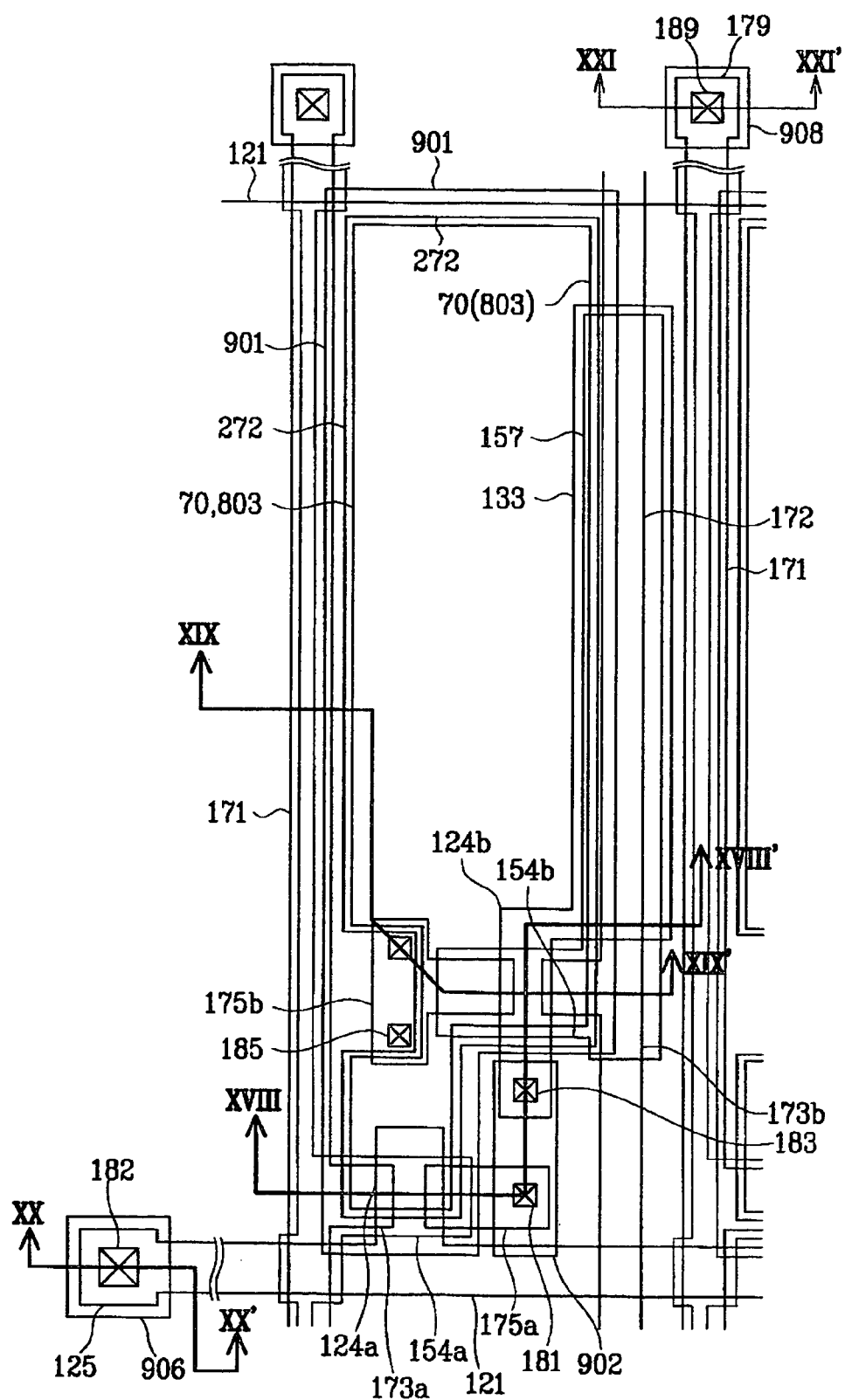
FIG. 17 is a layout view of a TFT array panel for an LCD according to another embodiment of the present invention.
Figure 18:
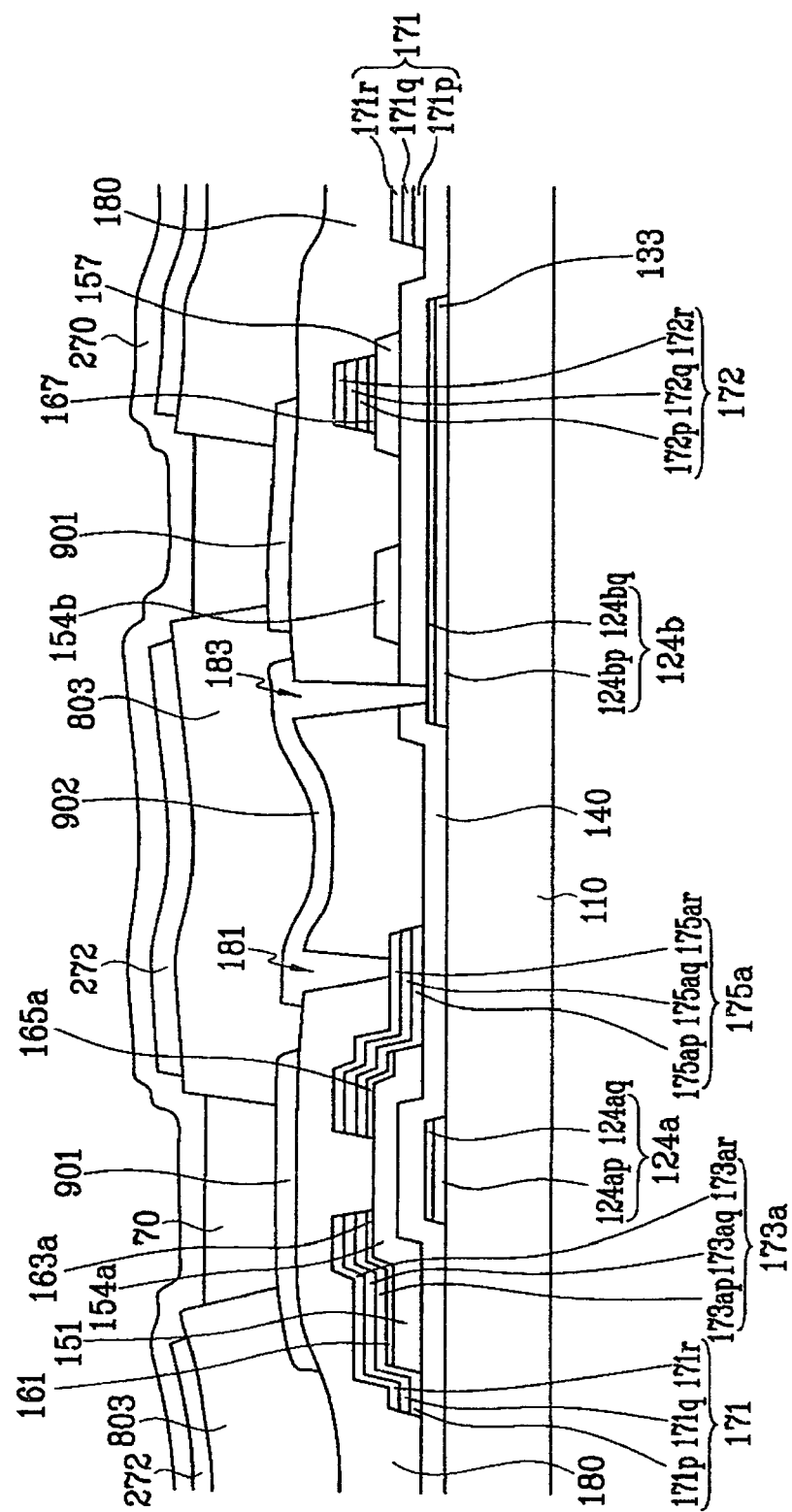
FIGS. 18 and 19 are sectional views of the TFT array panel shown in FIG. 17 taken along the line XVIII-XVIII' and the line XIX-XIX', respectively.
Figure 19:
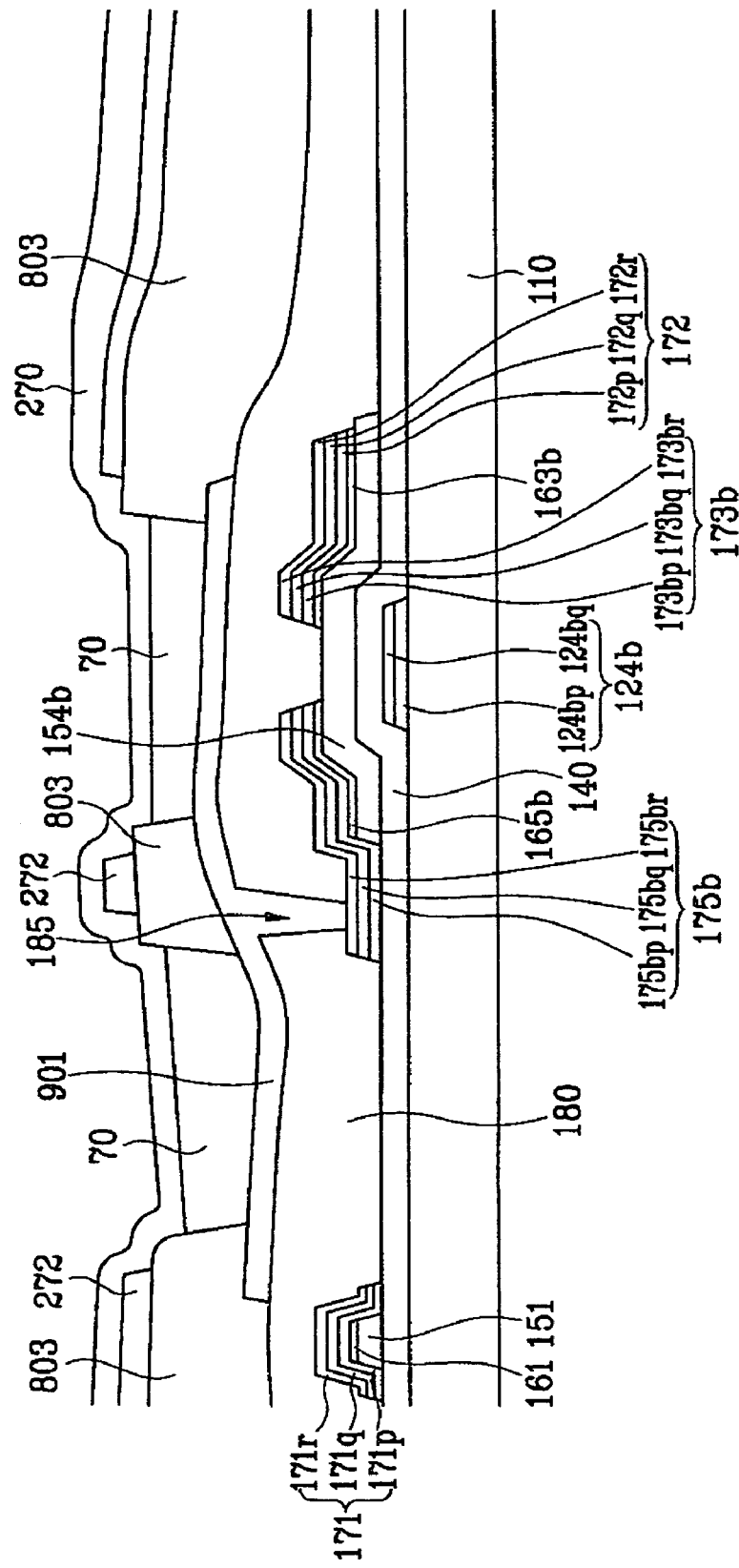
Figure 20:
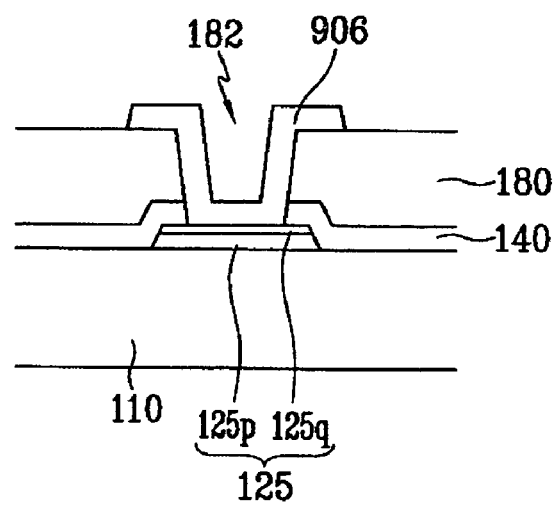
FIGS. 20 and 21 are sectional views of the TFT array panel shown in FIG. 17 taken along the line XX-XX' and the line XXI-XXI', respectively.
Figure 21:
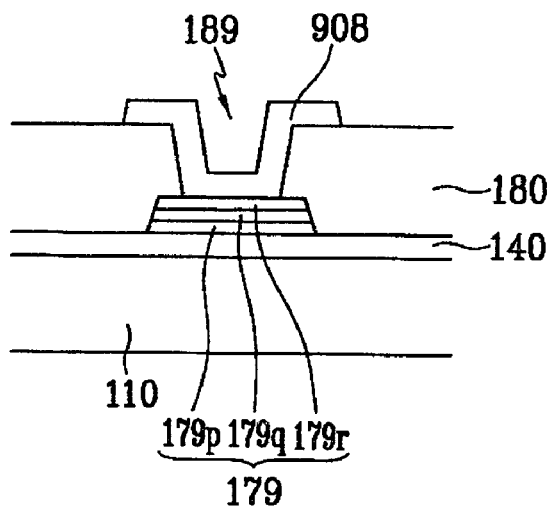

FIG. 17 is a layout view of a TFT array panel for an LCD according to another embodiment of the present invention. FIGS. 18 and 19 are sectional views of the TFT array panel shown in FIG. 17 that are taken along the line XVIII-XVIII' and the line XIX-XIX', respectively. FIGS. 20 and 21 are sectional views of the TFT array panel shown in FIG. 17 that are taken along the line XX-XX' and the line XXI-XXI', respectively.

A plurality of gate conductors that include a plurality of gate lines 121, including a plurality of first gate electrodes 124a and a plurality of second gate electrodes 124b, are formed on an insulating substrate 110 such as transparent glass.

The gate lines 121 transmitting gate signals extend substantially in a transverse direction and are separated from each other. The first gate electrodes 124a protrude upward. The gate lines 121 may extend to be connected to a driving circuit (not shown) integrated on the substrate 110, or it may have an end portion (not shown) having a large area for connection with another layer or an external driving circuit mounted on the substrate 110 or on another device such as a flexible printed circuit film (not shown) that may be attached to the substrate 110.

Each of the second gate electrodes 124b is separated from the gate lines 121 and includes a storage electrode 133 extending in a substantially transverse direction between two adjacent gate lines 121.

The gate lines 121, the first and second gate electrodes 124a and 124b, and the storage electrodes 133 have lower layers 124ap and 124bp and upper layers 124aq and 124bq. The lower layers 124ap and 124bp are made of aluminum (Al) or an aluminum alloy such as aluminum-neodymium (Al—Nd). The upper layers 124aq and 124bq are made of a molybdenum alloy (Mo-alloy: Mo—Nb, Mo—V, Mo—Ti), which is composed of molybdenum (Mo) and at least one of niobium (Nb), vanadium (V), and titanium (Ti).

The upper layers 124aq and 124bq of Mo-alloy may include 0.1 to 10 at % of the additives Nb, V, and Ti. It is more preferable that the upper layers 124aq and 124bq include 3 to 8 at % of the additives. When the content of the additives is increased, adhesiveness to other layers and chemical resistance of the upper layers 124aq and 124bq is improved, but resistivity of the upper layers 124aq and 124bq increases. Accordingly, the content of the additives has the above preferable range.

In addition, the lateral sides of the gate conductors 121 and 124b are inclined relative to a surface of the substrate 110, and the inclination angle thereof ranges from about 30-80 degrees.

A gate insulating layer 140, preferably made of silicon nitride (SiNx), is formed on the gate conductors 121 and 124b.

A plurality of semiconductor stripes 151 and islands 154b, preferably made of hydrogenated amorphous silicon (abbreviated to "a-Si") or polysilicon, are formed on the gate insulating layer 140. Each semiconductor stripe 151 extends substantially in a longitudinal direction and has a plurality of projections 154a branching out toward the first gate electrodes 124a. Each semiconductor island 154b crosses a second gate electrode 124b and includes a portion 157 overlapping the storage electrode 133 of the second gate electrode 124b.

A plurality of ohmic contact stripes 161 and ohmic contact islands 163b, 165a, and 165b, which are preferably made of silicide or n+ hydrogenated a-Si heavily doped with n type impurity such as phosphorous, are formed on the semiconductor stripes 151 and islands 154b. Each ohmic contact stripe 161 has a plurality of projections 163a, and the projections 163a and the ohmic contact islands 165a are located in pairs on the projections 154a of the semiconductor stripes 151. The ohmic contact islands 163b and 165b are located in pairs on the semiconductor islands 154b.

The lateral sides of the semiconductor stripes 151 and islands 154b and the ohmic contacts 161, 163b, 165b, and 165b are inclined relative to a surface of the substrate, and the inclination angles thereof are preferably in a range between about 30-80 degrees.

A plurality of data conductors including a plurality of data lines 171, a plurality of voltage transmission lines 172, and a plurality of first and second drain electrodes 175a and 175b are formed on the ohmic contacts 161, 163b, 165b, and 165b and the gate insulating layer 140.

The data lines 171 for transmitting data signals extend in a substantially longitudinal direction and intersect the gate lines 121. Each data line 171 includes a plurality of first source electrodes 173a and an end portion having a large area for contact with another layer or an external device. The data lines 171 may be directly connected to a data driving circuit for generating the gate signals, which may be integrated onto the substrate 110.

The voltage transmission lines 172 for transmitting driving voltages extend in a substantially longitudinal direction and intersect the gate lines 121. Each voltage transmission line 172 includes a plurality of second source electrodes 173b. The voltage transmission lines 172 may be connected to each other. The voltage transmission lines 172 overlap the storage region 157 of the semiconductor islands 154b.

The first and the second drain electrodes 175a and 175b are separated from the data lines 171 and the voltage transmission lines 172, and from each other. Each pair of the first source electrodes 173a and the first drain electrodes 175a are disposed opposite each other with respect to a first gate electrode 124a, and each pair of the second source electrodes 173b and the second drain electrodes 175b are disposed opposite each other with respect to a second gate electrode 124b.

A first gate electrode 124a, a first source electrode 173a, and a first drain electrode 175a, along with a projection 154a of a semiconductor stripe 151, form a switching TFT having a channel formed in the projection 154a disposed between the first source electrode 173a and the first drain electrode 175a. Meanwhile, a second gate electrode 124b, a second source electrode 173b, and a second drain electrode 175b, along with a semiconductor island 154b, form a driving TFT having a channel formed in the semiconductor island 154b disposed between the second source electrode 173b and the second drain electrode 175b.

The data conductors 171, 172, 175a, and 175b preferably have first layers 171p, 172p, 175ap and 175bp, second layers 171q, 172q, 175aq and 175bq, and third layers 171r, 172r, 175ar and 175br. The first layers 171p, 172p, 175ap, and 175bp and third layers 171r, 172r, 175ar, and 175br are respectively disposed at lower and upper sides of the second layers 171q, 172q, 175aq, and 175bq. The first layers 171p, 172p, 175ap, and 175bp and the third layers 171r, 172r, 175ar, and 175br are made of a molybdenum alloy (Mo-alloy), which is composed of molybdenum (Mo) and at least one of 15 niobium (Nb), vanadium (V), and titanium (Ti). Here, the first layers 171p, 172p, 175ap, and 175bp and the third layers 171r, 172r, 175ar, and 175br of Mo-alloy may include 0.1 to 10 at % of the additives Nb, V, and Ti. It is preferable that the first layers 171p, 172p, 175ap, and 175bp and the third layers 171r, 172r, 175ar, and 175br include 3 to 8 at % of the additives. When the content of the additives is increased, adhesiveness to other layers and chemical resistance of the first layers 171p, 172p, 175ap, and 175bp and the third layers 171r, 172r, 175ar, and 175br is improved but resistivity of the first layers 171p, 172p, 175ap, and 175bp and the third layers 171r, 172r, 175ar, and 175br increases. Accordingly, the content of the additives has the above-described preferable range.

A Mo-alloy, containing a predetermined amount of Nb, V, or Ti which make an isomorphous solid solution with Mo, has better chemical resistance (slow etch speed) and less difference of chemical resistance with the lower layer of Al or Al alloy than Mo itself. As the difference of chemical resistance between the first and the third layers 171p, 172p, 175ap, and 175bp and 171r, 172r, 175ar, and 175br and the second layers 171q, 172q, 175aq, and 175bq is reduced, undercut, overhang, and mouse bites, which may arise in an etching process, are prevented.

Like the gate conductors 121 and 124b, the data conductors 171, 172, 175a, and 175b have tapered lateral sides relative to the surface of the substrate 110, and the inclination angles thereof range from about 30-80 degrees.

The ohmic contacts 161, 163b, 165b, and 165b are interposed only between the underlying semiconductor stripes 151 and islands 154b and the overlying data conductors 171, 172, 175a, and 175b thereon, and reduce the contact resistance therebetween. The semiconductor stripes 151 include a plurality of exposed portions that are not covered with the data conductors 171, 172, 175a, and 175b.

Most of the semiconductor stripe 151 is narrower than the data line 171, but the width of the semiconductor stripe 151 broadens near a place where the semiconductor stripe 151 and the gate line 121 meet each other in order to prevent disconnection of the data line 171, as mentioned in the above.

A passivation layer 180 is formed on the data conductors 171, 172, 175a, and 175b and the exposed portions of the semiconductor stripes 151 and islands 154b. The passivation layer 180 is preferably made of an inorganic material, such as silicon nitride or silicon oxide, a photosensitive organic material having good planarity, or a low dielectric insulating material having a dielectric constant lower than 4.0, such as a-Si:C:O and a-Si:O:F, formed by plasma enhanced chemical vapor deposition (PECVD). The passivation layer 180 may include a lower film of inorganic insulator and an upper film of organic insulator.

The passivation layer 180 has a plurality of contact holes 185, 183, 181, 182, and 189 exposing portions of the first drain electrode 175a, a second gate electrode 124b, the second drain electrode 175b, and the end portions 125 and 179 of the gate line 121 and the data line 171, respectively.

The contact holes 182 and 189 expose the end portions 125 and 179 of the gate line 121 and the data line 171 to connect them with external driving circuits. Anisotropic conductive films are disposed between the output terminals of the external driving circuit and the end portions 125 and 175 to assist electrical connection and physical adhesion. However, when driving circuits are directly fabricated on the substrate 110, contact holes are not formed. When gate driving circuits are directly fabricated on the substrate 110 and data driving circuits are formed as separate chips, only contact hole 189 exposing the end portion 179 of the data line 171 is formed.

A plurality of pixel electrodes 901, a plurality of connecting members 902, and a plurality of contact assistants 906 and 908 are formed on the passivation layer 180.

The pixel electrodes 901 are connected to the second drain electrodes 175b through the contact holes 185. The connecting member 902 connects the first drain electrode 175a and the second gate electrode 124b through the contact holes 181 and 183. The contact assistants 906 and 908 are connected to the end portions 906 and 908 of the gate line 121 and the data line 171 through the contact holes 182 and 189, respectively.

The pixel electrode 901, the connecting member 902, and the contact assistants 906 and 908 are made of a transparent conductor such as ITO or IZO.

A partition 803, an auxiliary electrode 272, a plurality of light emitting members 70, and a common electrode 270 are formed on the passivation layer 180, and the pixel electrodes 901.

The partition 803 is made of an organic or inorganic insulating material and forms frames of organic light emitting cells. The partition 803 is formed along boundaries of the pixel electrodes 901 and defines a space for filling with an organic light emitting material.

The light emitting member 70 is disposed on the pixel electrode 901 and surrounded by the partition 803. The light emitting member 70 is made of one light emitting material that emits red, green, or blue light. Red, green, and blue light emitting members 70 are sequentially and repeatedly placed.

The auxiliary electrode 272 has substantially the same planar pattern with the partition 803. The auxiliary electrode 272 has contact with the common electrode 270 to reduce resistance of the common electrode 270.

The common electrode 270 is formed on the partition 803, the auxiliary electrode 272, and the light emitting member 70. The common electrode 270 is made of a metal such as Al, which has low resistivity. This embodiment illustrates a back emitting OLED. However, when a front emitting OLED or dual side emitting OLED is considered, the common electrode 270 is made of a transparent conductor such as ITO or IZO.

A method of manufacturing the TFT array panel shown in FIGS. 17-21 according to an embodiment of the present invention will be now described in detail with reference to FIGS. 22 to 33B as well as FIGS. 17-21.

Figure 22:
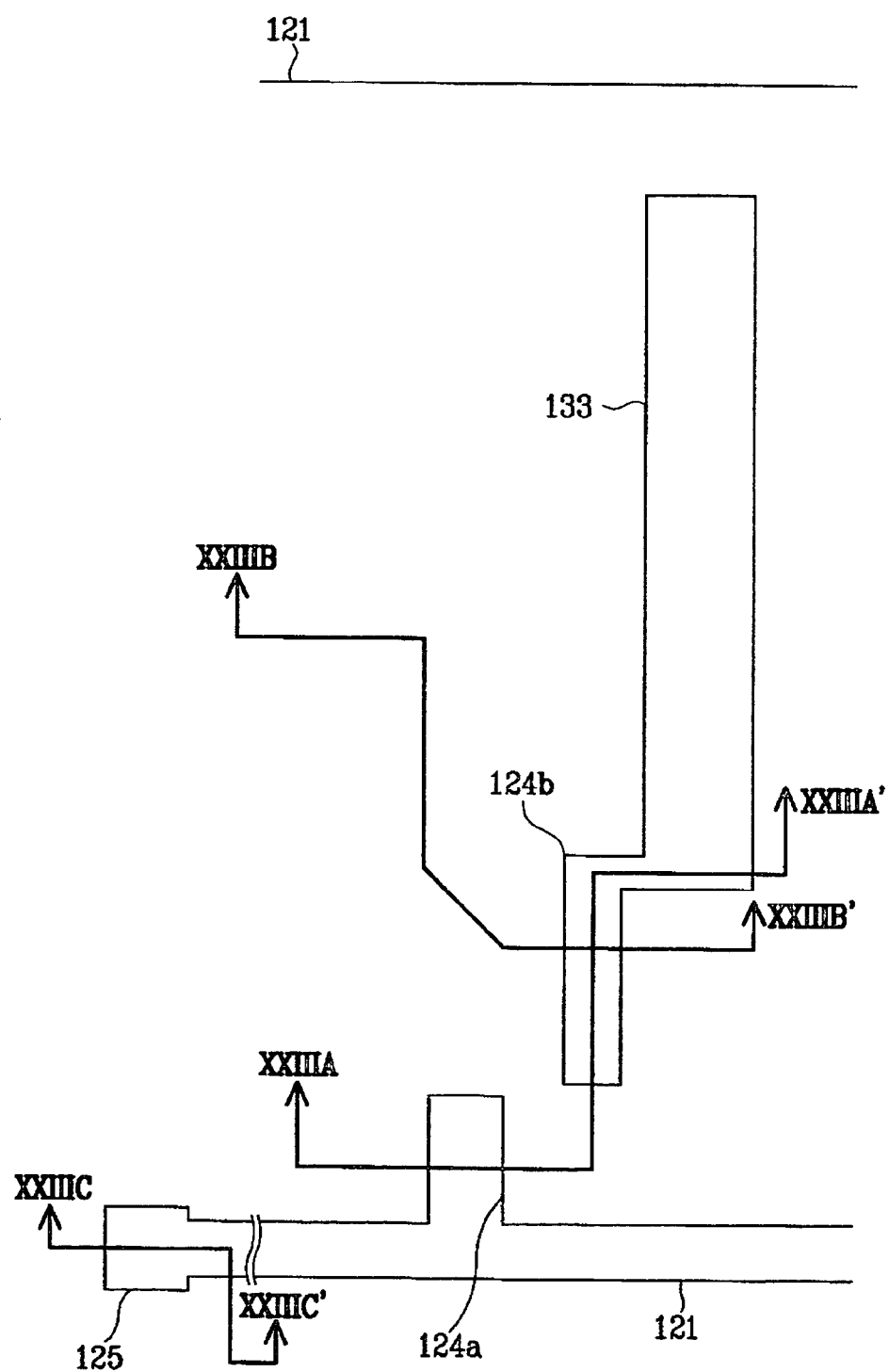
FIGS. 22, 24, 26, 28, 30, 32, and 34 are layout views of the TFT array panel shown in FIGS. 17 to 21 in intermediate steps of a manufacturing method according to an embodiment of the present invention.
Figure 23A:
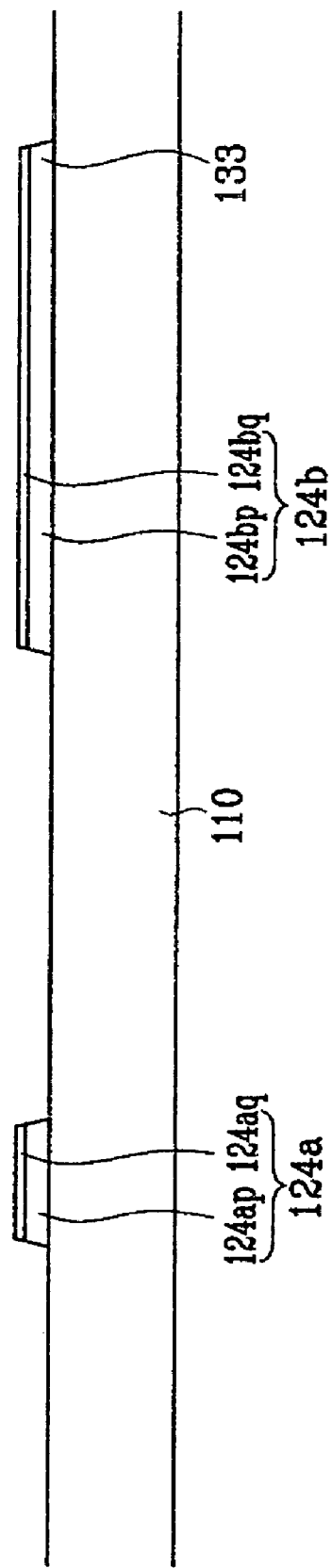
FIGS. 23A, 23B, and 23C are sectional views of the TFT array panel shown in FIG. 22 taken along the lines XXIIIa-XXIIIa', XXIIIb-XXIIIb', and XXIIIc-XXIIIc'.
Figure 23B:
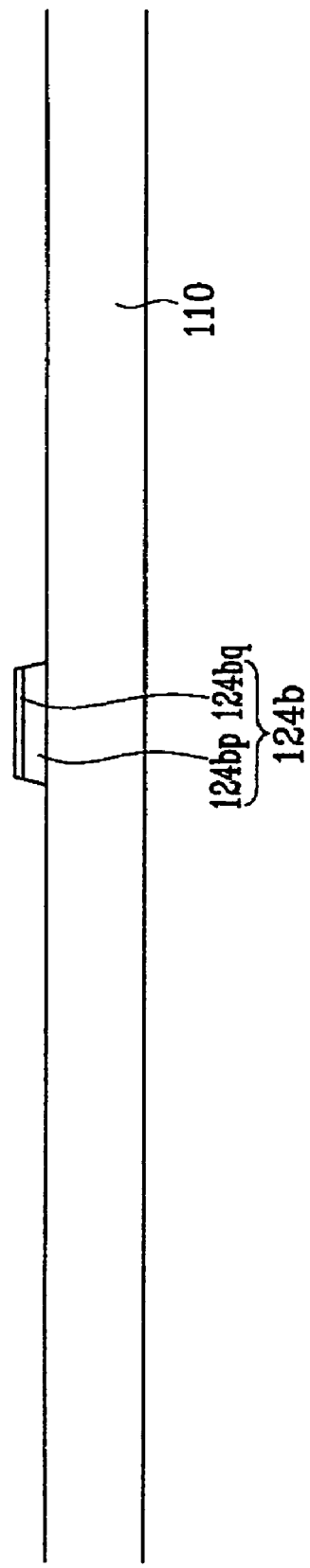
Figure 23C:
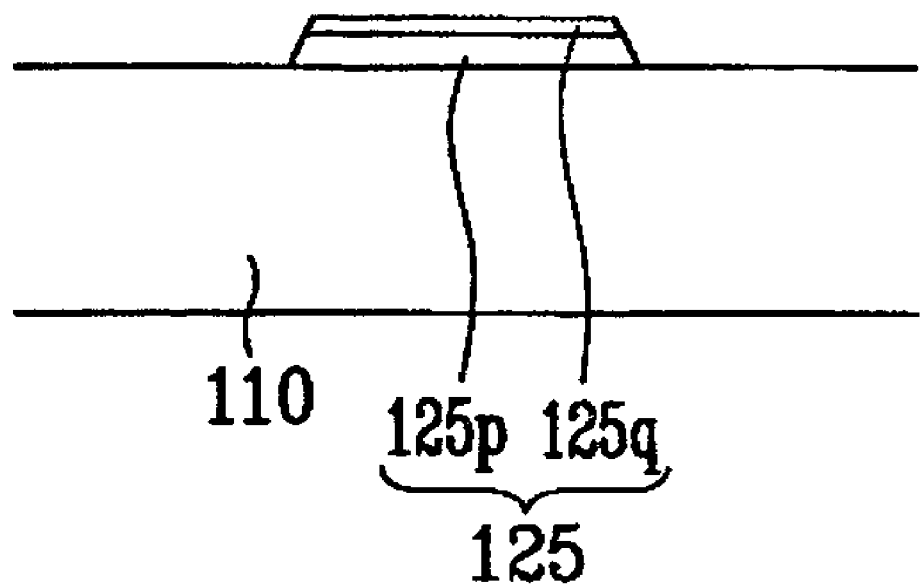
Figure 33A:
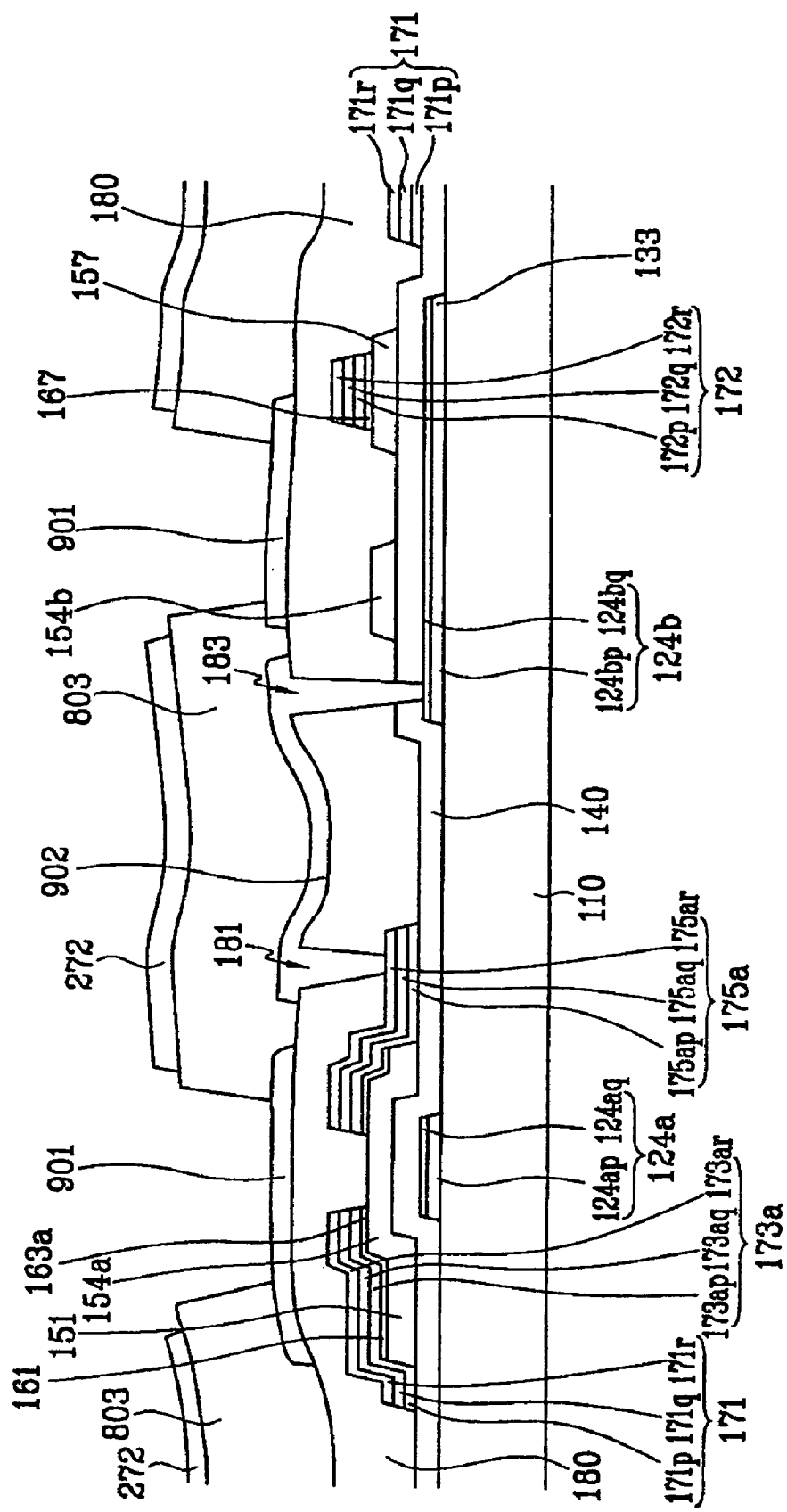
FIGS. 33A and 33B are sectional views of the TFT array panel shown in FIG. 32 taken along the lines XXXIIIa-XXXIIIa' and XXXIIIb-XXXIIIb'.
Figure 33B:
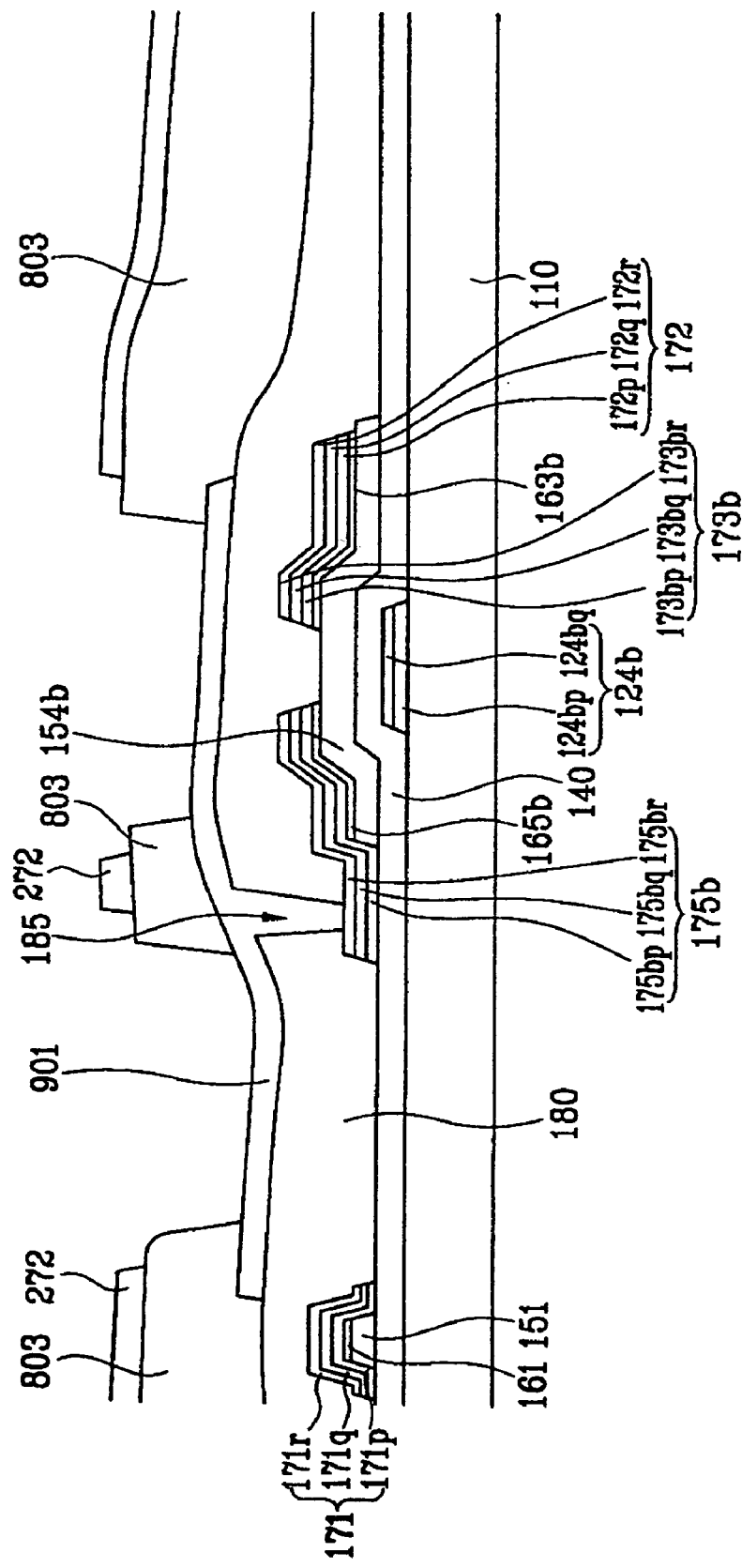
Figure 34:
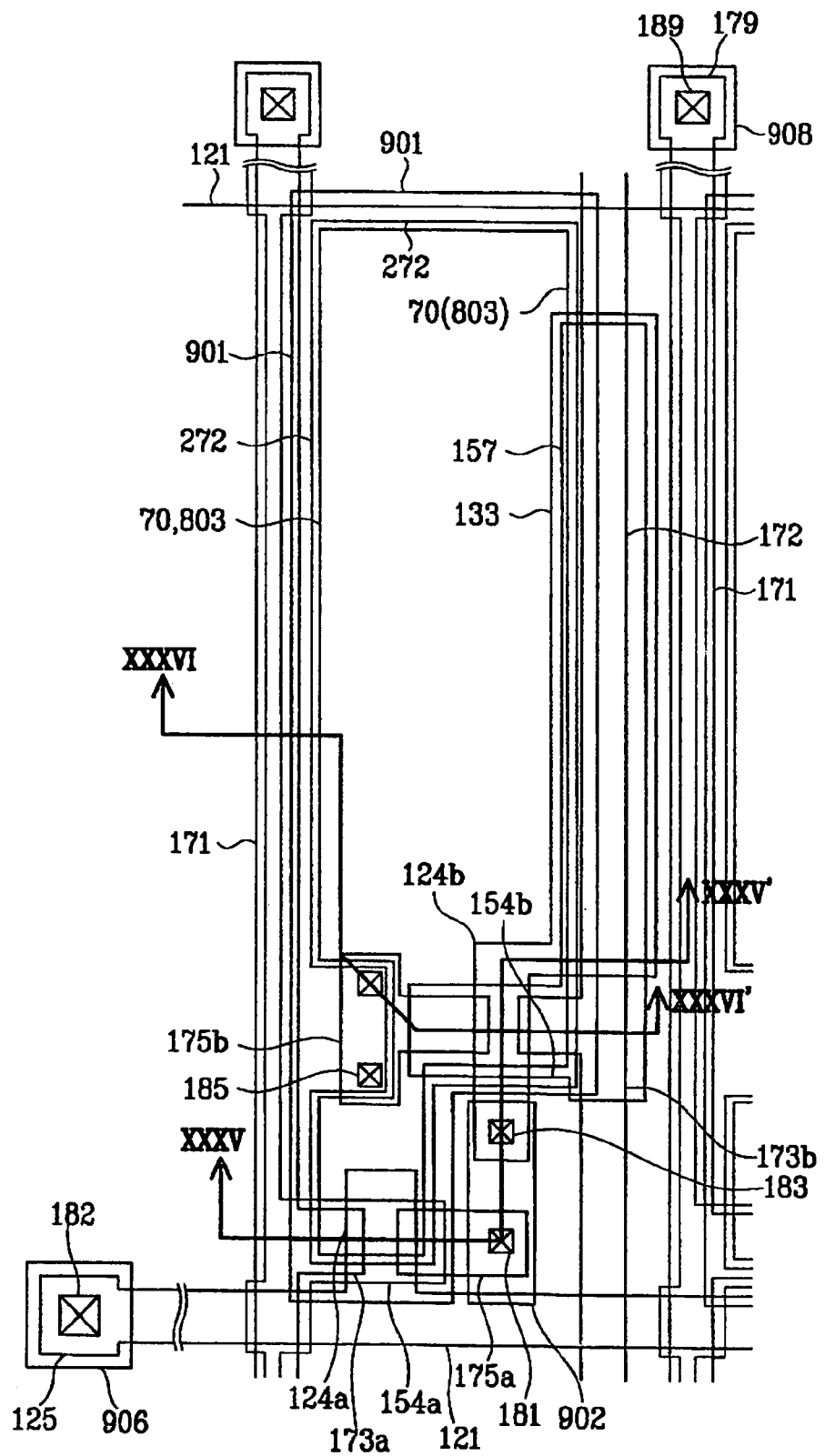
Figure 35:
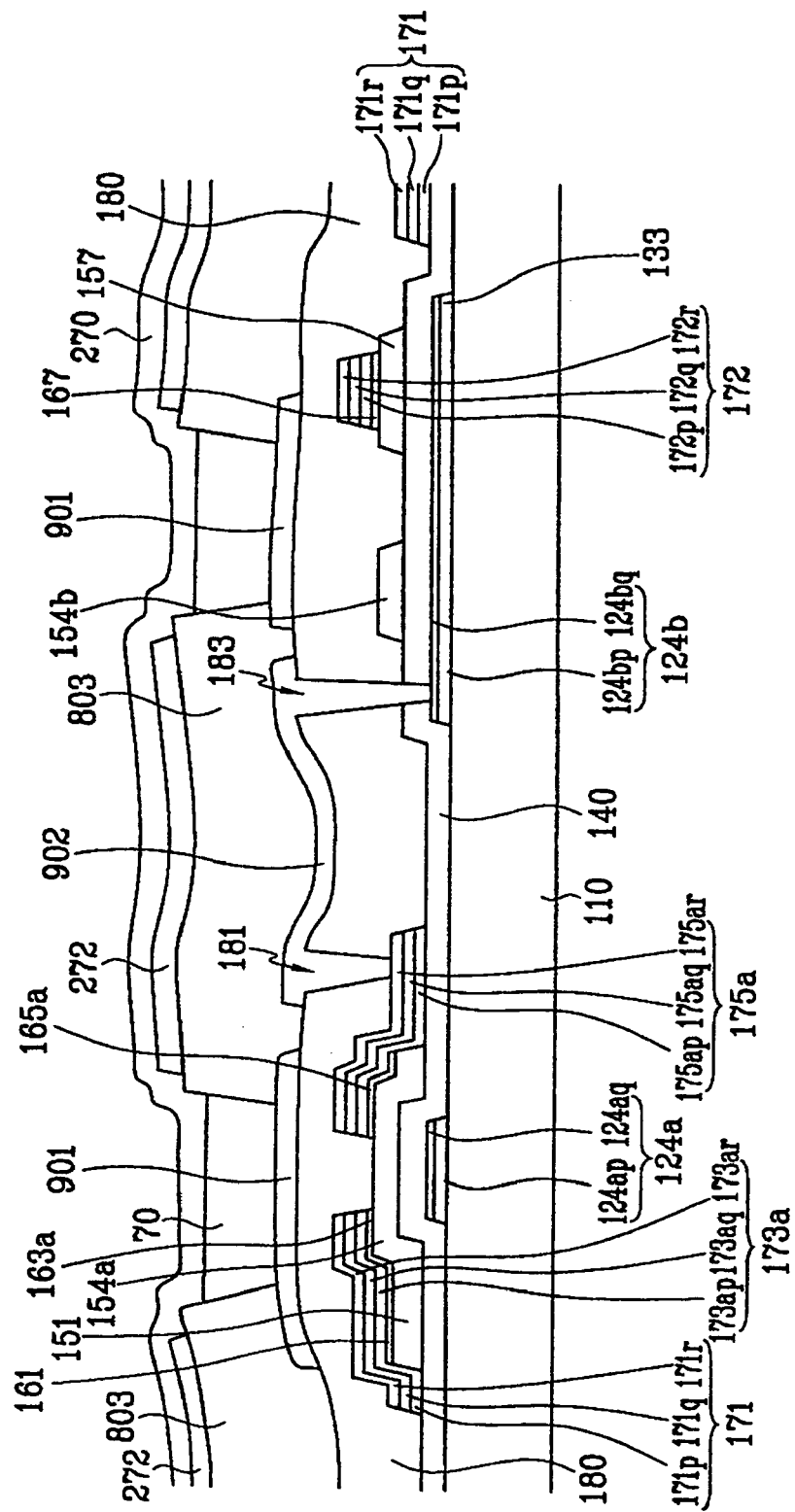
FIGS. 35 and 36 are sectional views of the TFT array panel shown in FIG. 34 taken along the lines XXXV-XXXV' and XXXVI-XXXVI'.
Figure 36:
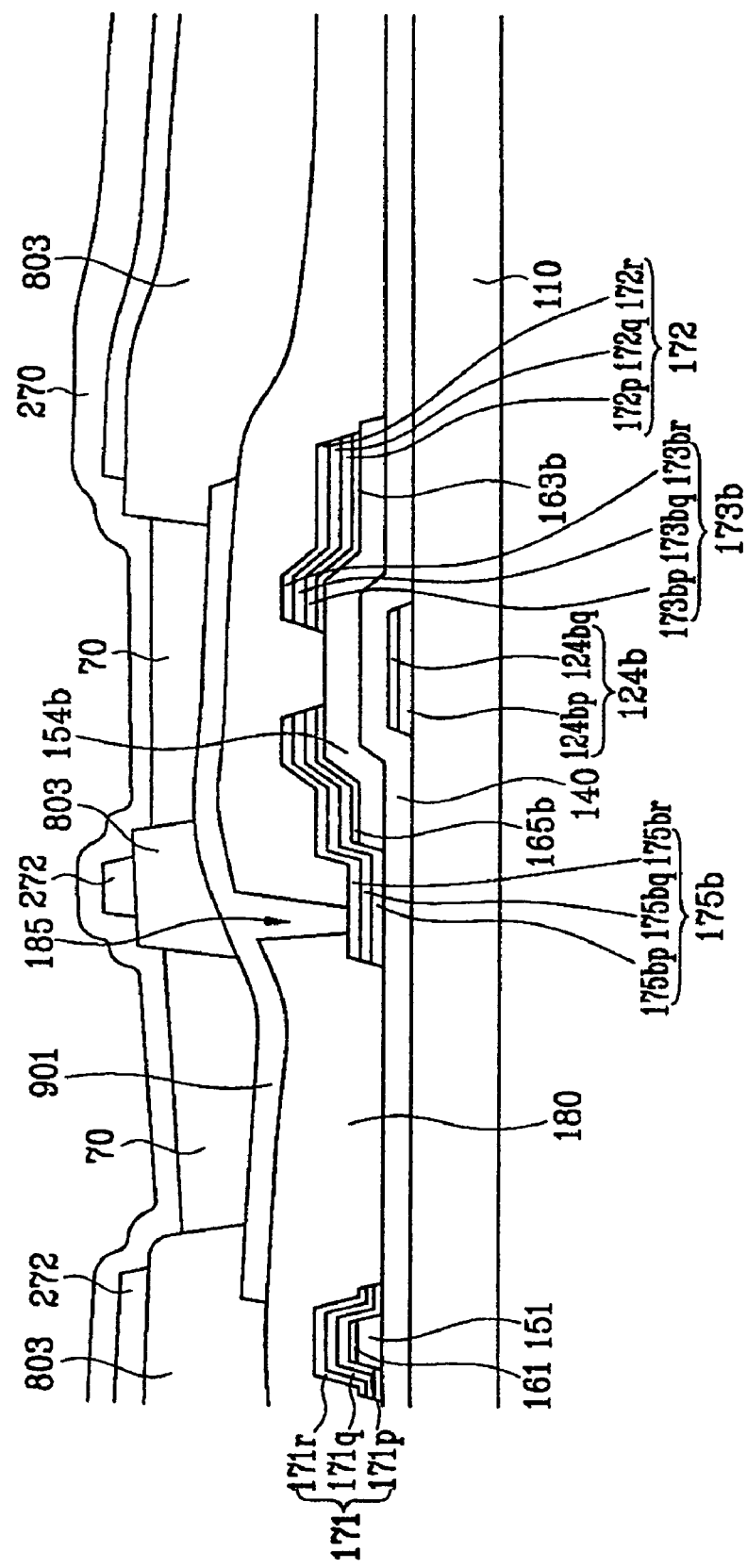
Figure 37:
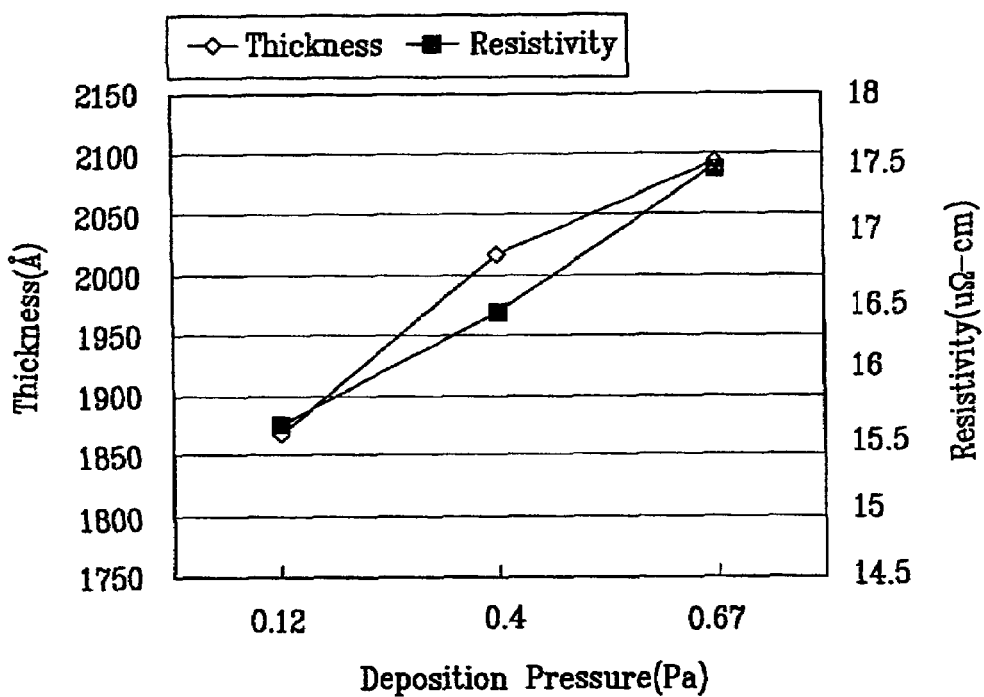
FIG. 37 is a graph illustrating variation of resistivity according to deposition pressure of Mo—Nb.

FIGS. 22, 24, 26, 28, 30, 32, and 34 are layout views of the TFT array panel shown in FIGS. 17 to 21 in intermediate steps of a manufacturing method according to an embodiment of the present invention;

FIGS. 23A, 23B, and 23C are sectional views of the TFT array panel shown in FIG. 22 taken along the lines XXIIIa-XXIIIa', XXIIIb-XXIIIb', and XXIIIc-XXIIIc'. FIGS. 25A, 25B, and 25C are sectional views of the TFT array panel shown in FIG. 24 taken along the lines XXVa-XXVa', XXVb-XXVb', and XXVc-XXVc'. FIGS. 27A, 27B, 27C, and 27D are sectional views of the TFT array panel shown in FIG. 26 taken along the lines XXVIIa-XXVIIa', XXVIIb-XXVIIb', XXVIIc-XXVIIc', and XXVIId-XXVIId'. FIGS. 29A, 29B, 29C, and 29D are sectional views of the TFT array panel shown in FIG. 28 taken along the lines XXIXa-XXIXa', XXIXb-XXIXb', XXIXc-XXIXc', and XXIXd-XXIXd'. FIGS. 31A, 31B, 31C, and 31D are sectional views of the TFT array panel shown in FIG. 30 taken along the lines XXXIa-XXXIa', XXXIb-XXXIb', XXXIc-XXXIc', and XXXId-XXXId'. FIGS. 33A and 33B are sectional views of the TFT array panel shown in FIG. 32 taken along the lines XXXIIIa-XXXIIIa' and XXXIIIb-XXXIIIb'.

First, as shown in FIGS. 22 to 23C, a gate metal layer is deposited on a substrate. The metal layer is deposited by a Co-sputtering. Two targets are installed in a same sputtering chamber for the Co-sputtering. One target is made of Al or Al—Nd. The other target is made of a molybdenum alloy (Mo-alloy), which is composed of molybdenum (Mo) and at least one of niobium (Nb), vanadium (V), and titanium (Ti). Here, the Al—Nd target preferably contains 2 at % of Nd. The Mo-alloy target may include 0.1 to 10 at % of the additives Nb, V, and Ti, and more preferably includes 3 to 8 at % of the additives. When the content of the additives is increased, adhesiveness to other layers and chemical resistance is improved, but resistivity increases. Accordingly, the content of the additives has the above-described preferable range.

The Co-sputtering process is performed as follows.

At first, power is applied to the Al (or Al—Nd) target while no power is applied to the Mo-alloy target to deposit a lower layer of Al (or Al—Nd). The thickness of the lower layer is preferably 2,500 Å.

Next, power is switched to be applied to the Mo-alloy target and not to be applied to the Al (or Al—Nd) target to deposit an upper layer.

The upper and lower layers are simultaneously etched to form a plurality of gate lines 121 having a plurality of first gate electrodes 124a, a plurality second electrodes 124b, and storage electrodes 133. Here, the upper and lower layers are preferably etched by an etchant containing phosphoric acid, nitric acid, acetic acid, and deionized water. Precisely, the etchant may include 63% to 70% of phosphoric acid, 4% to 8% of nitric acid, 8% to 11% of acetic acid, and deionized water for the residual quantity. The etchant may include more acetic acid by about 4% to 8%.

Figure 24:
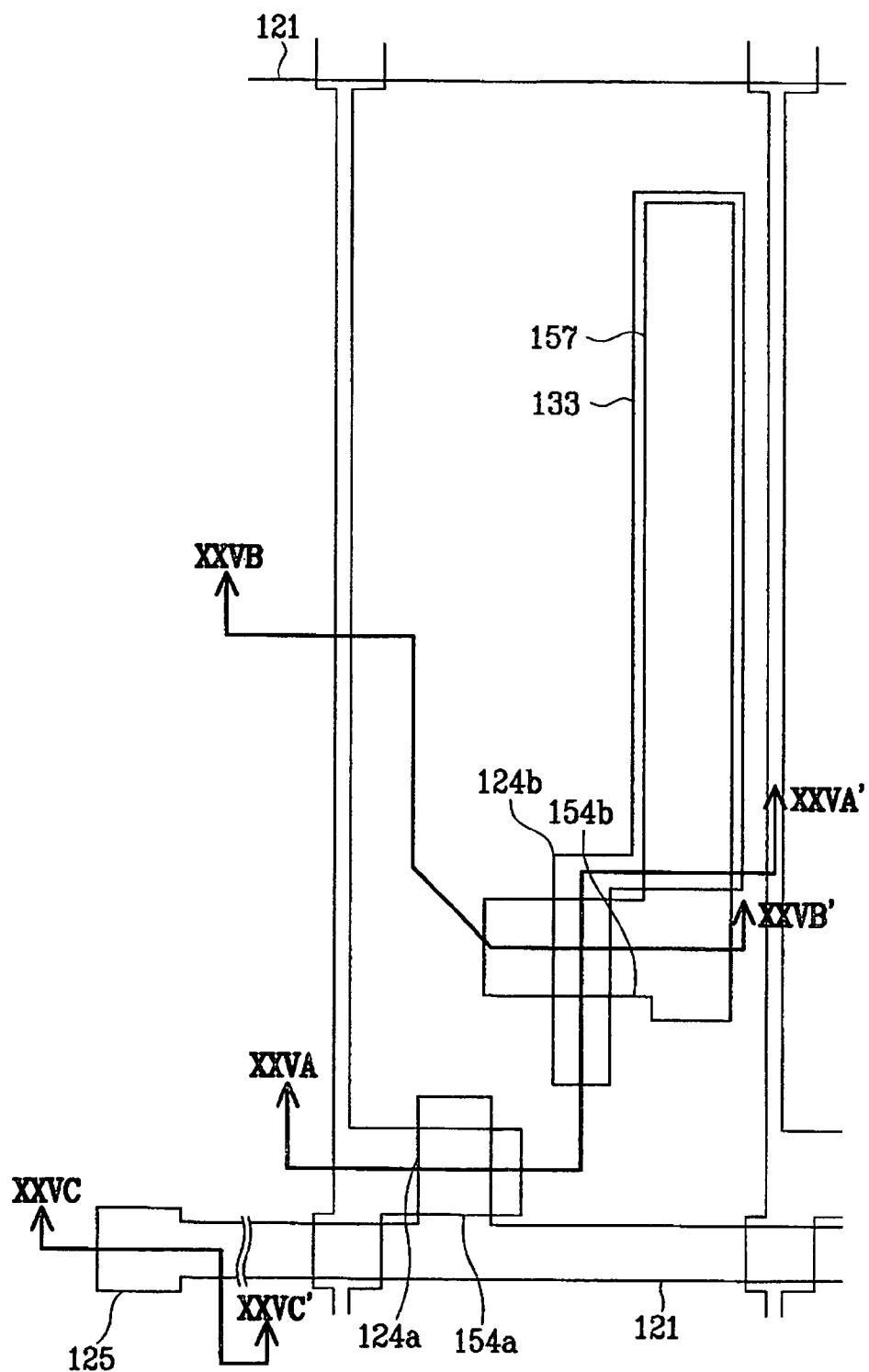
Figure 25A:
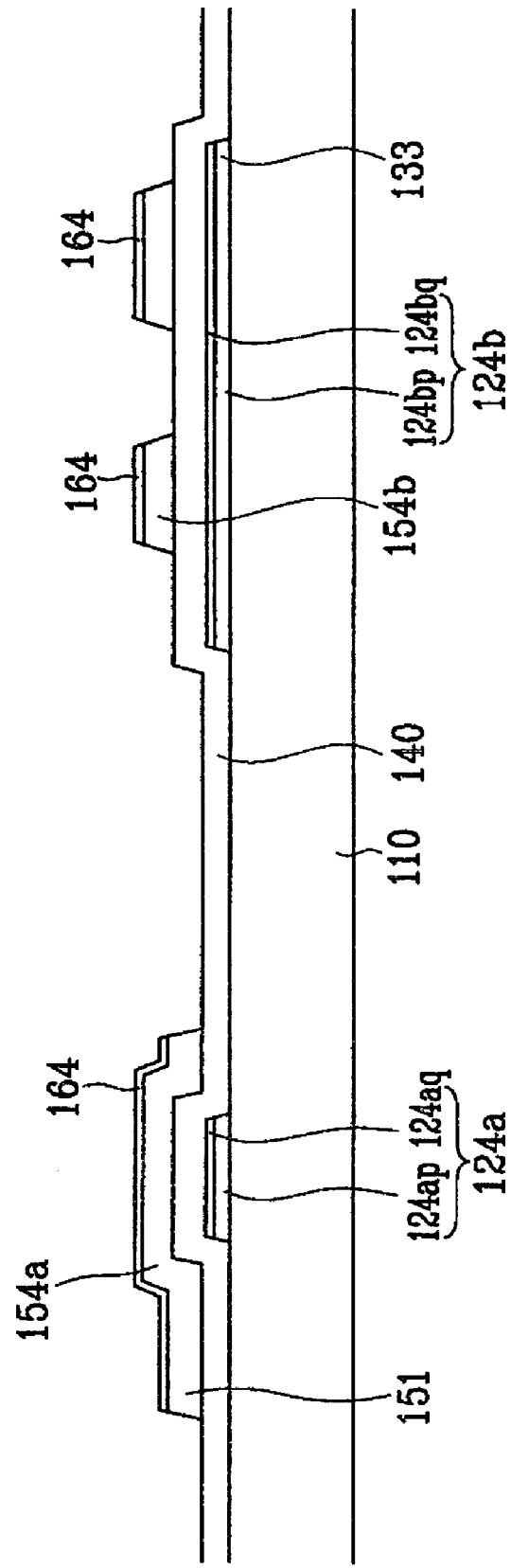
Figure 25C:
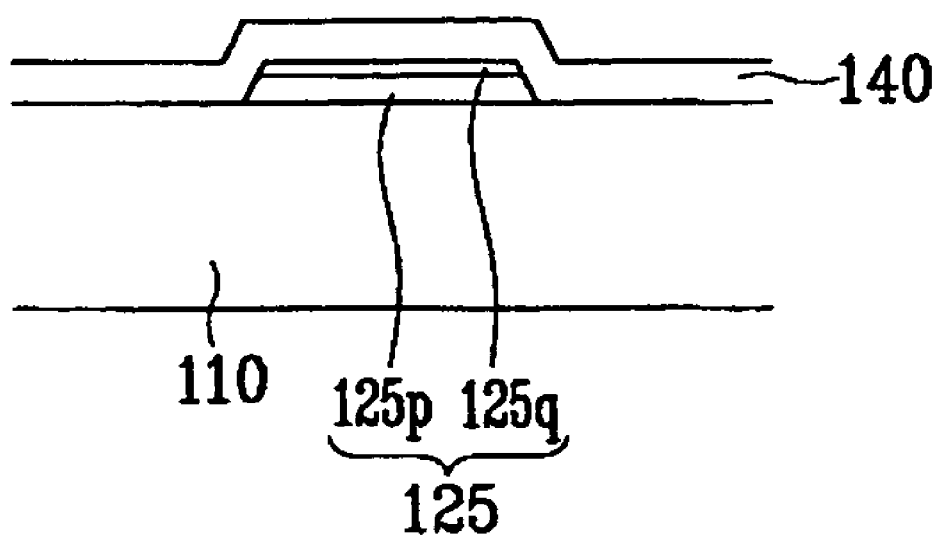

Referring to FIGS. 24-25B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 and islands 154b including projections 154a on the gate insulating layer 140. The gate insulating layer 140 is preferably made of silicon nitride with a thickness of about 2,000 Å to about 5,000 Å, and the deposition temperature is preferably in a range of about 250° C.-500° C.

Figure 26:
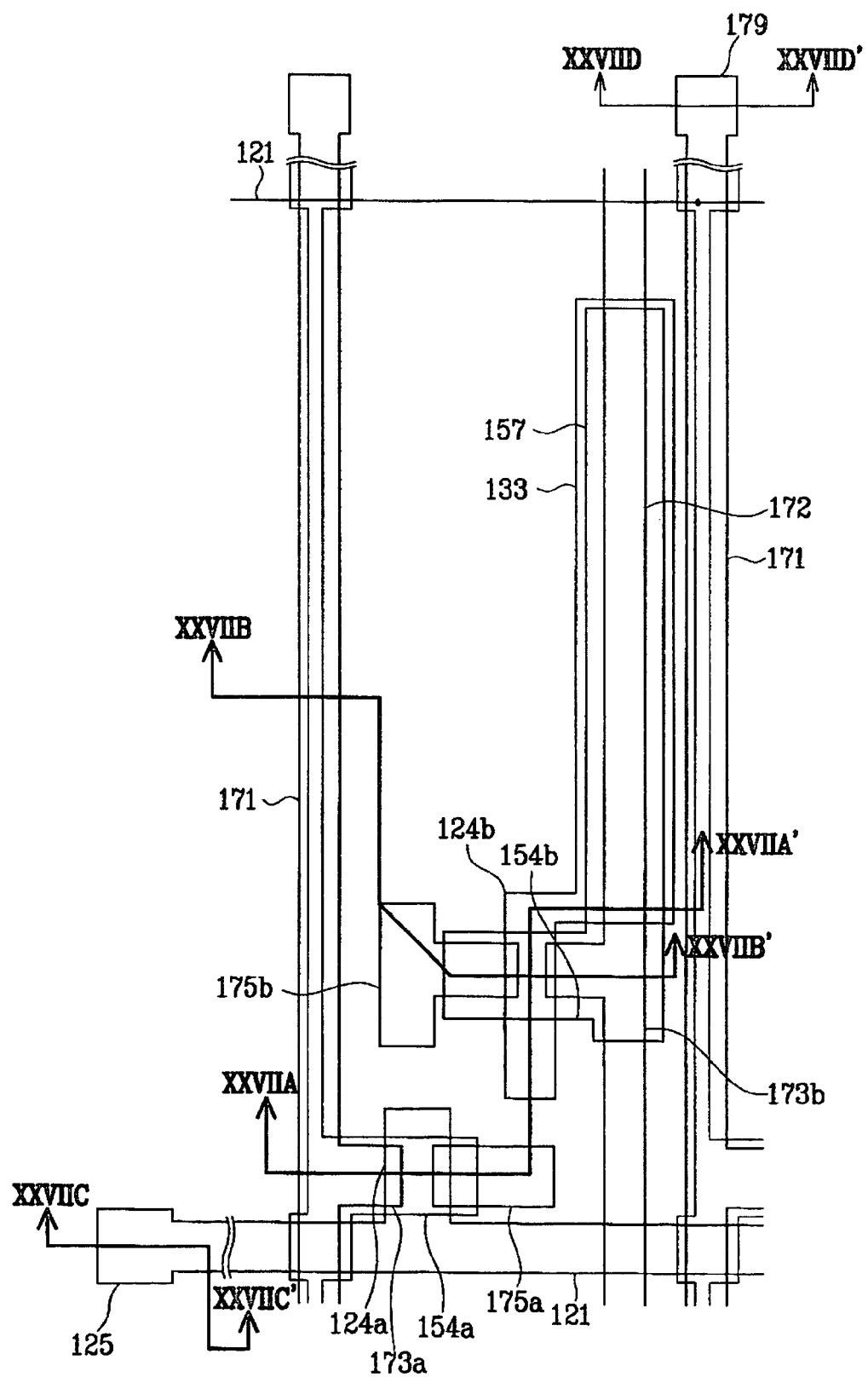
Figure 27B:
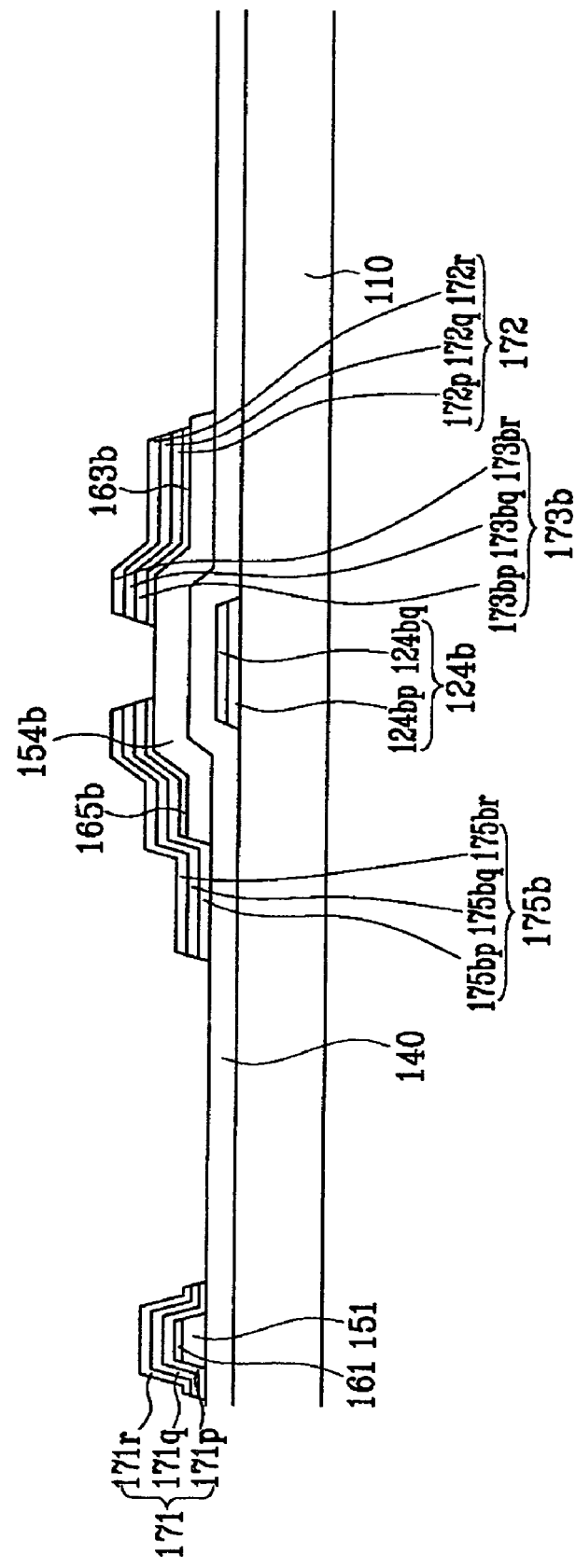
Figure 27C:
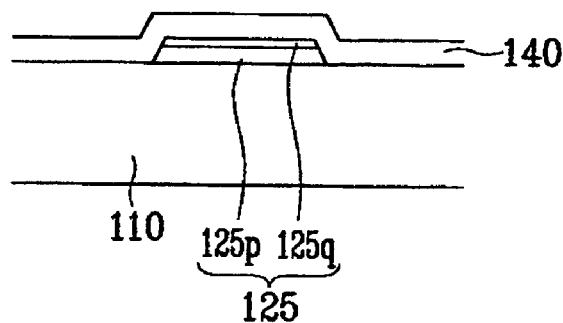
Figure 27D:
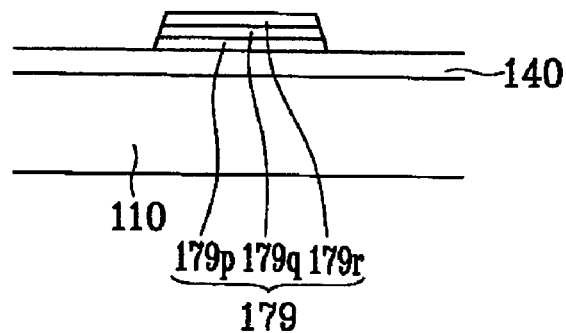

Referring to FIGS. 26-27D, a first layer of Mo-alloy, a second layer of Al (or Al-alloy), and a third layer of Mo-alloy are sequentially deposited on the extrinsic semiconductor stripes 164 by a Co-sputtering. The first and third layers are made of a molybdenum alloy (Mo-alloy), which is composed of molybdenum (Mo) and at least one of niobium (Nb), vanadium (V), and titanium (Ti). The three layers are etched using a photoresist (not shown) to form a plurality of data conductors that includes a plurality of data lines 171 including first source electrodes 173a, a plurality of voltage transmission lines 172 including second source electrodes 173b, and a plurality of first and second drain electrodes 175a and 175b.

Before or after removing the photoresist, portions of the extrinsic semiconductor stripes 164, which are not covered with the data conductors 171, 172, 175a, and 175b, are removed by etching to complete a plurality of ohmic contact stripes 161 including projections 163a and a plurality of ohmic contact islands 163b, 165a, and 165b, and to expose portions of the intrinsic semiconductor stripes 151 and islands 154b.

Oxygen plasma treatment may follow thereafter in order to stabilize the exposed surfaces of the semiconductor stripes 151.

Figure 28:
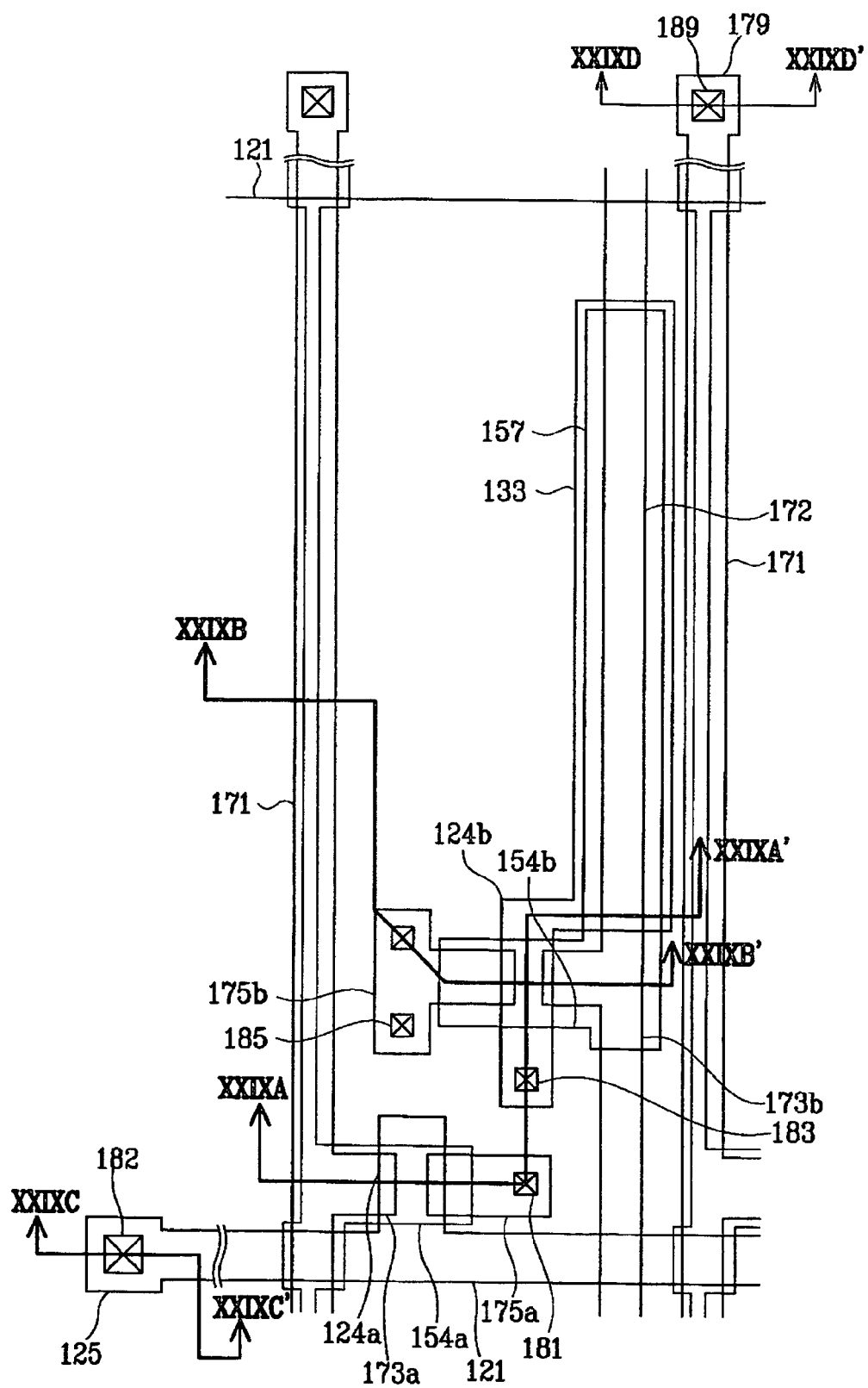
Figure 29A:
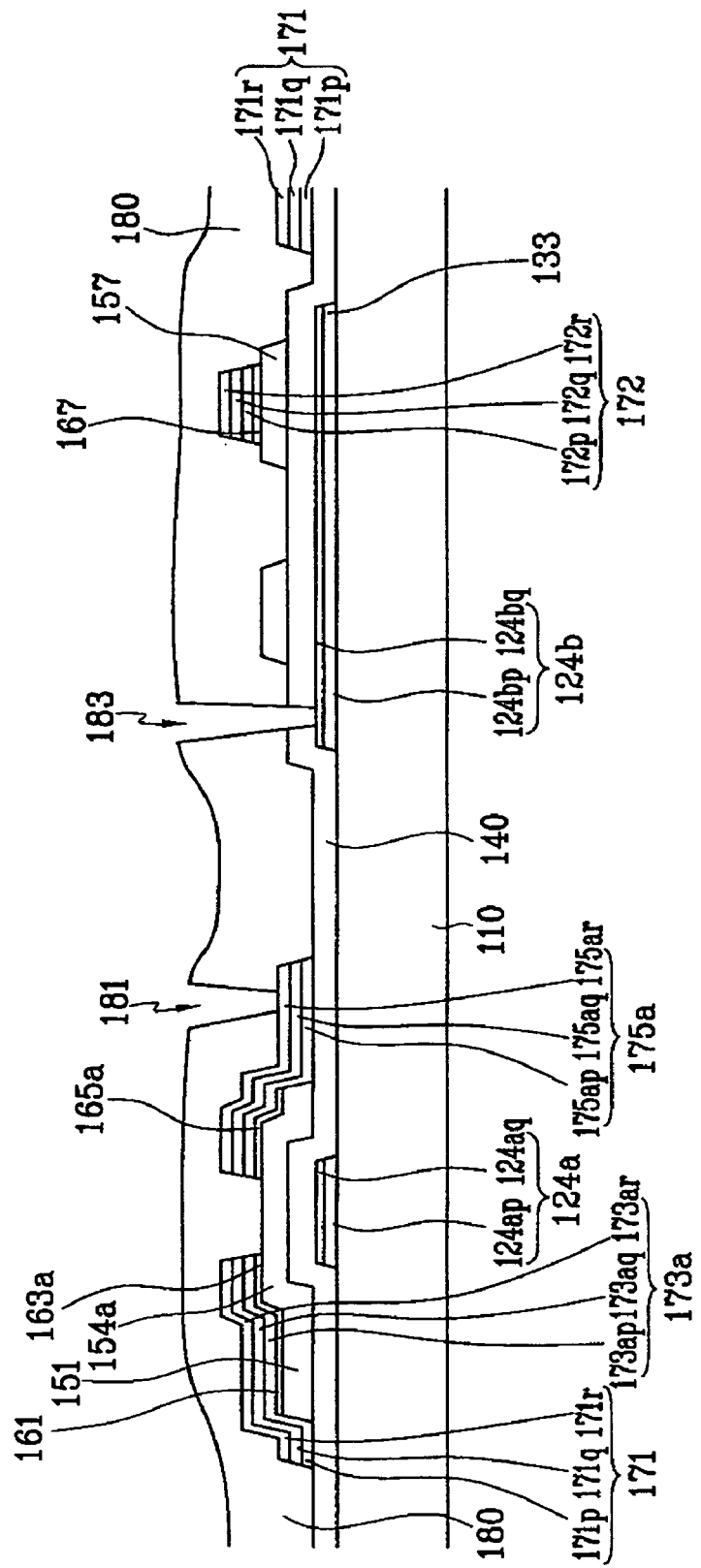
FIGS. 29A, 29B, 29C, and 29D are sectional views of the TFT array panel shown in FIG. 28 taken along the lines XXIXa-XXIXa', XXIXb-XXIXb', XXIXc-XXIXc', and XXIXd-XXIXd'.
Figure 29B:
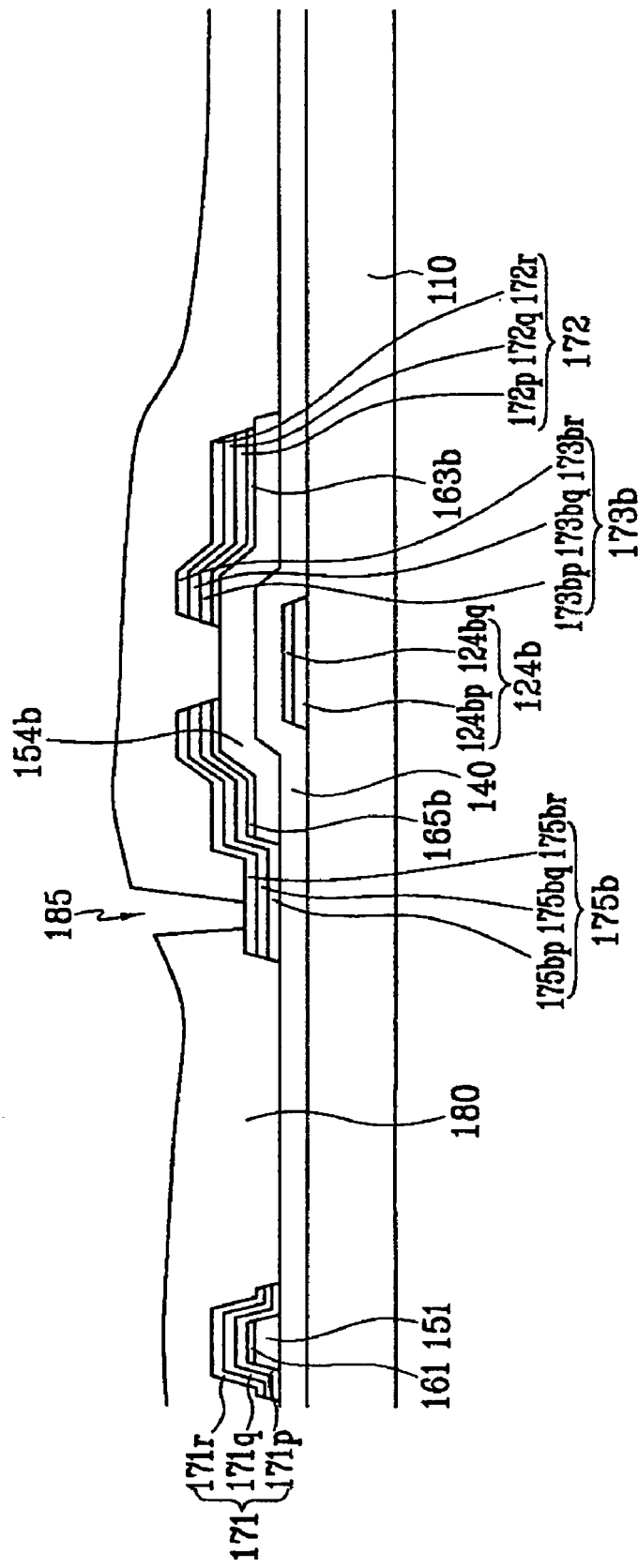
Figure 29C:
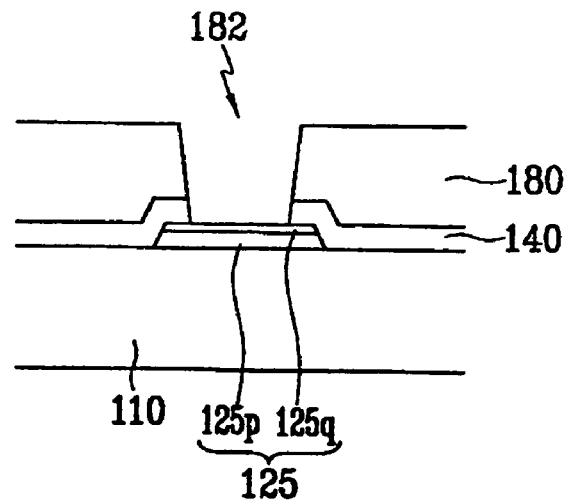
Figure 29D:
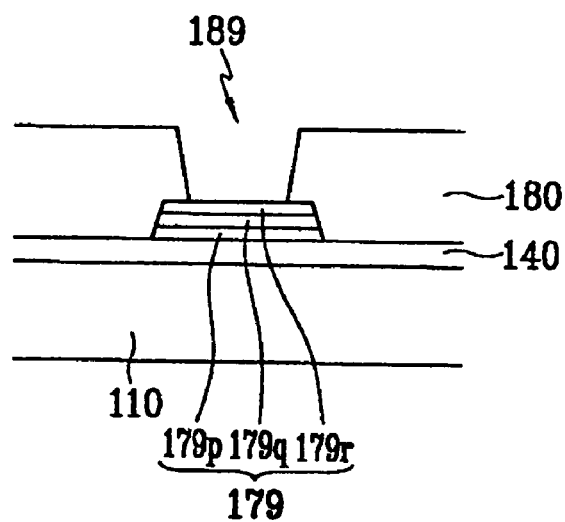
Figure 30:
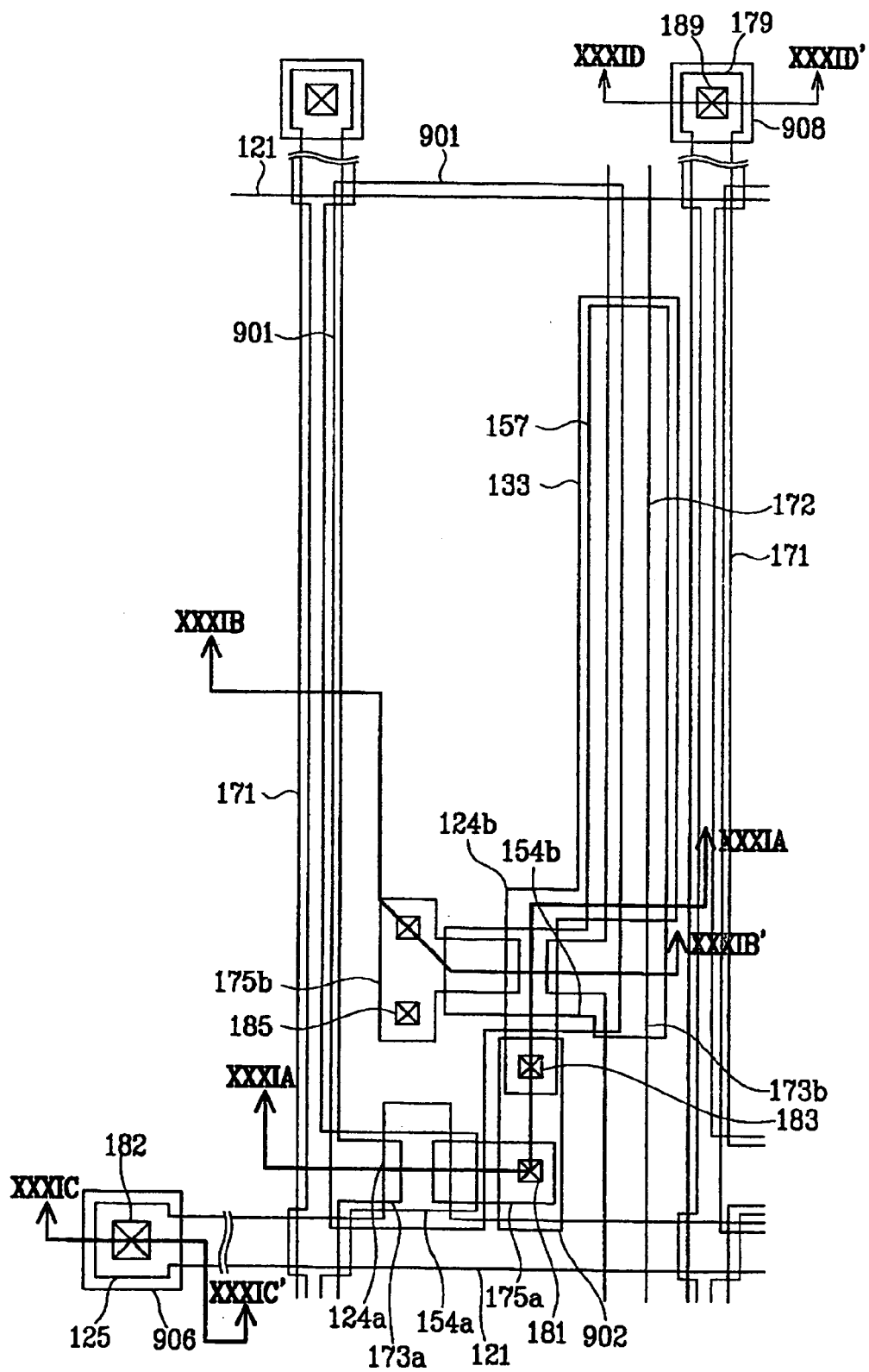
Figure 31A:
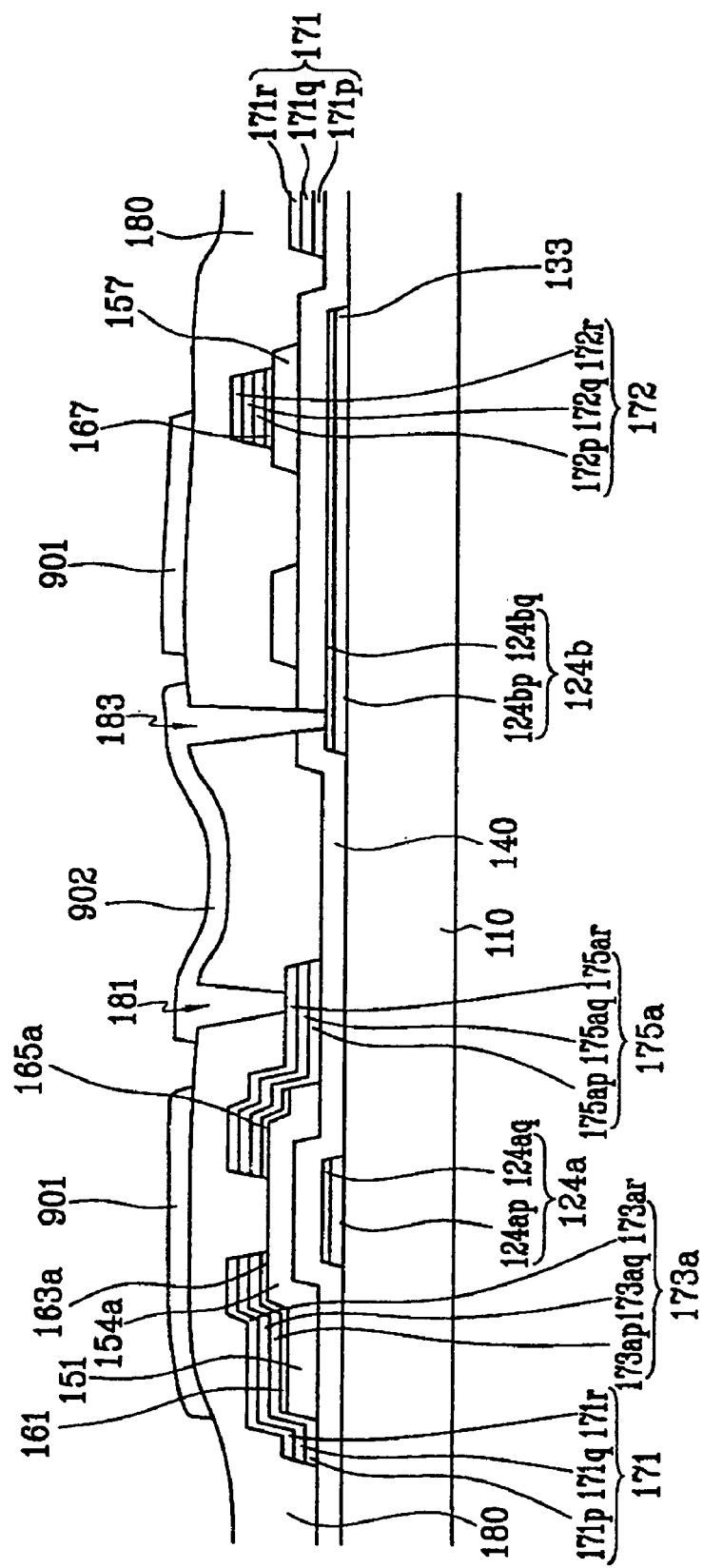
FIGS. 31A, 31B, 31C, and 31D are sectional views of the TFT array panel shown in FIG. 30 taken along the lines XXXIa-XXXIa', XXXIb-XXXIb', XXXIc-XXXIc', and XXXId-XXXId'.
Figure 31B:
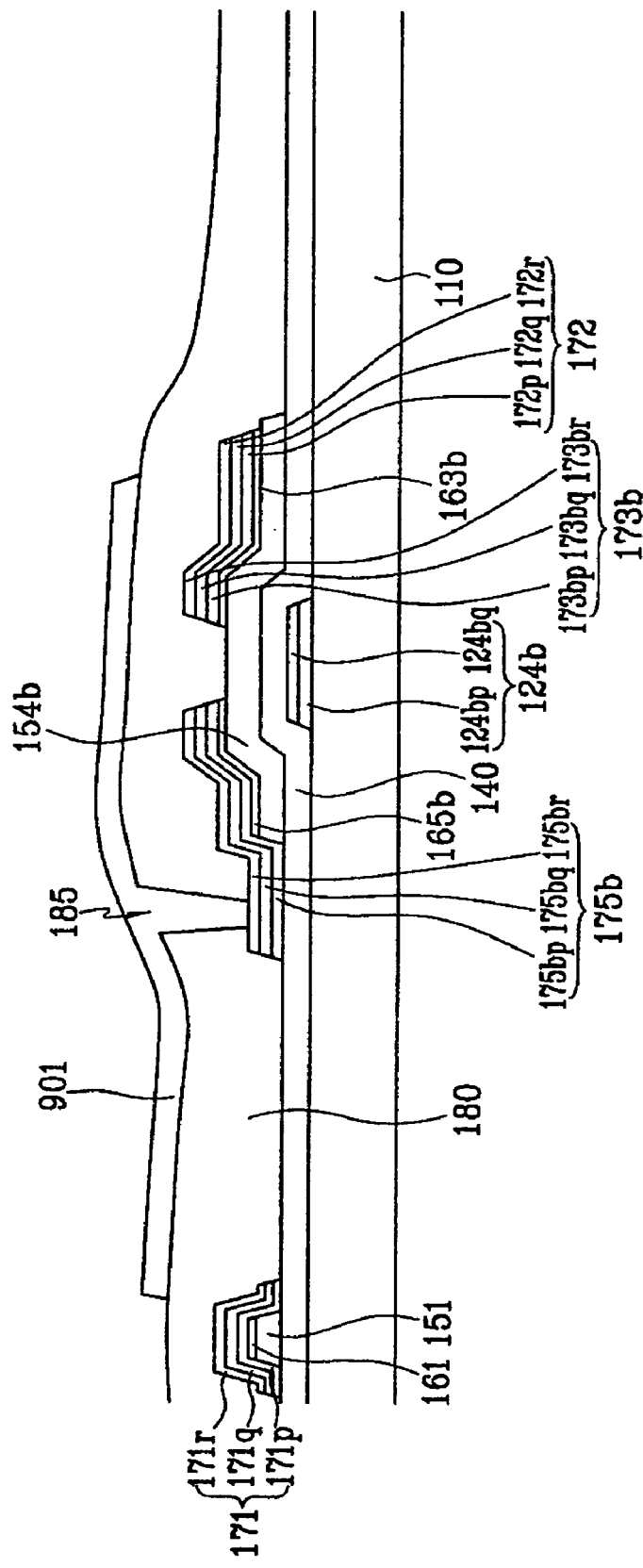
Figure 31C:
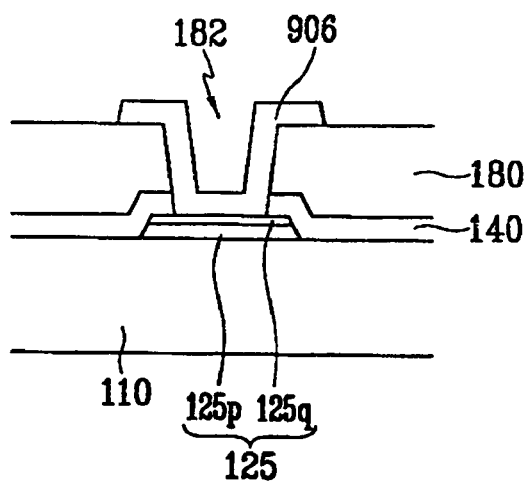
Figure 31D:
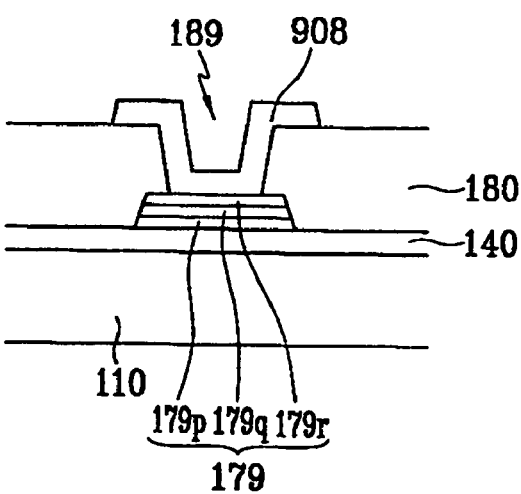
Figure 32:
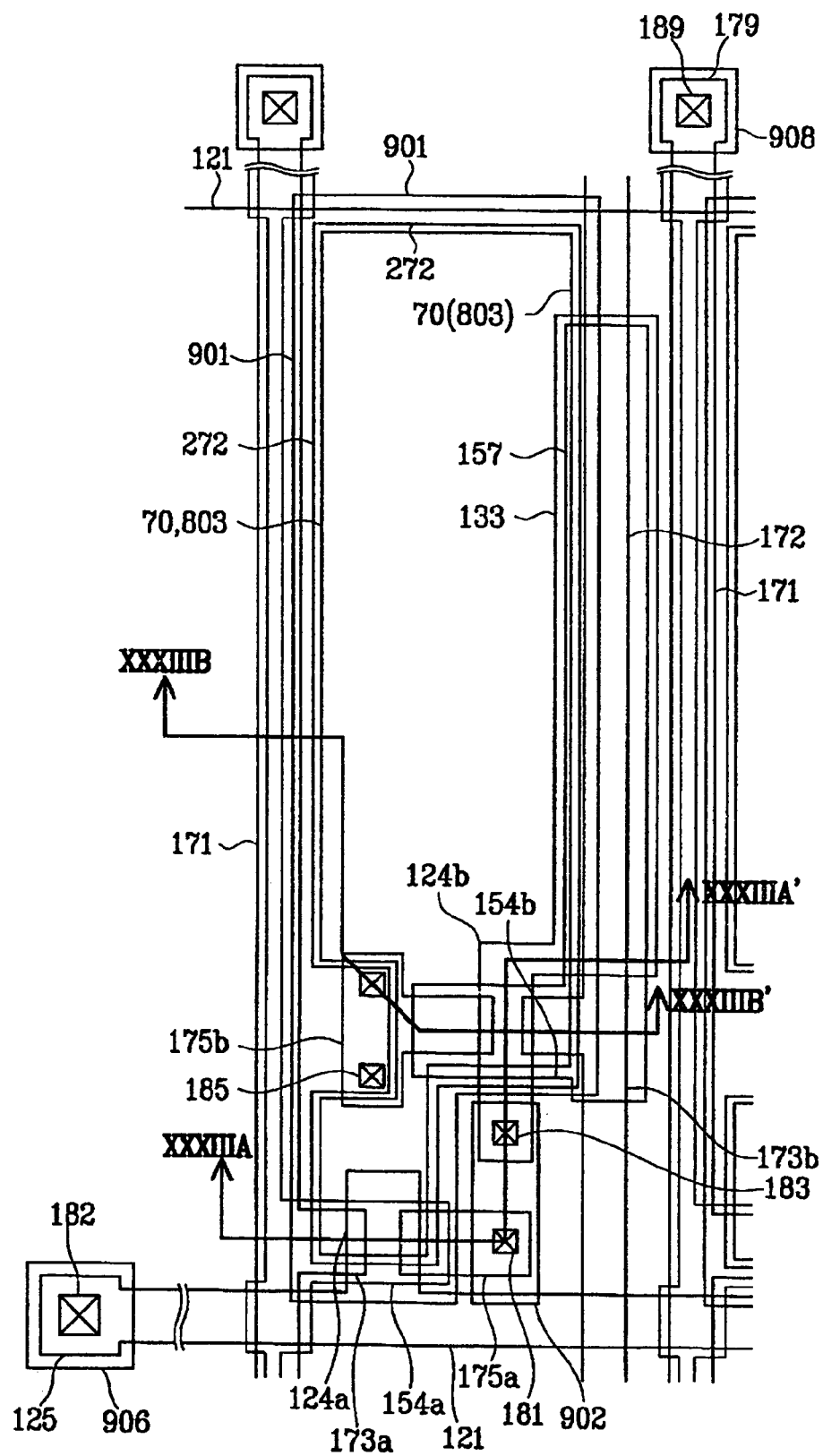

Referring to FIGS. 28-29D, a passivation layer 180 is deposited and patterned to form a plurality of contact holes 189, 185, 183, 181, and 182 exposing the first and second drain electrodes 175a and 175b, the second gate electrodes 124b, and an end portion 179 of the data line 171.

Referring to FIGS. 31A-32D, a plurality of pixel electrodes 901, a plurality of connecting members 902, and contact assistants 906 and 908 are formed on the passivation layer 180 with ITO or IZO.

Referring to FIGS. 32-36, a partition 803 and an auxiliary electrode 272 are formed by using a single photolithography step.

Finally, a plurality of organic light emitting members 70, preferably including multiple layers, are formed in the openings by deposition or inkjet printing following a masking, and a common electrode 270 is subsequently formed as shown in FIGS. 22-24.

The present embodiment illustrates gate lines 121 and data lines 171 both having a Mo containing layer and an Al containing layer. However, it is possible that only one of the gate lines 121 and data lines 171 have multi-layers.

TFT array panels according to embodiments of the present invention have signal lines including a lower layer of an Al containing metal and an upper layer of a molybdenum alloy (Mo-alloy), which is composed of molybdenum (Mo) and at least one of niobium (Nb), vanadium (V), and titanium (Ti). Accordingly, undercut, overhang, and mouse bite, which may arise in an etching process, are prevented and TFT array panels that have signal lines having low resistivity and good contact characteristics are provided.

Although preferred embodiments of the present invention have been described in detail hereinabove, it should be clearly understood that many variations and/or modifications of the basic inventive concepts herein taught, which may appear to those skilled in the present art, will still fall within the spirit and scope of the present invention, as defined in the appended claims.

What is claimed is:

1. A thin film transistor array panel, comprising:
   an insulating substrate;
   a gate line formed on the insulating substrate and having a first layer of an aluminum (Al) containing metal and a second layer of a Mo-alloy comprising molybdenum (Mo) and at least one of niobium (Nb), vanadium (V), and titanium (Ti), the gate line having a gate electrode;
   a gate insulating layer formed on the gate line;
   a semiconductor formed on the gate insulating layer;
   a data line formed on the gate insulating layer and the semiconductor, the data line having a source electrode;
   a drain electrode formed on the gate insulating layer and the semiconductor, the drain electrode facing the source electrode with a predetermined gap;
   a passivation layer formed on the data line and the drain electrode, the passivation layer having a contact hole; and,
   a pixel electrode formed on the passivation layer and connected to the drain electrode through the contact hole,
   wherein the data line and the drain electrode have a third layer of a Mo containing metal, a fourth layer of an Al containing metal, and a fifth layer of a Mo containing metal, and at least one of the third and fifth layers comprising a Mo-alloy including molybdenum (Mo) and at least one of niobium (Nb), vanadium (V), and titanium (Ti).

2. The thin film transistor array panel of claim 1, wherein the first layer includes Al—Nd.

3. The thin film transistor array panel of claim 1, wherein We Mo-alloy includes 0.1 to 10 at % of additives Nb, V, and Ti.

4. The thin film transistor array panel of claim 3, wherein the Mo-alloy includes 3 to 8 at % of the additives Nb, V, and Ti.

5. A thin film transistor array panel, comprising:
   an insulating substrate;
   a gate line formed on the gate insulating substrate and having a gate electrode;
   a gate insulating layer formed on the gate line;
   a semiconductor formed on the gate insulating layer;
   a data line formed on the gate insulating layer and the semiconductor, the data line having a source electrode;
   a drain electrode formed on the gate insulating layer and the semiconductor, the drain electrode facing the source electrode with a predetermined gap;
   a passivation layer formed on the data line and the drain electrode, the passivation layer having a contact hole; and,
   a pixel electrode formed on the passivation layer and connected to the drain electrode trough the contact hole,
   wherein the data line and the drain electrode have a first layer of a Mo containing metal, a second layer of an Al containing metal, and a third layer of a Mo containing metal, and at least one of the first and third layers comprising a Mo-alloy Including molybdenum (Mo) and at least one of niobium (Nb), vanadium (V), and titanium (Ti).

6. The thin film transistor array panel of claim 5, wherein the gate line includes an Al containing metal.

7. The thin film transistor array panel of claim 6, wherein the gate line includes Al—Nd.

8. The thin film transistor array panel of claim 5, wherein the Mo-alloy includes 0.1 to 10 at % of additives Nb, V, and Ti.

9. The thin film transistor array panel of claim 8, wherein the Mo-alloy includes 3 to 8 at % of the additives Nb, V, and Ti.

10. The thin film transistor array panel of claim 6, wherein the pixel electrode includes one of indium tin oxide (ITO) and indium zinc oxide (IZO).

11. The thin film transistor array panel of claim 5, further comprising a color filter formed under the pixel electrode.

12. The thin film transistor array panel of claim 1, wherein the fourth layer includes Al—Nd.

* * * * *